(12) United States Patent
Erbil et al.

(10) Patent No.: US 9,166,139 B2
(45) Date of Patent: Oct. 20, 2015

(54) METHOD FOR THERMALLY CYCLING AN OBJECT INCLUDING A POLARIZABLE MATERIAL

(75) Inventors: Ahmet Erbil, Atlanta, GA (US); David F. Walbert, Atlanta, GA (US)

(73) Assignee: THE NEOTHERMAL ENERGY COMPANY, Atlanta, GA (US)

( * ) Notice: Subject to any disclaimer, the term of this patent is extended or adjusted under 35 U.S.C. 154(b) by 276 days.

(21) Appl. No.: 13/288,791

(22) Filed: Nov. 3, 2011

(65) Prior Publication Data

US 2012/0048508 A1    Mar. 1, 2012

Related U.S. Application Data

(63) Continuation-in-part of application No. 13/226,799, filed on Sep. 7, 2011, now Pat. No. 8,344,585, which is a continuation-in-part of application No. 12/465,924, filed on May 14, 2009, now Pat. No. 8,035,274, (Continued)

(51) Int. Cl.
*F28D 17/00* (2006.01)
*H01L 37/02* (2006.01)

(Continued)

(52) U.S. Cl.
CPC ...... *H01L 37/02* (2013.01); *F27D 7/02* (2013.01); *F27D 7/04* (2013.01); *F27D 7/06* (2013.01); *F27D 2007/023* (2013.01); *F27D 2007/026* (2013.01)

(58) Field of Classification Search
CPC .............. H01L 37/02; F27D 7/00; F27D 7/02; F27D 7/04; F27D 7/06; F27D 2007/023; F27D 2007/026

USPC ........... 432/18, 19, 23, 24, 26, 27, 36, 38, 42, 432/43, 44, 47, 48, 4, 12, 25, 199; 34/519; 134/105; 15/3.12; 239/113; 165/10
See application file for complete search history.

(56) References Cited

U.S. PATENT DOCUMENTS 3,073,974 A   1/1963   Richard Hoh Siegfried
3,243,687 A   3/1966   Richard Hoh Siegfried
(Continued)

FOREIGN PATENT DOCUMENTS

CN    1211353 A    3/1999
CN    101710781 A   5/2010
(Continued)

OTHER PUBLICATIONS

Olsen, R., Cascaded Pyroelectric Energy Converter, Ferroelectrics, 1984, vol. 59, pp. 205-219, Gordon and Breach, Science Publishers, Inc. US.

(Continued)

*Primary Examiner* — Ljiljana Ciric
(74) *Attorney, Agent, or Firm* — Tim Tingkang Xia; Locke Lord LLP

(57) ABSTRACT

A method of thermally cycling an object includes alternately contacting the object with vapor from each of a first liquid-vapor two-phase system and of a second liquid-vapor two-phase system of a working fluid, each of the systems two-phase including a liquid phase and a separate vapor phase. The first system two-phase is at a higher temperature and pressure than the second system two-phase. The object can include one or more layers of an electrically or magnetically polarizable material. The object can be housed in a chamber thermal and alternately contacted with vapor from the first liquid-vapor two-phase system and the second liquid-vapor two-phase system contained in a first reservoir and in a second reservoir, respectively.

19 Claims, 33 Drawing Sheets

Related U.S. Application Data application No. 13/288,791, which is a continuation-in-part of application No. 13/228,051, filed on Sep. 8, 2011, now Pat. No. 8,350,444, which is a continuation-in-part of application No. 12/465,924, filed on May 14, 2009, now Pat. No. 8,035,274.

(60) Provisional application No. 61/411,284, filed on Nov. 8, 2010, provisional application No. 61/387,752, filed on Sep. 29, 2010, provisional application No. 61/387,760, filed on Sep. 29, 2010.

(51) Int. Cl.
*F27D 7/02* (2006.01)
*F27D 7/04* (2006.01)
*F27D 7/06* (2006.01)

(56) References Cited

U.S. PATENT DOCUMENTS

| | | | | |
|---|---|---|---|---|
| 3,539,165 A * | 11/1970 | Ingels | | 432/47 |
| 3,554,515 A | 1/1971 | Tonooka et al. | | |
| 3,556,202 A * | 1/1971 | Stockford et al. | | 165/66 |
| 3,601,378 A * | 8/1971 | Hurst | | 432/18 |
| 3,632,480 A * | 1/1972 | Surprenant et al. | | 134/105 |
| 3,642,012 A * | 2/1972 | Kereluk | | 134/83 |
| 3,693,953 A * | 9/1972 | Michel | | 432/11 |
| 3,722,401 A * | 3/1973 | Davidson et al. | | 134/105 |
| 3,744,960 A * | 7/1973 | Ingels | | 432/23 |
| 3,773,260 A * | 11/1973 | Kunioka et al. | | 239/10 |
| 3,824,448 A | 7/1974 | De Rivas | | |
| 3,854,918 A * | 12/1974 | McKinstry | | 432/135 |
| 3,939,297 A * | 2/1976 | Aylard et al. | | 373/142 |
| 4,009,991 A * | 3/1977 | Matsumura et al. | | 432/23 |
| 4,049,877 A * | 9/1977 | Saillant et al. | | 429/11 |
| 4,055,333 A * | 10/1977 | Engelhard | | 134/105 |
| 4,055,962 A * | 11/1977 | Terry | | 62/102 |
| 4,074,660 A | 2/1978 | Tsao | | |
| 4,099,019 A | 7/1978 | Horibe et al. | | |
| 4,113,426 A * | 9/1978 | Rogers | | 432/25 |
| 4,135,702 A * | 1/1979 | Venetta et al. | | 432/11 |
| 4,191,525 A * | 3/1980 | Sallman | | 432/21 |
| 4,210,820 A | 7/1980 | Wittig | | |
| 4,220,906 A | 9/1980 | Drummond | | |
| 4,226,606 A | 10/1980 | Yaeger et al. | | |
| 4,245,693 A | 1/1981 | Cheng | | |
| 4,296,800 A | 10/1981 | Johnson | | |
| 4,314,826 A * | 2/1982 | Vollhardt | | 134/105 |
| 4,320,796 A * | 3/1982 | Smith | | 165/104.15 |
| 4,321,031 A * | 3/1982 | Woodgate | | 432/11 |
| 4,322,252 A * | 3/1982 | Plumb | | 134/12 |
| 4,327,670 A | 5/1982 | Teller | | |
| 4,372,937 A | 2/1983 | Johnson | | |
| 4,424,633 A * | 1/1984 | Bernhardt et al. | | 134/105 |
| 4,425,540 A | 1/1984 | Olsen | | |
| 4,506,453 A * | 3/1985 | Shirley et al. | | 34/393 |
| 4,529,032 A * | 7/1985 | Molitor | | 134/10 |
| 4,531,572 A * | 7/1985 | Molitor | | 134/10 |
| 4,532,983 A * | 8/1985 | Bradshaw et al. | | 134/104.2 |
| 4,589,890 A | 5/1986 | Gronvaldt | | |
| 4,647,836 A | 3/1987 | Olsen | | |
| 4,651,814 A | 3/1987 | Ito et al. | | |
| 4,676,069 A * | 6/1987 | Miyake | | 62/48.1 |
| 4,693,777 A * | 9/1987 | Hazano et al. | | 134/902 |
| 4,740,158 A * | 4/1988 | Johnson | | 432/59 |
| 4,744,951 A * | 5/1988 | Cummings et al. | | 422/28 |
| 4,766,952 A | 8/1988 | Onodera | | |
| 4,789,333 A * | 12/1988 | Hemsath | | 432/176 |
| 4,797,255 A * | 1/1989 | Hatanaka et al. | | 422/28 |
| 4,838,476 A * | 6/1989 | Rahn | | 432/13 |
| 4,920,998 A * | 5/1990 | Deitrick et al. | | 432/23 |
| 4,963,091 A * | 10/1990 | Hoetzl et al. | | 432/176 |
| 4,983,839 A | 1/1991 | Deb | | |
| 5,048,548 A * | 9/1991 | Ramsey, Jr. | | 134/108 |
| 5,074,782 A * | 12/1991 | Hoetzl et al. | | 432/176 |
| 5,118,357 A * | 6/1992 | Sabatka | | 134/15 |
| 5,156,325 A * | 10/1992 | Mishina et al. | | 228/219 |
| 5,171,592 A * | 12/1992 | Holtzapple et al. | | 426/69 |
| 5,188,282 A * | 2/1993 | Johnson et al. | | 228/234.2 |
| 5,273,588 A * | 12/1993 | Foster et al. | | 118/723 E |
| 5,288,333 A * | 2/1994 | Tanaka et al. | | 134/31 |
| 5,333,774 A * | 8/1994 | Mishina et al. | | 228/46 |
| 5,422,130 A * | 6/1995 | Fox et al. | | 426/234 |
| 5,443,540 A * | 8/1995 | Kamikawa | | 134/105 |
| 5,446,942 A * | 9/1995 | Whitehorn | | 134/30 |
| 5,475,610 A * | 12/1995 | Atwood et al. | | 422/943 |
| 5,485,858 A * | 1/1996 | Schmidt | | 134/107 |
| 5,492,138 A * | 2/1996 | Taricco | | 134/105 |
| 5,550,858 A * | 8/1996 | Hoetzl et al. | | 432/148 |
| 5,555,838 A | 9/1996 | Bergman | | |
| 5,602,756 A * | 2/1997 | Atwood et al. | | 700/269 |
| 5,625,242 A | 4/1997 | Shiga et al. | | |
| 5,625,245 A | 4/1997 | Bass | | |
| 5,638,834 A * | 6/1997 | White et al. | | 131/291 |
| 5,642,742 A * | 7/1997 | Noren et al. | | 134/57 D |
| 5,729,988 A * | 3/1998 | Tchernev | | 62/106 |
| 5,788,484 A * | 8/1998 | Melgaard et al. | | 432/4 |
| 5,810,035 A * | 9/1998 | Tekriwal et al. | | 134/105 |
| 5,851,498 A | 12/1998 | Rozenshtein et al. | | |
| 6,027,607 A * | 2/2000 | Corniel | | 159/3 |
| 6,066,294 A * | 5/2000 | Lin et al. | | 134/170 |
| 6,224,828 B1 * | 5/2001 | Lin et al. | | 422/33 |
| 6,379,809 B1 | 4/2002 | Simpson et al. | | |
| 6,423,266 B1 * | 7/2002 | Choperena et al. | | 422/33 |
| 6,431,856 B1 | 8/2002 | Maenishi et al. | | |
| 6,484,926 B2 * | 11/2002 | Bell | | 228/234.2 |
| 6,528,898 B1 | 3/2003 | Ikura et al. | | |
| 6,558,620 B1 * | 5/2003 | Sanford et al. | | 422/28 |
| 6,582,481 B1 * | 6/2003 | Erbil | | 29/623.5 |
| 6,582,654 B1 * | 6/2003 | Kral et al. | | 422/28 |
| 6,585,943 B1 * | 7/2003 | Sanford et al. | | 422/307 |
| 6,596,232 B1 * | 7/2003 | Lin et al. | | 422/28 |
| 6,619,304 B2 * | 9/2003 | Worm | | 134/140 |
| 6,630,113 B1 * | 10/2003 | Surma | | 422/199 |
| 6,644,043 B2 * | 11/2003 | Later | | 62/64 |
| 6,662,867 B1 * | 12/2003 | Macdonald et al. | | 432/11 |
| 6,666,928 B2 * | 12/2003 | Worm | | 134/33 |
| 6,685,762 B1 * | 2/2004 | Brewster et al. | | 75/331 |
| 6,685,895 B1 * | 2/2004 | Lin | | 422/297 |
| 6,706,641 B2 * | 3/2004 | Worm et al. | | 134/198 |
| 6,742,337 B1 | 6/2004 | Hays et al. | | |
| 6,848,458 B1 * | 2/2005 | Shrinivasan et al. | | 134/108 |
| 6,977,061 B2 * | 12/2005 | Lin et al. | | 422/33 |
| 7,043,912 B1 | 5/2006 | Radcliff et al. | | |
| 7,170,036 B2 * | 1/2007 | Richert et al. | | 219/388 |
| 7,225,820 B2 * | 6/2007 | Jones | | 134/200 |
| 7,264,009 B2 * | 9/2007 | Gregory | | 134/167 R |
| 7,285,254 B2 * | 10/2007 | Lin et al. | | 422/300 |
| 7,294,305 B2 * | 11/2007 | Lin et al. | | 422/33 |
| 7,323,506 B2 | 1/2008 | Kouchachvili et al. | | |
| 7,328,578 B1 | 2/2008 | Saucedo | | |
| 7,468,159 B2 * | 12/2008 | Lin et al. | | 422/33 |
| 7,569,194 B2 | 8/2009 | Russell | | |
| 7,593,250 B2 | 9/2009 | Naumov et al. | | |
| 7,732,019 B2 * | 6/2010 | Shimoda et al. | | 239/128 |
| 7,735,321 B2 | 6/2010 | Howard | | |
| 7,768,050 B2 | 8/2010 | Rappe et al. | | |
| 7,982,360 B2 * | 7/2011 | Erbil et al. | | 136/254 |
| 8,035,274 B2 * | 10/2011 | Erbil et al. | | 310/306 |
| 8,215,105 B2 * | 7/2012 | Fong et al. | | 60/408 |
| 8,293,167 B2 * | 10/2012 | Bernard et al. | | 266/252 |
| 8,344,585 B2 * | 1/2013 | Erbil et al. | | 136/254 |
| 8,350,444 B2 * | 1/2013 | Erbil et al. | | 136/254 |
| 8,425,666 B2 * | 4/2013 | Batty et al. | | 95/235 |
| 8,796,131 B2 * | 8/2014 | Jones et al. | | 438/607 |
| 8,828,143 B2 * | 9/2014 | Simons et al. | | 134/1 |
| 2002/0150823 A1 * | 10/2002 | Breitkopf et al. | | 429/245 |
| 2003/0116016 A1 * | 6/2003 | Monzyk et al. | | 95/148 |
| 2003/0131729 A1 * | 7/2003 | Tonkovich et al. | | 95/106 |
| 2003/0162394 A1 | 8/2003 | Takemura | | |
| 2005/0126929 A1 * | 6/2005 | Mansouri et al. | | 205/778 |
| 2005/0237528 A1 * | 10/2005 | Oldham et al. | | 356/414 |
| 2006/0042964 A1 * | 3/2006 | Mansouri et al. | | 73/1.02 |
| 2006/0122299 A1 | 6/2006 | Kouchachvili et al. | | |

(56) References Cited

U.S. PATENT DOCUMENTS

| | | | |
|---|---|---|---|
| 2008/0074211 A1 | 3/2008 | Miles et al. | |
| 2008/0130346 A1 | 6/2008 | Naumov et al. | |
| 2008/0241779 A1* | 10/2008 | Kamiyama et al. | 432/19 |
| 2008/0295879 A1 | 12/2008 | Atanackovic | |
| 2008/0302281 A1* | 12/2008 | Bernard et al. | 110/192 |
| 2008/0315100 A1 | 12/2008 | Han et al. | |
| 2009/0010303 A1 | 1/2009 | Nagashima et al. | |
| 2010/0289377 A1 | 11/2010 | Erbil et al. | |
| 2011/0001390 A1 | 1/2011 | Erbil et al. | |
| 2011/0315181 A1* | 12/2011 | Erbil et al. | 136/201 |
| 2011/0316385 A1* | 12/2011 | Erbil et al. | 310/306 |
| 2012/0019098 A1* | 1/2012 | Erbil et al. | 310/306 |
| 2012/0031449 A1* | 2/2012 | Erbil et al. | 136/201 |
| 2012/0060868 A1* | 3/2012 | Gray | 134/22.18 |
| 2012/0208377 A1* | 8/2012 | Timans | 438/799 |
| 2013/0084474 A1* | 4/2013 | Mills | 429/9 |
| 2013/0122321 A1* | 5/2013 | Karandikar et al. | 428/553 |
| 2013/0149453 A1* | 6/2013 | Romick et al. | 427/385.5 |

FOREIGN PATENT DOCUMENTS

| | | |
|---|---|---|
| EP | 1145333 A | 10/2001 |
| GB | 1506587A A | 4/1978 |
| JP | 55012508A A | 1/1980 |
| JP | 63061125A A | 3/1988 |
| JP | 63233340A A | 9/1988 |
| JP | 200788337 A | 4/2007 |
| KR | 1020070056373 A | 6/2007 |
| TW | 200532150 a | 10/2005 |
| WO | 9313564 A1 | 7/1993 |
| WO | 9965051 A2 | 12/1999 |
| WO | 0036656 A1 | 6/2000 |
| WO | 20001036656 A1 | 6/2000 |
| WO | 2005011376 A2 | 2/2005 |
| WO | 2006058417 A1 | 6/2006 |
| WO | 2007140061 A2 | 12/2007 |
| WO | 2008088994 A2 | 7/2008 |
| WO | 2010061385 A1 | 6/2010 |

OTHER PUBLICATIONS

Vanderpool, D., Simulations of a Prototypical Device Using Pyroelectric Materials for Harvesting Waste Heat, Intl. J. of Heat & Mass Transfer, vol. 51, 2008, pp. 5052-5062, Los Angeles.

Lines, M. E. et al., "Principles and Applications of Ferroelectrics and Related Materials", App. F, 1977, Oxford University Press Inc., New York.

Olsen and Evans, "Pyroelectric Energy Conversion: Hysteresis loss and temperature sensitivity of a ferroelectric aterial", J. Appl. Phys. 54, Oct. 1983.

Kouchachvili and Ikura, "Pyroelectric Conversion- Effects of P(VDF-TrFE) preconditioning on Power Conversion", Journal of Electrostatics 65, 2007, pp. 182-188.

Tiffany, W., Coherent Inc.: The Amazing Versatile Pyroelectric, pp. 1-3., Oct. 16, 2006.

U.S. DOE, A Technology Roadmap for Generation IV Nuclear Systems, 2002.

Study prepared for the U.S. Department of Energy by an MIT-lead interdisciplinary panel, The Future of Geothermal Energy: Impact of Enhanced Geothermal Systems (EGS) of the United States in the 21st Century, 2006.

V. Viswanathan, Opportunity Analysis for Recovering Energy From Industrial Waste Heat and Emissions, Pacific NW Nat'l Lab., 2005.

Prepared for the U.S. DOE, Energy Use, Loss and Opportunities Analysis: U.S. Manufacturing and Mining, 2004.

A. Burke, Energy Storage in Advanced Vehicle Systems, Institute of Transportation Studies, Univ. of California, Davis, (presented at Stanford University, 2005).

J. Yang, Thermolectric Technology for Automotive Waste Heat Recovery, General Motors R&D, presented at the 2007 DEER Conference, sponsored by U.S. DOE.

Duffie et al., Solar Engineering of Thermal Processes, John Wiley & Sons, Inc., 3rd Ed., 2006.

Babcock et al., Steam: Its Generation and Use, Chs. 47-56, 40th Ed. 1992.

Frank Incropera et al, Fundamentals of heat and Mass Transfer, John Wiley & Sons, Inc., 6th Ed., 2006.

Michael Moran et al., Introduction of Thermal Systems Engineering: Thermodynamics, Fluid Mechanics, and Heat Transfer, John Wiley & Sons, Inc., 2003.

Deborah Kaminiski et al, Introduction of Thermal and Fluids Engineering, John Wiley & Sons, Inc., 2005.

M. Wakil, Nuclear Energy Conversion, American Nuclear Society, 1992.

Robert Serth, Process Heat Transfer: Principles and Applications, Elsevier, 2007.

Hayes et al., Introduction to Catalytic Combustion, Gordon and Breach Science Publishers, 1997.

G.P. Peterson, An Introduction to Heat Pipes: Modeling, Testing and Applications, 1994.

* cited by examiner

METHOD FOR THERMALLY CYCLING AN OBJECT INCLUDING A POLARIZABLE MATERIAL

CROSS-REFERENCE TO RELATED APPLICATIONS

This application claims the benefit of Provisional U.S. Patent Application Ser. No. 61/411,284, filed Nov. 8, 2010.

This application is also a continuation-in-part of U.S. patent application Ser. No. 13/226,799, filed Sep. 7, 2011, pending, which is a continuation-in-part of U.S. patent application Ser. No. 12/465,924, filed May 14, 2009, now U.S. Pat. No. 8,035,274, which claims the benefit of provisional U.S. Patent Application Ser. No. 61/387,752, filed Sep. 29, 2010.

This application is also a continuation-in-part of U.S. patent application Ser. No. 13/228,051, filed Sep. 8, 2011, pending, which is a continuation-in-part of U.S. patent application Ser. No. 12/465,924, filed May 14, 2009, now U.S. Pat. No. 8,035,274, which claims the benefit of provisional U.S. Patent Application Ser. No. 61/387,760, filed Sep. 29, 2010. Each of the above applications is incorporated by reference herein in its entirety.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention generally relates to the thermal cycling of materials, devices, and other systems using two-phase heat transfer, and more particularly to methods and apparatus that allow the rapid addition and removal of heat to materials, devices, and other systems. Rapid thermal cycling is achieved using two-phase heat transfer with a working fluid that alternates between gas and liquid phases as a result of controlled changes in temperature and pressure, causing rapid removal and addition of heat as the system cycles around a desired temperature. Such rapid thermal cycling can be used with many and varied technologies, for example, to generate electricity from heat, to cool or heat with electric power, and for many other applications and purposes.

BACKGROUND OF THE INVENTION

Heat exchangers have long been used for many purposes. In more recent years, two-phase heat exchangers have been used to achieve high heat transfer rates, exploiting the fact that the latent heat of evaporation is generally much higher than the sensible heat required to increase the temperature of the same mass of fluid over a given temperature differential. That fact allows two-phase heat exchangers to transfer thermal energy more rapidly across the same area for a similar temperature gradient, $\Delta T$, than can be achieved with a one-phase heat transfer system. Two-phase heat transfer technology generally is well known to those skilled in the art and is well described in the literature. The transfer of heat by heat exchangers is also well known, and many well-recognized texts address the design and engineering of heat transfer and heat exchanger mechanisms.

There is a well recognized need for new technologies that permit rapid thermal cycling of materials, devices, and other systems. The present invention discloses a novel way of using two-phase heat transfer to rapidly input heat to, and remove heat from, systems in general so that rapid thermal cycling of the system occurs over a desired temperature range. Thermal cycling is achieved by varying the pressure of a working fluid in a chamber so that some portion of the fluid rapidly cycles back and forth between liquid and gas phases. As condensation and evaporation alternately occur during those phase changes, large amounts of latent heat are expelled and absorbed by the fluid, respectively. That large amount of latent heat expelled and absorbed by the fluid, in turn, is used to input and remove heat from the desired system, respectively. Rapid thermal cycling of the system is achieved thereby.

Thermal cycling with the invention can be used in a wide range of applications. One such application is for the generation of electricity from thermal energy using ferroelectrics or other electrically polarizable materials. Apparatus and methods for using the inherent spontaneous polarization of ferroelectrics and polarizable amorphous polymers, and the rapid change in such polarization that occurs with temperature cycling, are disclosed, for example, in the U.S. patents and patent applications referenced above. More rapid thermal cycling with the present two-phase invention allows for more effective use of those materials and devices. In the case of power generation, for example, the specific power of the material may increase in proportion to the square of the cycling speed under some circumstances. There are other applications where rapid thermal cycling is desirable, and the invention can generally be used with such applications to achieve more effective cycling and more robust thermal transfer. It is also expected that additional applications will be developed in the future that require or benefit from rapid thermal cycling, and the invention will be useful with those applications as well.

SUMMARY OF THE INVENTION

In accordance with the purposes of this invention, as embodied and broadly described herein, this invention, in one aspect, relates to an apparatus and method for using two-phase heat transfer in order to provide a rapid addition and removal of heat to materials, devices, or other systems. That addition and removal of heat can be used to rapidly cycle the temperature of the designated system over a specified temperature range for any desired purpose, including the generation of electricity from heat. The invention can also be used, as embodied and broadly described herein, in one aspect for refrigeration or as a heat pump. In those latter modalities, the material, device, or other system is thermally cycled through the input of electrical or magnetic work around a specified temperature such that, during the course of the cycle, heat is moved from a colder reservoir to a hotter reservoir.

In one embodiment, the invention utilizes separate reservoirs, each of which contains a working fluid. In each reservoir, the fluid is maintained in a two-phase vapor-liquid mixture. In each reservoir, the mixture is maintained in approximate equilibrium between the vapor and liquid phases. In the hot reservoir, the mixture is maintained at a higher pressure and temperature, $P_H$ and $T_H$, respectively. In the cold reservoir, the fluid is maintained at a lower pressure and temperature, $P_L$ and $T_L$, respectively. Generally, the equilibrium (or saturation) vapor pressure of a liquid increases as a function of temperature.

The invention is not limited to any particular working fluid. Rather, it can be used with any working fluid appropriate to the particular use in light of the desired cycling temperature range, desirable pressures, the latent heat of evaporation, and other such factors. Generally, it is desirable to utilize a fluid with high values for the latent heat of evaporation, including heat transfer fluids. It may also be desirable in some applications to use a fluid wherein the equilibrium vapor pressure at the desired temperature is greater than the external or ambient atmosphere, to minimize the possibility of air or another ambient fluid entering the system through leakage. In other applications, working pressures can be smaller than the ambient atmospheric pressure where a leak tight system is maintained.

In one embodiment, the system that is to be thermally cycled is contained in a thermal chamber that is constructed to allow for the passage of vapor. The chamber is connected through valves to the hot and cold reservoirs such that, when the valve to the hot reservoir is open and the valve to the cold reservoir is closed, the chamber will contain vapor at $P_H$ and $T_H$. When the valves are reversed so that the valve to the cold reservoir is open and the valve to the hot reservoir is closed, the vapor in the chamber containing the module rapidly changes to $P_L$ and $T_L$. When the vapor in the chamber is changed to $P_H$ by the appropriate positioning of the valves, heat is rapidly input into the module on account of condensation occurring at or on the surface of the module. Conversely, when the vapor pressure in the thermal chamber is lowered to $P_L$, heat is rapidly removed from the module as a result of evaporation of the working fluid from the surface of the module. When the desired quantity of heat has been input into or removed from the module, the positions of the valves can be reversed and the cycle repeated.

Because rapid heat transfer occurs during condensation and evaporation of fluid on the surface of the module that is being thermally cycled, it is desirable that a fluid layer be maintained thereon. In various embodiments, that can be achieved, for example, if the surface of the module consists of a hydrophilic surfactant, a porous membrane, or another surface configuration or material that causes a fluid layer to remain during thermal cycling.

In various embodiments, heat is used for thermally cycling a ferroelectric or other polarizable material to convert thermal energy to electricity. As with any conversion of thermal energy to another form of energy or work, heat must also be rejected in compliance with the Second Law of Thermodynamics. A heat sink is used for that purpose, wherein one or more of the working fluids that cool the polarizable material are cooled, either by direct thermal communication with the heat sink or by a heat exchanger that is in thermal communication with the heat sink. In such embodiments, the ferroelectric generator includes a ferroelectric material in which, when in its ferroelectric phase, electric polarization develops spontaneously in the medium, without induction by application of an external field. By poling those electric dipoles so as to align the polarizable units and domains, the polarization of the cooperatively acting individual electric dipoles combines to produce an extremely large net spontaneous polarization in the overall material system, designated as $P_s$. In one embodiment, the invention utilizes the spontaneous polarization, together with the rapid change in that polarization that occurs during thermal cycling, to convert heat to electrical energy. Using the two-phase heat transfer apparatus and method of the present invention, the temperature of the ferroelectric material is controlled so that it undergoes transition into the ferroelectric phase. During that transition, a relatively small electric field poles the ferroelectric. That poling field aligns the spontaneous electric dipoles to the extent allowed by the molecular and crystal structure of the particular material.

In the apparatus and method set forth in U.S. Pat. Nos. 7,982,360 and 8,035,274, for example, the poling field is created from an external DC voltage source. In the apparatus and method set forth in U.S. patent application Ser. No. 13/228,051, for example, the poling field is generated from residual free charges on the electrodes on the surfaces of the ferroelectric material. Both such apparatuses and methods may be utilized with the present invention.

The spontaneous polarization resulting form the aligned dipoles gives rise to very dense bound charges on the surfaces of the ferroelectric, which in turn induce opposing screening charges on electrodes that are on the surfaces of the ferroelectric material. By removing or adding heat through evaporation or condensation, respectively, using the two-phase heat transfer apparatus and method of the present invention, the temperature of the ferroelectric is then changed so that it becomes either paraelectric or antiferroelectric, rendering the bound surface charges negligible. The screening charges on the electrodes then become unscreened and can be removed to external circuitry at high voltage.

As disclosed in the above-referenced U.S. patents and patent applications, the temperature of a ferroelectric material can be cycled around the phase transition temperature so that thermal energy can be effectively converted to electrical energy with the invention operating between a heat source and heat sink. Various thermodynamic cycles can be used to exploit spontaneous polarization in ferroelectrics for the purpose of converting heat to electricity, including the general cycle set forth in U.S. Pat. Nos. 7,982,360 and 8,035,274. Heat is input and withdrawn in the course of such thermodynamic cycles during the condensation and evaporation, respectively, of the working fluid that occurs with the system of two-phase heat transfer utilized by the present invention.

Among the thermodynamic cycles that can be used with the invention is a cycle with two isothermal steps and two steps at constant polarization, as disclosed in U.S. patent application Ser. No. 13/226,799. During a first step of that cycle, the ferroelectric is cooled by evaporation of fluid on or at its surface to a low temperature, $T_L$, while total polarization is held constant at the relatively low value, $P_L$, and the electrical circuit is open. During the next step, heat is withdrawn isothermally, by evaporation, until polarization is increased to the maximum value for the cycle, $P_H$, at which point a very dense bound charge is present on the surface of the electrode. During that step, the electrical circuit is closed so that a current flows from the electrode on one side of the ferroelectric to the electrode on the opposite side of the ferroelectric. Screening charges that develop on the electrodes equal the opposing bound charges at the surfaces of the ferroelectric. It is during that step that the poling field causes the resulting dipoles to be biased in one orientation—i.e., they become poled.

In the next step of the cycle, the circuit is opened while the ferroelectric is heated to a relatively high temperature, $T_H$, by condensation of fluid on or at the surface of the material while total polarization remains constant. During the final step of the cycle, the circuit is again closed and heat is input isothermally through condensation of fluid on the surface until polarization is reduced to $P_L$. During that step, the screening charges on the electrode become unscreened and are discharged into external circuitry at a self-generated high voltage. In one embodiment as disclosed in U.S. patent application Ser. No. 13/228,051, the circuit is opened during that step at a point where a great enough residual charge remains to establish a field sufficient for poling.

The cycle is then repeated continuously so that thermal energy is continuously converted to electrical energy at high voltage. The invention can be used in some embodiments with ferroelectrics that are in either solid or liquid form, the latter including liquid ferroelectrics and ferroelectric fine crystals suspended in liquid. For example, the solid materials that can be used include ceramic ferroelectrics, ferroelectric polymers, and other polarizable polymers. In addition to the ordinary ferroelectrics, extrinsic (or improper) ferroelectrics, such as boracites and sodalites, can be used with the invention.

A single stage ferroelectric power conversion module includes a single ferroelectric material that generally has a single phase transition temperature. It may be desirable, however, to use a series of ferroelectric materials that have a succession of phase transition temperatures that incrementally cover all, or at least some, of the range of temperatures between the heat source and heat sink. The use of heat regeneration techniques may also affect the number of stages that may be desired.

In one aspect, the present invention relates to an apparatus for converting heat to electricity. In one embodiment, the apparatus has a ferroelectric layer having a first surface and an opposite, second surface, where the ferroelectric layer is comprised of a ferroelectric material with a phase transition temperature such that, when the material is in a ferroelectric phase spontaneous polarization is established in, and the ferroelectric layer, when poled, develops an overall net spontaneous polarization; and such that, as the temperature of the ferroelectric changes so that it traverses the transition temperature, the material enters a paraelectric or antiferroelectric phase wherein the ferroelectric layer has negligible or no overall net polarization. The apparatus also has a pair of electrodes respectively positioned on the first surface and the second surface of the ferroelectric layer, wherein the electrodes consist of a thermally and electrically conductive material, and means positioned in relation to the pair of electrodes for alternately inputting and removing heat to and from the ferroelectric layer by condensation and evaporation of fluid so as to, respectively, heat the ferroelectric layer at a temperature $T_H$ that is higher than the phase transition temperature, and alternately cool the ferroelectric layer at a temperature $T_L$ that is lower than the phase transition temperature. The ferroelectric material thereby undergoes alternating phase transitions between (1) the ferroelectric phase and (2) the paraelectric or antiferroelectric phase. In another aspect, the present invention relates to an apparatus for converting heat to electric energy. In one embodiment, the apparatus includes a ferroelectric layer having a first surface and an opposite, second surface. The ferroelectric layer consists of a ferroelectric material characterized with a Curie temperature, $T_c$, such that when the temperature of the ferroelectric material is lower than the Curie temperature $T_c$, the ferroelectric material is in a ferroelectric phase in which spontaneous polarization is established, and when the temperature of the ferroelectric material is greater than the Curie temperature $T_c$, spontaneous polarization is not established in the ferroelectric material. The apparatus also includes a pair of electrodes positioned respectively on the first surface and the second surface of the ferroelectric layer. The pair of electrodes is comprised of a thermally and electrically conductive material.

Furthermore, the apparatus includes means positioned in relation to the pair of electrodes for alternately delivering a cold fluid and a hot fluid so as to alternately (1) cool the ferroelectric layer at a first temperature $T_L$ that is lower than the Curie temperature $T_c$, and (2) heat the ferroelectric layer at a second temperature $T_H$ that is higher than the Curie temperature $T_c$. The ferroelectric material of the ferroelectric layer thereby undergoes alternating phase transitions between the ferroelectric phase and the paraelectric phase with temperature cycling. Heating and cooling occur during condensation and evaporation, respectively, pursuant to the two-phase heat transfer mechanism and method of the invention.

Additionally, the apparatus may have a pair of electric leads electrically connected to the pair of electrodes such that when the ferroelectric material is cycled to diminish the total polarization of the ferroelectric layer, the electric energy corresponding to the electrically-opposite screening charges is output to the pair of electric leads at high voltage. The electric leads may also be connected through a switch to permit application of a DC voltage between the pair of electric leads so as to apply a poling field when the ferroelectric material is in, or transitioning into, its ferroelectric phase. Moreover, the apparatus may include means for monitoring one or more of the temperature and capacitance of the ferroelectric layer, the temperature and pressure of the heating and cooling fluids, and other system data.

In another embodiment, the delivering means comprises fluid passages such that a hot fluid passes through at least one of the fluid passages at high temperature and high pressure, $T_H$ and $P_H$, to a chamber containing the ferroelectric module, thereby causing rapid condensation of fluid on or at the surface of the ferroelectric module, which in turn causes heat to be rapidly input into the ferroelectric module; such that when the high pressure, high temperature fluid exits the chamber through one or more of the passages, the pressure of the vapor in the chamber decreases rapidly to $P_L$, thereby causing rapid evaporation of fluid from the surface of the ferroelectric module, which in turn removes heat rapidly from the ferroelectric module; one or more heat exchangers positioned such that, by alternately cycling fluid through the first and second fluid passages to cause one or more of the external surfaces of the ferroelectric layer to alternately be in contact with a cold, evaporating fluid and a hot, condensing fluid, thereby alternately removing heat from the ferroelectric layer at a first temperature $T_L$, and adding heat to the ferroelectric layer at a second temperature $T_H$, through alternate evaporation and condensation of the fluid; and a plurality of control valves in communication with the one or more heat exchangers for controlling the flow of cold and hot fluids. The plurality of control valves is controlled by microcontrollers, and they are coordinated by computer control with the electrical circuitry of the device through a control circuit to achieve the desired cycle.

In yet another aspect, the present invention relates to a method for converting heat to electricity. In one embodiment, the method includes the steps of providing a ferroelectric layer having a first surface and an opposite, second surface, wherein the ferroelectric layer is comprised of a ferroelectric material with a phase transition temperature such that, when the material is in a ferroelectric phase spontaneous polarization is established in the ferroelectric, and the ferroelectric layer, upon poling, develops an overall net spontaneous polarization; and such that, as the temperature of the ferroelectric changes so that it traverses the transition temperature, the material enters a paraelectric or antiferroelectric phase wherein the ferroelectric layer has negligible or no overall net spontaneous polarization; and including a pair of electrodes positioned respectively on the first surface and the second surface of the ferroelectric layer, the electrodes being comprised of a thermally and electrically conductive material.

The method also includes the steps of alternately delivering a cold fluid and a hot fluid so as to alternately cool the ferroelectric layer through evaporation to a temperature that is lower than the Curie temperature, $T_c$, and heat the ferroelectric layer through condensation to a second temperature that is higher than the Curie temperature $T_c$. During these steps, the electrical circuit is opened and cooling and heating occur under constant polarization.

The method also includes in one embodiment the steps of adding and removing heat to and from the ferroelectric layer, isothermally, by alternately providing a hot fluid and a cold fluid to the ferroelectric layer and alternately condensing and evaporating, respectively, fluid at the surface of the ferroelectric layer, while total polarization changes to corresponding low and high levels denoted as $P_L$ and $P_H$ respectively. During these steps, the electrical circuit is closed to allow changing polarization, and the heat removed or added corresponds to the enthalpy of transition.

The method also includes poling the ferroelectric material of the ferroelectric layer in the ferroelectric phase at temperature $T_L$. In one embodiment, the poling is performed by a field that results from residual free charges on the electrodes that are on the surfaces of the ferroelectric. The method also includes the step of discharging the electrical energy generated in the ferroelectric material of the ferroelectric layer into external circuitry by closing the circuit while heat is being input into the ferroelectric layer which, in one embodiment, is done isothermally and polarization diminishes to a minimum level, $P_L$. In one embodiment, $P_L$ corresponds to the residual charge that is adequate to establish a field sufficient for poling. In another embodiment, poling is accomplished by applying a small poling field from a DC voltage source. In that embodiment, the minimum polarization can become negligible or zero during the step in which the electrical energy generated in the ferroelectric material of the ferroelectric layer is discharged into external circuitry, with the circuit closed, while heat is input into the ferroelectric layer isothermally by condensation of fluid on the surface of the ferroelectric layer.

In one embodiment, the thermal delivering step is performed by one or more two-phase heat exchangers that are in thermal communication with a heat source and a heat sink for inputting heat from the heat source to the ferroelectric layer so as to heat it during condensation of the working fluid, and withdrawing heat from the ferroelectric layer to the heat sink so as to cool it during evaporation of the working fluid. In another embodiment, the thermal delivering step is performed by one or more two-phase heat exchangers and a plurality of control valves in communication with the one or more heat exchangers, wherein are positioned first and second fluid passages for alternately delivering a cold fluid and a hot fluid to the external surface of the ferroelectric layer, so as to alternately remove heat from and add heat to the ferroelectric layer by alternate evaporation and condensation of fluid on the external surface of the ferroelectric layer, and wherein the plurality of control valves is adapted for controlling the flow of cold and hot fluids. In each instance, the electrical circuit is switched between open and closed positions in coordination with the heating and cooling cycling described herein.

In other embodiments, instead of cycling the ferroelectric material through phase transition, it remains in a ferroelectric phase throughout and is cycled from a greater degree of polarization to a lesser degree of polarization.

In addition to materials with a crystal structure, amorphous polymer materials that are electrically polarizable can be used with the invention. For such amorphous polymers, the polarizable units exhibit electric dipolar behavior at the atomic and molecular level. An overall net polarization occurs with such polarizable amorphous polymer and copolymer systems, when poled, and that net polarization diminishes and disappears when the temperature of the material traverses the depolarization transition temperature. The changes in polarization that occur with cycling of such amorphous polymer systems around their depolarization transition temperatures are exploited by the invention in the same general fashion as the invention uses the spontaneous polarization, and changes in polarization, that occur in crystalline ferroelectric materials. For amorphous materials, the depolarization transition temperature is analogous to $T_c$ or to the ferroelectric phase transition. Where reference is made to the use of ferroelectric materials and ferroelectric layers in the invention, it should be understood that polarizable amorphous polymers (and copolymers) with appropriate polarization and transition characteristics can also be used with the invention.

In a further aspect, the present invention relates to an apparatus for converting heat to electricity. In one embodiment, the apparatus has a plurality of ferroelectric modules, $\{FM^n\}$, arranged in a stack, where n=1, 2, 3, ... N, N being an integer greater than one. Each ferroelectric module $FM^n$ includes a ferroelectric layer having a first surface and an opposite, second surface, wherein the ferroelectric layer is formed of a ferroelectric material characterized with a transition temperature, $T^n$, such that when the ferroelectric material is in a ferroelectric phase, spontaneous polarization is established in the unit cells of the ferroelectric, and the ferroelectric layer, upon poling, develops an overall net spontaneous polarization, and such that, as the temperature of the ferroelectric changes so that it traverses the transition temperature, the material enters a paraelectric or antiferroelectric phase wherein the ferroelectric layer has negligible or no overall net spontaneous polarization. In one embodiment, a pair of electrodes consisting of a thermally and electrically conductive material is positioned on the first surface and the second surface of the ferroelectric stack. In another embodiment, such electrodes are also positioned on the first surface and the second surface of each ferroelectric module, $FM^n$; and in yet another embodiment, such electrodes between adjacent ferroelectric modules are separated by an electrical insulator. The transition temperatures $\{T^n\}$ of the plurality of ferroelectric modules $\{FM^n\}$ may vary successively across the range between temperatures of a heat source and a heat sink.

The apparatus further includes means positioned in relation to the stacked ferroelectric modules $\{FM^n\}$ for alternately inputting and removing heat to and from the stacked ferroelectric modules $\{FM^n\}$ by cyclical condensation and evaporation on or at the surface(s) of the modules, so as to alternately cool the stacked ferroelectric modules $\{FM^n\}$ at a first temperature that is lower than each transition temperature $T^n$, and heat the stacked ferroelectric modules $\{FM^n\}$ at a second temperature that is higher than each transition temperature $T^n$, such that each ferroelectric layer of the stacked ferroelectric modules $\{FM^n\}$ thereby undergoes alternating phase transitions between (1) the ferroelectric phase and (2) the paraelectric or antiferroelectric phase.

The apparatus may further include devices to monitor, among other things, one or more of the temperature and capacitance of one or more ferroelectric modules $FM^n$ and the temperature and pressure of the heating and cooling fluids. Thermal cycling is coordinated with the electrical status of the ferroelectric modules $\{FM^n\}$ under computer control so as to synchronize heating and cooling with electrical input and output, pursuant to the general cycle of the invention, including poling and electrical discharge.

In yet a further aspect, the present invention relates to an apparatus for converting heat to electric energy. In one embodiment, the apparatus has a plurality of ferroelectric modules, {FM$^n$}, arranged in a stack, where n=1, 2, 3, ... N, N being an integer greater than one. Each ferroelectric module FM$^n$ includes a ferroelectric layer having a first surface and an opposite, second surface, wherein the ferroelectric layer is formed of a ferroelectric material characterized with a Curie temperature, $T_c^n$, such that when the temperature of the ferroelectric material is lower than the Curie temperature, $T_c^n$, the ferroelectric material is in a ferroelectric phase in which spontaneous polarization is established in the ferroelectric material, and when the temperature of the ferroelectric material is greater than the Curie temperature, $T_c^n$, spontaneous polarization is not normally established in the ferroelectric material; and in one embodiment a first electrode and a second electrode are positioned on the first surface and the second surface of the ferroelectric stack, respectively; and in another embodiment a first electrode and a second electrode are positioned on the first surface and the second surface of each ferroelectric module, FM$^n$. Different ferroelectric layers of the plurality of ferroelectric modules {FM$^n$} are comprised of an identical ferroelectric material or different ferroelectric materials. In one embodiment where a first electrode and a second electrode are positioned on the first surface and the second surface of each ferroelectric module, FM$^n$, each two adjacent ferroelectric modules are separated by an electrical insulator. The Curie temperatures {$T_c^n$} of the plurality of ferroelectric modules {FM$^n$} may vary successively across the range between temperatures of a heat source and a heat sink.

The apparatus further includes means positioned in relation to the stacked ferroelectric modules {FM$^n$} for alternately providing a cold fluid and a hot fluid over the stacked ferroelectric modules {FM$^n$}, whereby the stacked ferroelectric modules {FM$^n$} are cooled and heated, respectively, by alternate evaporation and condensation at a first temperature that is lower than each Curie temperature $T_c^n$, and at a second temperature that is higher than each Curie temperature $T_c^n$. Thereby each ferroelectric layer of the stacked ferroelectric modules {FM$^n$} undergoes alternating phase transitions between the ferroelectric phase and the paraelectric phase with temperature cycling.

In yet another embodiment of the invention for a multistage apparatus and operation, N individual modules {FM$^n$} are comprised of ferroelectric materials and other components as described herein, each module having a different phase transition temperature, $T_c^1$ to $T_c^N$, varying in an increasing sequence between the temperature of the heat sink, $T_L$, and the temperature of the heat source, $T_H$. Each ferroelectric stage, or module, FM$^n$, is thermally cycled around its respective phase transition temperature, $T_c^n$, using the two-phase apparatus and method of the invention. In one embodiment, this is accomplished by using the cold reservoir for the $n^{th}$ stage as the hot reservoir for the stage FM$^{n-1}$ with the next lower transition temperature, $T_c^{n-1}$. Regenerative heating may also be used in one or more of the stages.

The polarizable material can be a magnetically polarizable material. The apparatus can include one or more layers of magnetically polarizable material each having a phase transition temperature at which the material transitions between a phase in which the material exhibits spontaneous polarization and a phase in which the material does not exhibit spontaneous polarization.

In yet another embodiment of the invention, the module that undergoes thermal cycling with the invention generally, and thermal and electrical cycling in the case of ferroelectric conversion of heat to electricity, in particular, is located in the vapor region of a hot reservoir, rather than being contained in a thermal chamber that is separated from the hot reservoir by a valve. The hot reservoir is at high temperature and pressure, $T_H$ and $P_H$, as a result of heat being input thereto. At the top of the hot reservoir in this embodiment, there is a valve that is opened and closed to connect the vapor region of the hot reservoir to the cold reservoir, which is at a low temperature and pressure, $T_L$ and $P_L$. Heat is withdrawn from the cold reservoir to a heat sink, and heat regeneration may also be used with this configuration. In one embodiment, thermal cycling of the module occurs in conjunction with the opening and closing of the valve to the cold reservoir, which causes two-phase heat transfer on the surface of the module through cyclical evaporation and condensation, respectively.

In yet another embodiment of the invention, the apparatus just described utilizes a working fluid that is a mixture of fluids that have different boiling points depending on the fluid composition, which is then used to cause cyclical evaporation and condensation to occur around a series of progressively decreasing $T_c^n$ as n varies from 1 to N, which decreasing transition temperatures, $T_c^n$, correspond to different ferroelectric layers, or modules, {FM$^n$}. The sequence of modules {FM$^n$} are situated at levels so that they are thermally cycled around their respective transition temperatures as the fluid mixture at the respective level of the apparatus cyclically undergoes condensation and evaporation as a result of the opening and closing of the valve to the low pressure reservoir. Rapid two-phase heat transfer thus occurs for each module FM$^n$ as described herein, and the temperature of each module cycles around $T_c^n$ in conjunction with cyclical condensation and evaporation on the surface of the module. In the case of ferroelectric power generation, electrical cycling is also performed for each module FM$^n$ in conjunction with thermal cycling, as described herein for other embodiments.

In yet another embodiment, a multistage series of ferroelectric modules {FM$^n$} is contained in a thermal chamber that is separate from hot and cold reservoirs. The ferroelectric modules are arrayed with progressively decreasing transition temperatures, $T_c^n$. The working fluid in this embodiment is a mixture of fluids with different boiling points such that it alternately evaporates and condenses around the sequence of temperatures $T_c^n$ as the fluid is cycled between $T_H$ and $P_H$ and $T_L$ and $P_L$ by connecting the thermal chamber and modules {FM$^n$} alternately to the hot and cold reservoirs through valves. Cyclical condensation and evaporation occur around temperature $T_c^n$ at the level in the thermal chamber where the module FM$^n$ is situated, such that each module FM$^n$ undergoes thermal cycling, as described herein, in conjunction with electrical cycling. By cycling the valves in conjunction with the electrical and thermal cycling methods described, electricity is thereby generated by each module FM$^n$ across the range of $T_c^n$ represented by the modules {FM$^n$} in the series.

The apparatus may further include devices to monitor the temperature and capacitance of one or more ferroelectric modules {FM$^n$} and the temperature and pressure of the heating and cooling fluids. Thermal cycling is coordinated with the electrical status of the ferroelectric modules {FM$^n$} under computer control through a control circuit so as to synchronize heating and cooling with electrical input and output.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more aspects or embodiments of the invention and, together with a written description, serve to explain the principles of the invention. Where practical, the same reference numbers are used throughout the drawings to refer to the same or like elements of an embodiment, wherein.

DETAILED DESCRIPTION OF THE INVENTION

Figure 1:
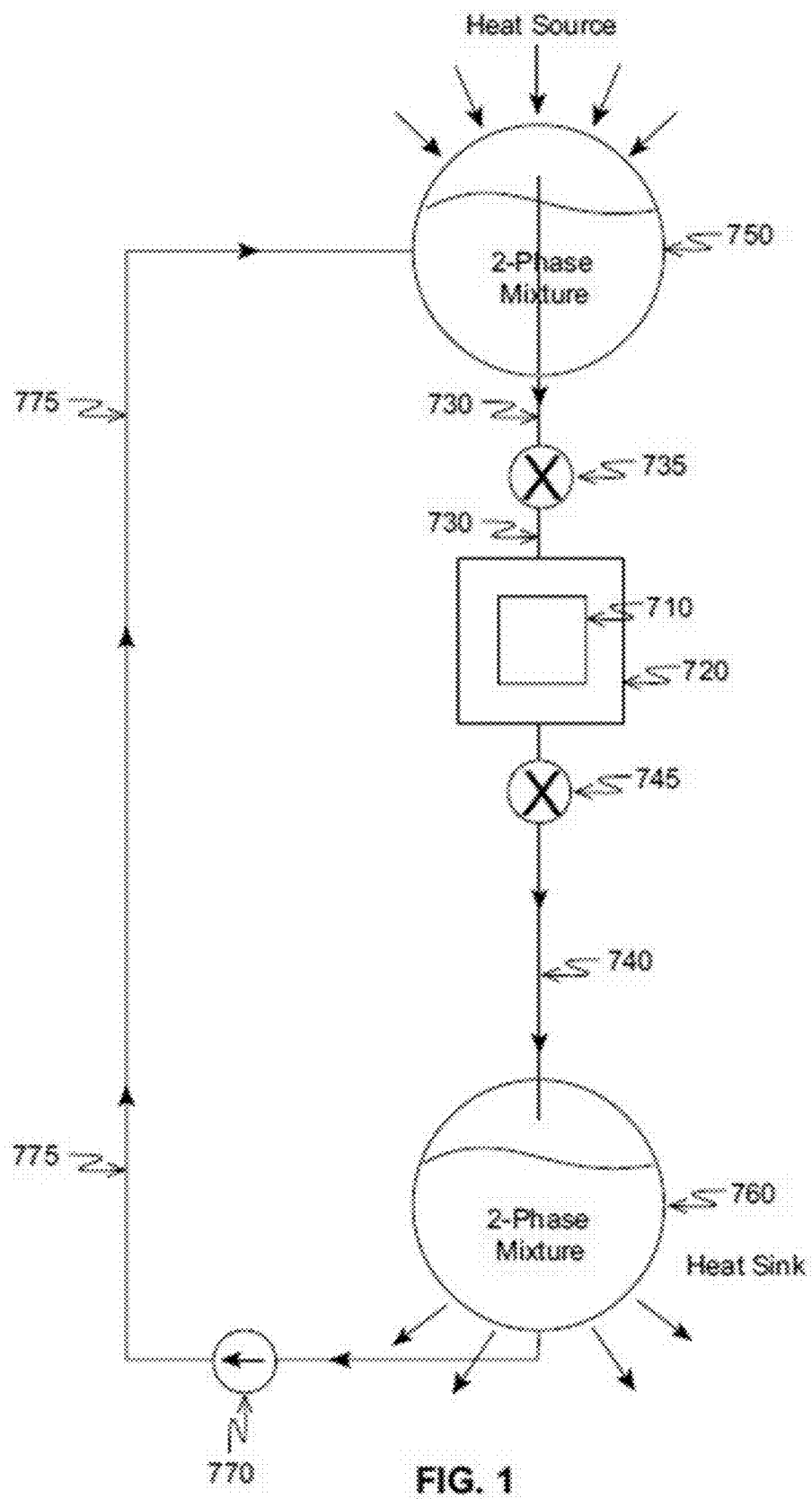
FIG. 1 is a schematic illustration of the basic components of a two-phase heat transfer and thermal cycling apparatus of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Additionally, some terms used in this specification are more specifically defined below.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "Curie temperature" or $T_c$ refers to a characteristic property of a ferroelectric material or a ferromagnetic material. At temperatures below the Curie temperature, a ferroelectric material generally is in a ferroelectric phase in which spontaneous polarization is established in the ferroelectric material. As the temperature is increased towards the Curie temperature, the spontaneous polarization established in the material decreases. Above the Curie temperature, the ferroelectric material is generally in a paraelectric phase in which spontaneous polarization is not established in the ferroelectric material normally. There are ferroelectrics, however, where a ferroelectric phase exists at temperatures above the transition temperature, and the material is paraelectric below that transition temperature. Also, there are transition temperatures between ferroelectric and antiferroelectric phases that are relevant to the invention, as described herein. There does not appear to be a clearly established usage as to whether "Curie temperature" also applies to the transition temperatures for these latter kinds of phase transitions. The terms "phase transition temperature" and "transition temperature" are used herein to include all of the foregoing types of phase transitions. "Curie temperature" or $T_c$ may be used only in conjunction with the first type of phase transition, or it may be used more broadly when apparent from the context. Whenever the use of ferroelectric materials are disclosed herein, it is intended that such use include both ordinary and improper ferroelectrics, with the ferroelectric material being cycled with respect to its phase transition as described. With extrinsic ferroelectrics, polarization represents a second order parameter, which is coupled to some primary order parameter.

For ferromagnetic materials, generally there is a ferromagnetic phase in which magnetic dipoles are spontaneously established in the ferromagnetic material. As the temperatures increase towards the Curie temperature, the magnetization in the material decreases. Above the Curie temperature, the ferromagnetic material is generally in a paramagnetic phase. There are ferromagnetic materials, however, where the ferromagnetic phase exists at temperatures above the transition temperature, and the material is paramagnetic below that transition temperature. Also, there are transition temperatures between ferromagnetic and antiferromagnetic phases that are relevant to the invention, as described herein. As with ferroelectric materials, the terms "phase transition temperature" and "transition temperature" are used to include all of the foregoing types of phase transitions for ferromagnetic materials. "Curie temperature" or $T_c$ may be used only in conjunction with the first type of ferromagnetic phase transition—where the material goes from ferromagnetic to paramagnetic as temperature increases and traverses $T_c$—or may be used more broadly when apparent from the context.

In practice, for all of the above described types of phase transitions, the sharpness of the phase change as the material temperature crosses the transition temperature is determined by the homogeneity of the composition and the material structure, such that the transition between phases may take place progressively as the temperature of the material increases or decreases, respectively, over a temperature range around the designated transition temperature of the material.

In addition to materials with a crystal structure, amorphous materials that are electrically polarizable can be used with the invention to convert heat to electricity. For such amorphous materials, the depolarization transition temperature is analogous to $T_c$ or to the ferroelectric phase transition as described above. In such amorphous materials and in polymeric ferroelectric or ferromagnetic materials, the polarizable units exhibit dipolar behavior at the atomic and molecular level. Where reference is made to the use of ferroelectric or ferromagnetic materials, it should be understood that polarizable amorphous polymers (and copolymers) with appropriate polarization and transition characteristics, as described herein, can also be used with the invention and such use is intended to be disclosed as well. In these instances, "transition temperature," or the "Curie temperature," or "$T_c$" shall be considered to refer to the depolarization transition temperature.

On occasion, "polarization" is used herein where it might be more precise to refer to "electric displacement." Since there is no significant difference between the terms in this context, polarization is used throughout for simplicity and clarity.

The parameter "P" is used herein to designate both electrical polarization and pressure to be consistent with common use in the literature. Which meaning is intended in a given instance will be apparent from the context.

It will be recognized by persons skilled in the art that a temperature gradient will exist between any two objects or materials between which heat flows. That gradient is often disregarded in quasistatic thermodynamic analyses that assume an ideal isothermal heat transfer between a working medium and a heat source or sink. For simplicity, that gradient is disregarded here and $T_H$ may be used to designate either the temperature of a heat source or the temperature to which an object, such as a ferroelectric module, is heated. Similarly, $T_L$ may be used to designate either the temperature of a heat sink or the temperature to which an object, such as a ferroelectric module, is cooled. In practice, the extent of the actual gradient may affect the overall thermal efficiency, power density, the coefficient of performance in cooling applications, and other factors.

Without intent to limit the scope of the invention, exemplary apparatuses and methods according to the embodiments of the present invention are given below. Note that titles or subtitles may be used in the examples for convenience of a reader, which in no way should limit the scope of the invention. Moreover, certain theories are proposed and disclosed herein; however, in no way, whether they are right or wrong, should they limit the scope of the invention so long as the invention is practiced according to the invention without regard for any particular theory or scheme of action.

The invention discloses a novel way of using two-phase heat transfer to rapidly input heat to, and remove heat from, systems in general so that rapid thermal cycling of the system occurs over a desired temperature range. Thermal cycling is achieved by varying the pressure and temperature of a working fluid in a chamber so that a portion of the working fluid rapidly cycles back and forth between liquid and vapor phases. As condensation and evaporation alternately occur during those phase changes, large amounts of latent heat are expelled and absorbed by the fluid, respectively. That large amount of latent heat expelled and absorbed by the fluid, in turn, is used to input and remove heat from the desired system, respectively. Rapid thermal cycling of the system is achieved thereby.

Two-phase heat transfer provides considerable advantages over conventional heat transfer systems, such as higher heat transfer coefficients, better temperature uniformity, and smaller coolant rates. Two-phase heat transfer can cause the temperature in the sample chamber to be rapidly cycled therein by controlling the synchronized opening and closing of the one or more valves that access the chamber. The potential uses of the invention are wide-ranging, and there are many ways to design, implement, and use the apparatus. Several aspects of the two-phase heat transfer process may be considered in conjunction with the system design for a given application. These factors include, among others, two-phase flow in micro-channels, boiling, condensation, pressure drop, bubble activity and flow patterns, heat transfer characteristics, and critical heat flux. In the two-phase thermal cycling of the modules (for example, 710 in FIG. 1) described herein, and in particular in the case of thermal cycling of ferroelectric modules for the purpose of generating electricity from heat as described herein, heat transfer will be largely determined by the vapor mass flow rates across the valves (735 and 745 in FIGS. 1-3, for example) and the heat transfer rates due to boiling and condensation.

The flow rate across a valve in a sonic flow with a flow coefficient of $C_v$ is given by $$q_v = 0.471 N_2 C_v p_1 \sqrt{\frac{1}{G_g T_1}} \text{ for } p_2 < \frac{1}{2} p_1,$$

where $N_2$ is the numerical constant for a given set of units, $p_1$ the upstream pressure, $p_2$ the downstream pressure, $G_g$ the gas specific gravity (air=1), and $T_1$ the absolute upstream temperature in K, for example, when q, p and T are expressed in standard units of L/min, kg/cm² and K, respectively, and $N_2$=6816. The parameters $C_v$ and $p_1$ can be chosen as design parameters to have sufficient flow rate across the valves.

The cooling of a ferroelectric module, for example, due to evaporation can be estimated by using the Rohsenow correlation for the boiling of the dielectric working fluid, which assumes nucleate pool boiling. Such a module may be depicted as 710 in FIG. 3, for example. As described hereinafter, a sufficient amount of fluid layer can be maintained by using a porous membrane on the ferroelectric layers. The heat flux due to nucleate boiling is given by $$q = \mu_l h_{fg} \left[ \frac{g(\rho_l - \rho_v)}{\sigma} \right]^{\frac{1}{2}} \left( \frac{C_{p,l} \Delta T_e}{C_{s,f} h_{fg} Pr_l^n} \right)^3.$$

Characteristic properties of a fluorocarbon dielectric working fluid, for example, are the liquid phase specific heat capacity $C_{p,1}$=1100 J/(kg·K); the evaporation latent heat $h_{fg}$=84,400 J/kg; the liquid density $\rho_1$=1619 kg/m³; the vapor density $\rho_v$=13.4 kg/m³; the surface tension $\sigma$=8.1×10⁻³ kg/s²; the liquid viscosity $\mu_1$=440×10⁻⁶ kg/(m·s); and the Prandtl number $Pr_1$=9.01. In addition, the nucleate boiling constraints are $C_{s,f}$=0.005 and n=1.7. The heat flux q is in W/m². The excess temperature is defined by $\Delta T_e = T_s - T_{sat}$, where $T_s$ is the surface temperature and $T_{sat}$ is the vapor saturation temperature. The heat flux can be very large, exceeding 100 kW/m².

Condensation can also deliver heat at very large rates when the temperature of the vapor is reduced below its saturation temperature. In condensation, the latent heat of the vapor is released, heat is transferred to the surface, and condensate is formed. For a laminar film condensation process on a vertical plate, the heat flux can be expressed as $$q_c = \bar{h}_L (T_{sat} - T_s)$$

where the heat transfer coefficient is given by $$\bar{h}_L = \frac{Re_\delta \mu_l h'_{fg}}{4L(T_{sat} - T_s)},$$

and the Reynolds number is given by $$Re_\delta = \left[ \frac{3.70 k_l L (T_{sat} - T_s)}{\mu_l h'_{fg} \left( \frac{v_l^2}{g} \right)^{\frac{1}{3}}} + 4.8 \right]^{0.82}.$$

The parameter $h_{fg}'$ is the modified evaporation latent heat expressed in terms of the Jakob number Ja, where $$h_{fg}' = h_{fg}(1 + 0.68 Ja).$$

The Jakob number is defined by $$Ja = \frac{C_{p,l}(T_{sat} - T_s)}{h_{fg}}.$$

Both film and drop-wise condensation can achieve very high heat flux delivery rates, exceeding 100 kW/m². The high heat flux rates that can be achieved with a two-phase heat transfer system are integral to the rapid rate of thermal cycling that can be achieved with the present invention.

As embodied and broadly described herein, this invention, in one aspect, relates to an apparatus and method for rapid thermal cycling of a material, device, or other system using two-phase heat transfer. Such an apparatus in one embodiment is represented schematically in FIG. 1. As show in FIG. 1, a module 710 is located inside a thermal chamber 720, where the module 710 is the material, device or other system that undergoes thermal cycling. The thermal chamber 720 is connected to the hot and cold reservoirs, 750 and 760, by conduits 730 and 740, respectively, which preferably are thermally insulated. The hot reservoir 750 contains a two-phase mixture of a working fluid maintained at high pressure and high temperature, $P_H$ and $T_H$. As shown in FIG. 1, the two-phase mixture in hot reservoir 750 is a system comprising two-phase a liquid phase and a separate vapor phase. The cold reservoir 760 contains a two-phase mixture of the same working fluid maintained at a lower pressure and lower temperature, $P_L$ and $T_L$. As shown in FIG. 1, the two-phase mixture in cold reservoir 760 is a system comprising two-phase a liquid phase and a separate vapor phase. The conduit 730 is attached to the hot reservoir 750 so that the conduit opens into the vapor portion of the system in the hot reservoir 750, and the conduit 740 is attached to the cold reservoir 760. Both conduits 730 and 740 are attached to thermal chamber 720 so as to provide a passageway through which vapor can pass from the hot reservoir 750 to the chamber 720, and a passageway through which vapor can pass from the thermal chamber 720 to cold reservoir 760.

The relative dimensions of the conduits 730 and 740 are such that the vapor in the hot reservoir 750 can pass rapidly with minimal resistance to the chamber 720 when valve 735 is open and valve 745 is closed, and the vapor in the thermal chamber 720 can pass rapidly with minimal resistance to the low temperature reservoir 760 when valve 745 is open and valve 735 is closed. In one embodiment, to facilitate temperature cycling within the thermal chamber 720 at temperatures closely approaching $T_H$ and $T_L$, the volume of vapor in both the hot and cold reservoirs 750 and 760 is substantially greater than the volume of vapor in the chamber 720. If the quantity of vapor in either the hot or cold reservoir is not significantly greater than the volume of vapor in the thermal chamber, temperature variations may occur in the vapors in the reservoirs during operation when the respective valve is open between that reservoir and the thermal chamber 720.

Pump 770 returns working fluid from the low temperature reservoir 760 to the high temperature reservoir 750 via a conduit 775, which in one embodiment is insulated. In the absence of leakage, the working fluid is in a self-contained circulating system and need not be replenished. In the event there is material leakage during operation, however, a source of working fluid (not shown) is in communication with the device 700 so that the working fluid can be replenished as necessary.

The hot reservoir 750 receives heat from a heat source (not shown) which heat source can be general and of many kinds, so long as the temperature, heat flux, and other characteristics are appropriate for the particular use. Heat is transferred from the heat source through one or more heat exchangers to the hot reservoir 750. Through controlled input of heat and controlled pressure, the two-phase mixture in the hot reservoir 750 is maintained at pressure $P_H$ and temperature $T_H$ during operation. Similarly, the two-phase fluid in the cold reservoir 760 is maintained at $T_L$ and $P_L$ through control of pressure and by thermal communication, through one or more heat exchangers, with a heat sink (not shown). Heat exchangers that can be used to provide heat to the hot reservoir 750 and to remove heat from the cold reservoir 760 are well known to those skilled in the art.

Figure 2:
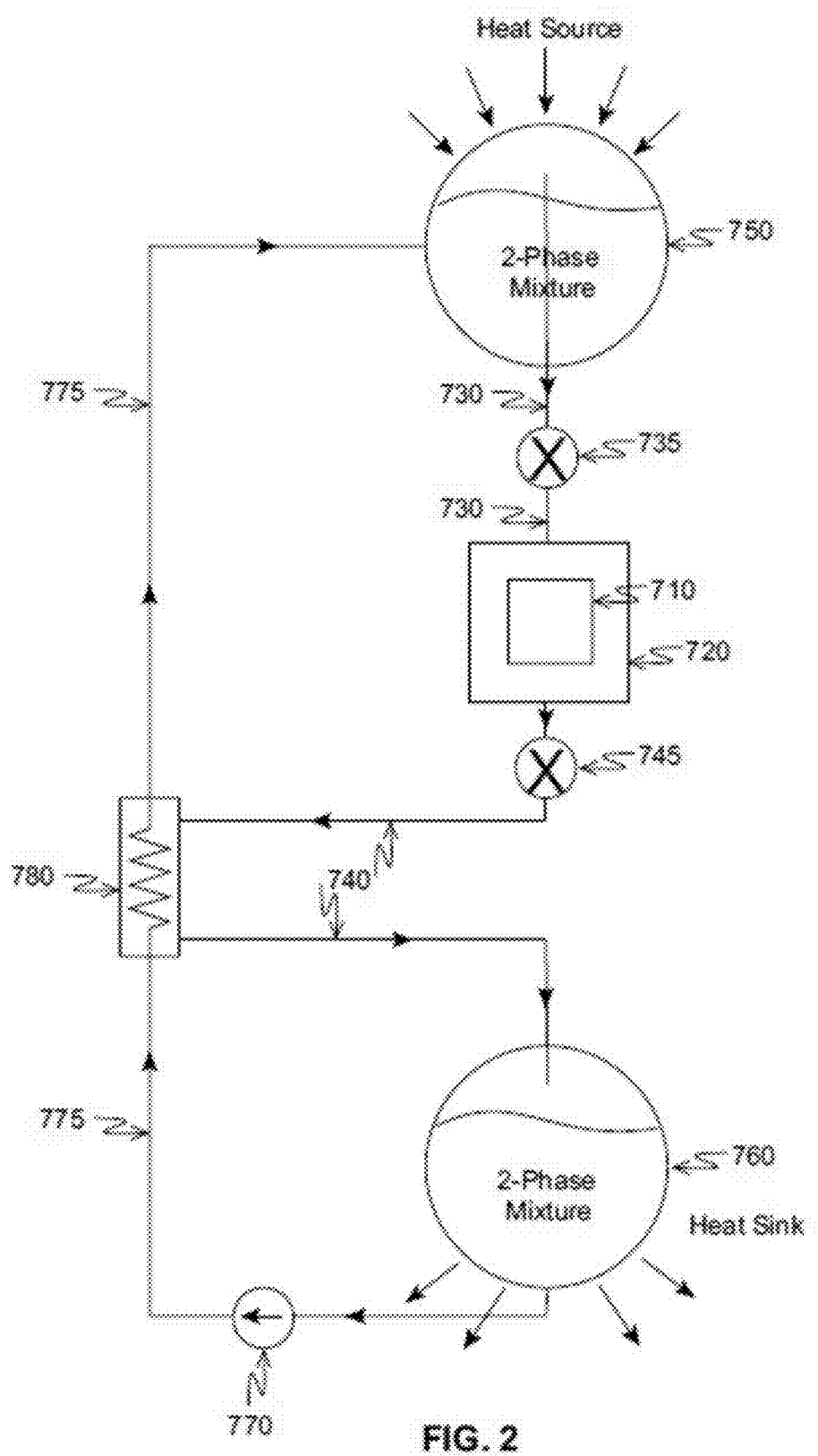
FIG. 2 is a schematic illustration of the basic components of a two-phase heat transfer and thermal cycling apparatus of the present invention similar to FIG. 1, but with a heat regenerator included.

FIG. 2 is a schematic depiction of another embodiment of the invention which is like the apparatus illustrated in FIG. 1, but a heat regenerator 780 is included. Heat generation is well known to those skilled in the art. In this embodiment, the conduit 740 from the thermal chamber 720 to the low pressure reservoir 760 is routed to and through the regenerator 780.

In the exemplary embodiment illustrated schematically in FIG. 1 and FIG. 2, the controlled and synchronized opening and closing of the valves 735 and 745 causes a rapid change in the pressure and temperature of the vapor in the thermal chamber 720, cycling between the vapor states at $T_H$ and $P_H$, and at $T_L$ and $P_L$. When valve 735 is open, valve 745 is closed, and conversely. When valve 735 is open, the thermal chamber 720 immediately receives vapor from the hot reservoir 750 at $P_H$ and $T_H$, thereby exposing the module 710 to vapor at $T_H$ and, as described in detail herein, rapidly raising the temperature of the module 710 to $T_H$ as heat is input into the module 710 as vapor in chamber 720 condenses on the surface of module 710. Valve 735 is then closed and valve 745 is opened. The pressure and temperature of the vapor in the thermal chamber 720 changes immediately to $P_L$ and $T_L$ as vapor passes from chamber 720 to the cold reservoir 760. The module is rapidly cooled to $T_L$ as condensate on the surface of module 710 evaporates. As described in detail herein, the temperature of the module 710 is thereby rapidly lowered to $T_L$ as heat is removed from the module. In one embodiment of the invention, the foregoing sequence is repeated continuously, causing an ongoing cycling of the module 710 around a desired temperature T, where $T_L < T < T_H$.

The plurality of control valves 735 and 745 are controlled by a computer, which may receive temperature and pressure data from the fluid mixture in reservoirs 750 and 760; temperature and other data from the module 710; temperature and pressure data from the thermal chamber 720; and other data, depending upon the application.

Rapid temperature change of the module 710 can be achieved because the temperature and pressure of the vapor in thermal chamber 720 changes virtually instantaneously when the respective valve to the hot reservoir 750 or cold reservoir 760 is open and the opposite valve is closed. The pressure and temperature characteristics of the fluid propagate from the hot reservoir 750 to chamber 720, and from the chamber 720 to the cold reservoir 760, through the conduits 730 and 740 at approximately the speed of sound for the particular fluid. The temperature of the vapor in the thermal chamber 720 thus cycles rapidly between $T_H$ and $T_L$, coinciding with which of the valves 735 or 745 is opened at a given time, the opposite valve being closed in synchronization. The pressure of the vapor in the thermal chamber 720 cycles equally rapidly between $P_H$ and $P_L$.

The speed at which the temperature of the module 710 changes as a result of the temperature and pressure change of the vapor in the thermal chamber 720 depends on a number of factors, including the ratio of the surface area of the module 710 to its thermal mass. Thermal energy is added to or removed from the module 710 primarily by the alternating condensation and evaporation of the working fluid on the surface of the module 710. Because the latent heat of evaporation or condensation is generally very large compared to the sensible heat of the working fluid in chamber 720, such two-phase heat transfer and thermal cycling is much more rapid than what might be achieved with other heat transfer systems.

In one embodiment of the invention, the surface of module 710 is treated and/or configured so as to cause a thin layer of the liquid working fluid to remain on the surface of module 710 during temperature cycling. The effect of such a liquid layer is to enhance the rate of heat transfer into, and out of, the module 710 during cycling. The liquid layer rapidly gives up, and removes, large quantities of heat during condensation and evaporation, respectively. The liquid layer in turn transfers heat into and out of the module 710 at much higher rates than would occur if the interface between the module 710 and the working fluid in chamber 720 was a strictly vapor-module interface. The thickness of the liquid layer in such an embodiment should be sufficient to avoid complete evaporation (dry-out) from the surface of the module during cooling to temperature $T_L$, but not unnecessarily thick since excess thickness would add additional thermal mass that could slow thermal cycling of the module 710. The particular characteristics of such a liquid layer on the module 710 will depend on the specifics of the application, the nature and configuration of module 710, the specific working fluid, and other factors that are determined by a given application.

As noted, a factor that affects the rate at which module 710 cycles between $T_L$ and $T_H$ is the relative surface area of the module where condensation and evaporation occurs in comparison to the overall thermal mass of module 710. In certain embodiments, the area of module 710 in comparison to its thermal mass may be enhanced by constructing the module so that it is comprised of thin strips or sheets of material, which may also be configured into various geometrical shapes that permit the vapor to permeate that geometry, thereby increasing the available surface area over which thermal transfer occurs into and out of module 710 during evaporation and condensation.

In one embodiment, for example, as described elsewhere herein, the module 710 may include an amorphous polymer material, which with thermal cycling may be used, for example, to convert heat to electricity. The polymer may be formed, for example, into a strip of a thickness of approximately 100 microns and a width of approximately 2 cm, and the strip may be wound into a more or less spiral geometry wherein there is space between the adjacent layers of the spiral to generally allow the vapor in the thermal chamber 720 to access the entire surface area of the loosely wound spiral strip from both directions. For such a module, where the surface has been treated so as to maintain a thin liquid film of the working fluid to facilitate thermal transfer, the temperature of the module changes almost immediately when the temperature and pressure of the vapor in the thermal chamber is changed as described herein.

Figure 6A:
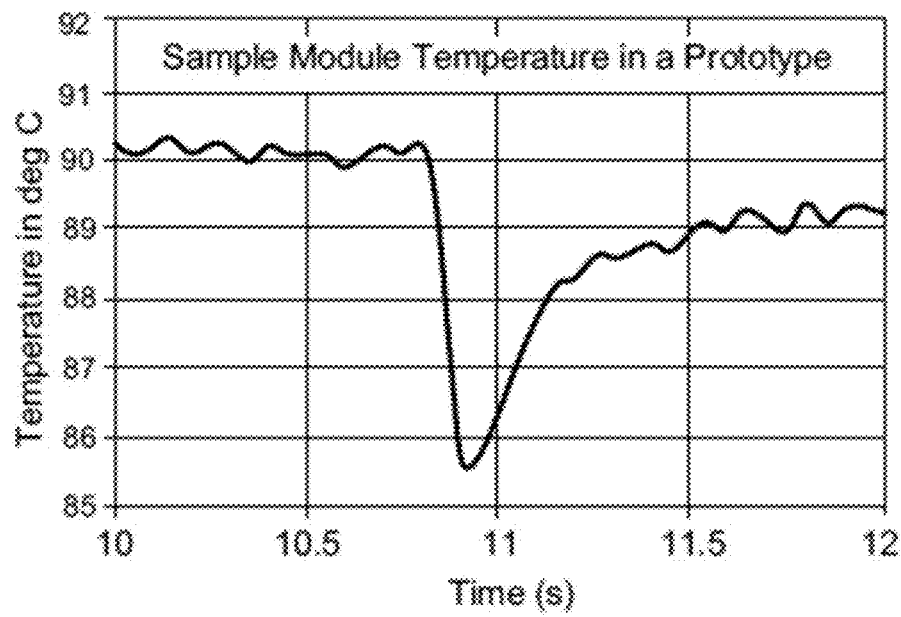
FIGS. 6A and 6B are measured results showing temperature variations (FIG. 6A) and pressure variations (FIG. 6B) as a function of time during cycling, and showing that temperature varies with pressure with very little time delay.
Figure 6B:
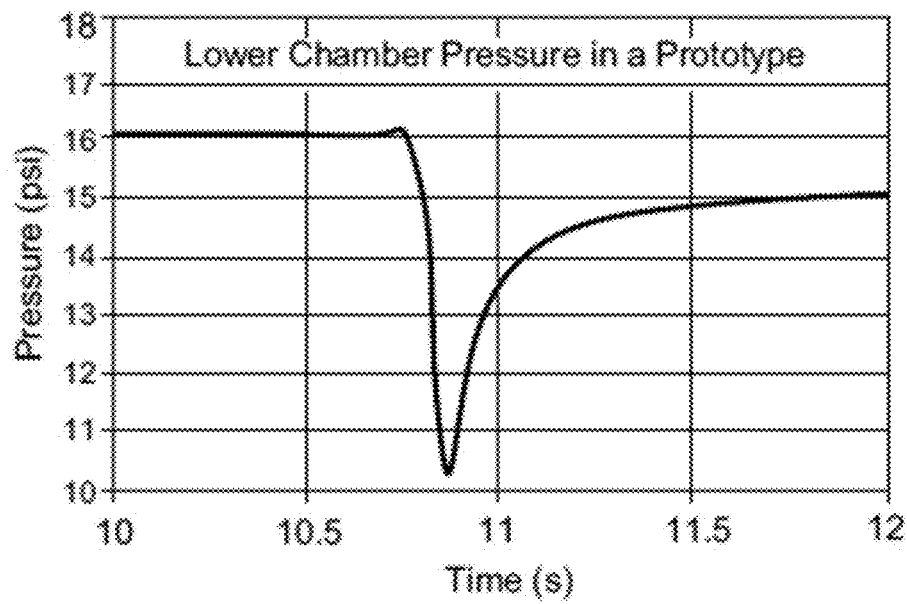
Figure 7:
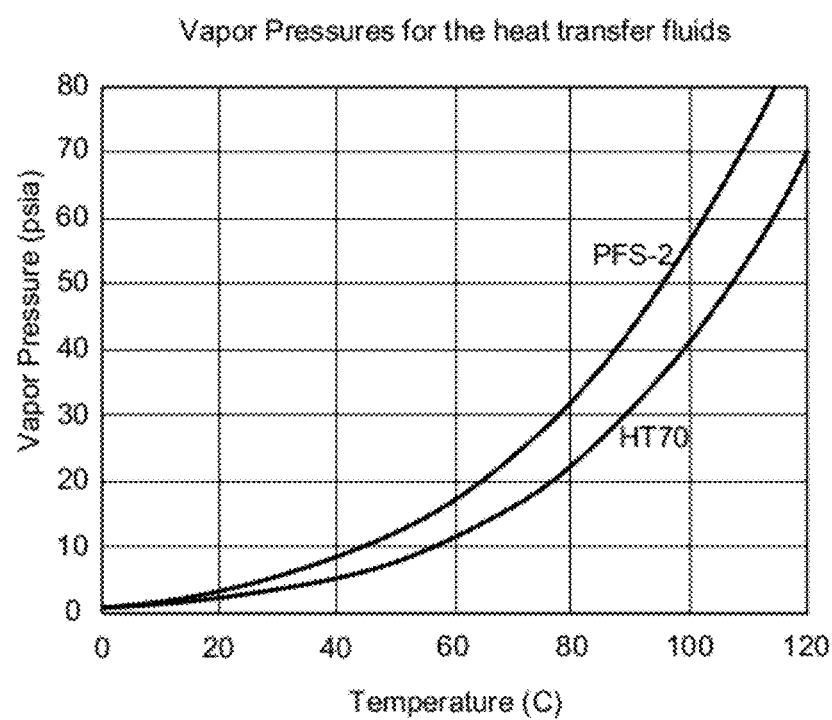
FIG. 7 illustrates the equilibrium (saturation) vapor pressures as a function of temperature for two fluorinated dielectric working fluids.

For example, FIG. 6 presents measured results for the temperature change of such a module as a function of changing pressure. The measurements were made using an apparatus like that depicted in FIG. 1. In this example, the decrease in pressure from approximately 16 psig to 10.5 psig in the sample zone occurred over ~0.1 s. The decrease in temperature in the sample from ~90.2° C. to ~85.6° C. also occurred over ~0.1 s. As reflected in FIG. 6, the change in temperature closely tracked the change in pressure as a function of time. The changing temperature of the module lagged changing pressure by only ~0.05 s. The rate of pressure (and temperature) cycling in the chamber 720 depends on many factors, including the characteristics and speed of the switching valves, 735 and 745. The results presented in FIG. 6 are not intended to suggest that they are a limitation of the cycling speed that may be achieved with the invention. More rapid cycling may be achieved in certain applications, and cycling may also be limited to slower speeds in other applications, depending upon many factors, including the ratio of the surface area of module 710 to the thermal mass of module 710.

Figure 5:
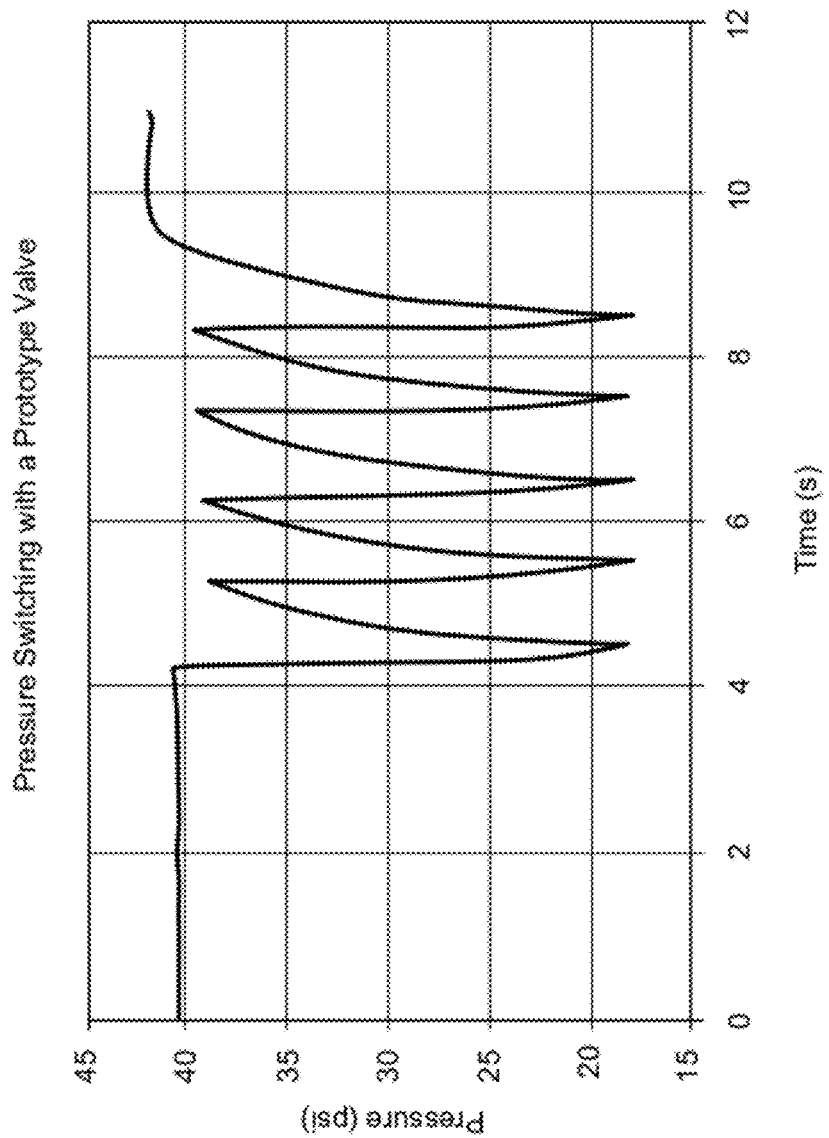
FIG. 5 are the measured results of pressure cycling by switching a valve between open and closed conditions in an apparatus with elements similar to those depicted in FIG. 1.

In one example using an apparatus like that illustrated schematically in FIG. 1, cycling measured at 1 Hz is presented graphically in FIG. 5, which presents pressure as a function of time over a course of five cycles. The pressure cycle range of ~20 psi corresponds to a temperature cycle range of ~20-25° C. for certain working fluids. Again, faster cycling can be achieved in various applications, depending upon various factors.

The invention, in one aspect, relates to an apparatus and method for converting thermal energy directly to electrical energy by rapid thermal cycling of a ferroelectric or other electrically polarizable medium. Rapid thermal cycling exploits the change in polarization that develops in such materials when they are cycled around their transition temperatures, such polarization being inherent to the materials and occurring without induction by application of an external electric field. With ferroelectric materials, spontaneous unit cell polarization occurs as a result of the material transitioning into a ferroelectric phase. The powerful inherent polarization of the unit cells that occurs spontaneously produces a large overall net polarization in the ferroelectric material as a whole when the unit cells and domains are aligned by poling. The invention further exploits the large changes in overall net polarization that occur when a change in the temperature of the ferroelectric material causes a transition to a phase (whether paraelectric or antiferroelectric) that has negligible net polarization. Whenever the use of ferroelectric materials are disclosed herein, it is intended that such use include both ordinary and improper (or extrinsic) ferroelectrics, with the ferroelectric material being cycled with respect to its phase transition as described. With extrinsic ferroelectrics, polarization represents a second order parameter, which is coupled to some primary order parameter.

Similarly, an overall net polarization occurs inherently in the case of polarizable amorphous polymer (and copolymer) systems, when poled, and that net polarization diminishes and disappears when the temperature of the material traverses the depolarization transition temperature. The changes in polarization that occur with cycling of such amorphous polymer systems around their depolarization transition temperatures are exploited by the invention in the same general fashion as the invention uses the spontaneous polarization and changes in spontaneous polarization that occur in ferroelectric materials.

Various polarizable amorphous materials are of particular utility with the invention because their depolarization transition temperatures are in a useful range for many applications, generally less than ~250° C., although they may also be at greater temperatures, and they produce a robust discharge of electrical energy when cycled. The relationship between energy, polarization, and permittivity is:

$$U = P^2/2\epsilon\epsilon_0.$$

While P is generally smaller with such amorphous polymers than is the case, for example, with ferroelectric ceramics, the permittivity for such materials is much smaller, yielding a high energy density, U. Examples of polarizable amorphous materials that can be used with the invention include MXD6 Nylon, which has a transition temperature of approximately 78° C. and has produced measured discharge voltages of approximately 800 V for a sample 70 µm thick. A PANMA-4 acrylonitrile copolymer sample 50 µm thick has produced a discharge voltage of approximately 1,300 V with a transition temperature of approximately 100° C.

The invention permits the removal and use of the electrical energy generated in ferroelectric materials by the spontaneous polarization that occurs when the material is in the ferroelectric phase. The electrical energy so generated can be exported to external circuitry in conjunction with phase transition of the material from the ferroelectric phase to a nonpolar phase. The inherent net spontaneous polarization, $P_s$, disappears as the material transitions to a non-ferroelectric phase. Commonly, the phase transition that renders $P_s$ negligible will be from the ferroelectric phase to the paraelectric phase, but it may also be from the ferroelectric phase to the antiferroelectric phase, since the antiferroelectric phase produces negligible net spontaneous polarization in the material overall.

To allow the conversion of thermal energy to electrical energy with the invention, the basic ferroelectric module is cycled around its phase transition temperature. That temperature cycling is accomplished with one or more two-phase heat exchangers that interface between the ferroelectric module and a heat source and heat sink. The heat source and heat sink are not limited, any they may be thermally linked to the two-phase heat exchangers that cycle the ferroelectric converter by any mode through which thermal energy is transferred, including convective, conductive and radiative transfer, and one and two-phase thermal transfer systems. The invention can be used generally to convert thermal energy where: (1) at least a portion of the temperature range between the heat source temperature, $T_H$, and heat sink temperature, $T_L$, are within the range of phase transition temperatures for one of the many ferroelectric materials that exist; and (2) the temperature difference, $\Delta T = (T_H - T_L)$, is sufficient to allow effective conversion. There are ferroelectrics with phase transition temperatures that range from as low as about 0° C. to 700° C. and higher. There is no theoretical limit to the operating temperature of the apparatus or method, and they can also be used at temperatures below 0° C. and above 700° C. insofar as appropriate ferroelectrics are available and a heat source and heat sink are available for such temperatures.

Many first order transition materials are appropriate for use with the invention, but ferroelectric materials with second order transitions may also be used. Lead based ferroelectric materials systems, for example, provide a wide range of materials combinations, such as PZT, PZST, PLT, etc., that may be used. The particular percentage compositions of the constituent elements will affect the specific performance characteristics of the material, including the phase transition temperature. In polymer systems, the phase transition temperature can be varied and controlled by forming copolymers and blends. A list of many ferroelectrics and antiferroelectrics that may be used with the invention is set forth in M. Lines and A. Glass, PRINCIPLES AND APPLICATIONS OF FERROELECTRICS AND RELATED MATERIALS, APP. F (1977, Oxford reprint 2004), though the list is not exhaustive. That Appendix F is incorporated herein. The invention can be used with ferroelectrics that are in either solid or liquid form, the latter including, for example, liquid ferroelectrics and ferroelectric fine crystals suspended in a liquid appropriate for a particular application.

Figure 24:
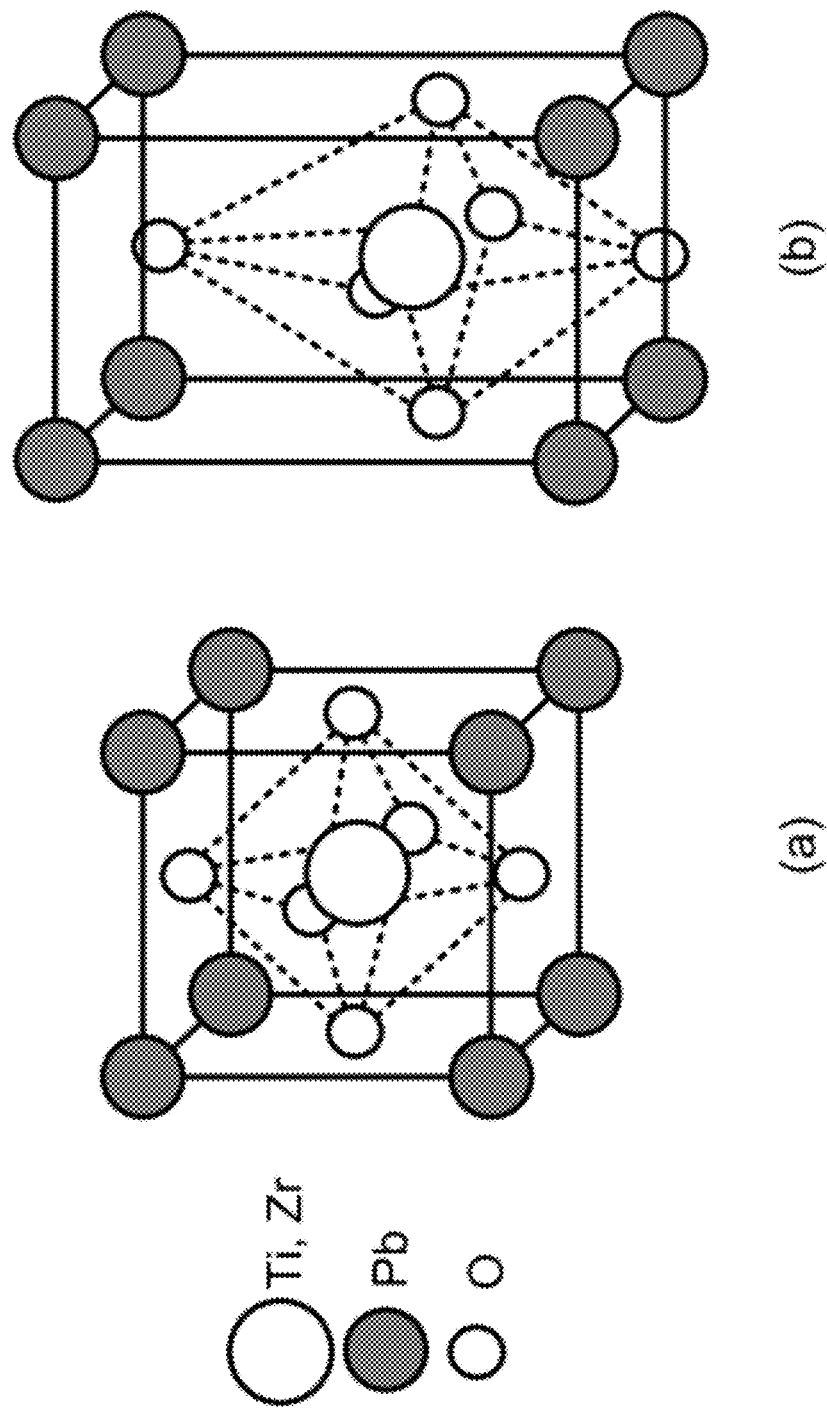
FIG. 24 illustrates schematically the shift from (a) the paraelectric cubic state of a Perovskite crystal to (b) the tetragonal configuration, the latter reflecting the ferroelectric state with displaced ions that arise from deformation of the unit cell, thereby making the unit cell an electric dipole, which in the aggregate with the other dipoles throughout the material give rise to spontaneous polarization, $P_s$.
Figure 25:
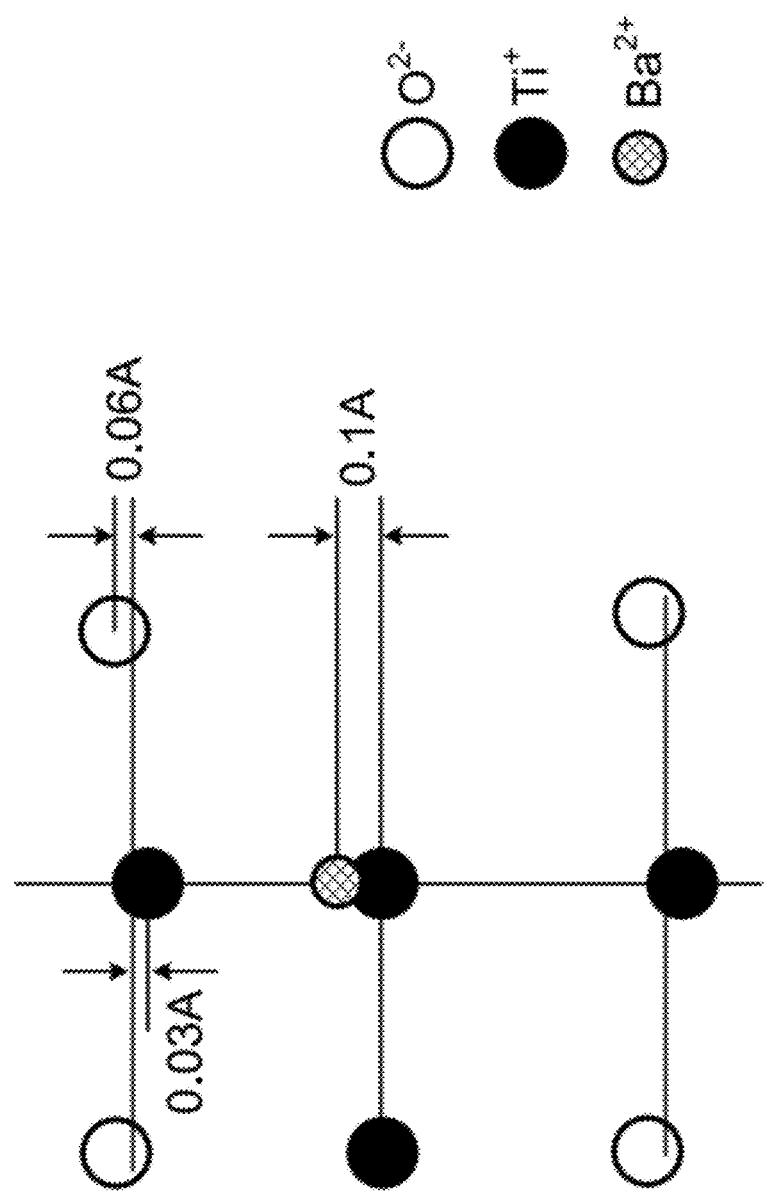
FIG. 25 illustrates the magnitude of the ionic displacements that occur in the unit cell of the Perovskite barium titanate, $BaTiO_3$, when in the ferroelectric phase and that give rise to spontaneous polarization, $P_s$.

By way of example, the invention can be used with a number of Perovskite ferroelectrics, such as PZT or PLT, which mostly undergo first order transitions when the unit cell structure undergoes transition from cubic (paraelectric phase) to tetrahedral (ferroelectric phase). FIG. 24(a) illustrates the unit cell structure for a Perovskite crystal in the paraelectric phase where $T > T_c$. In the example, the eight corners of the cube are occupied by lead atoms; the six faces of the cube are occupied by oxygen atoms; and the center of the cube is occupied by a titanium or zirconium atom. FIG. 24(b) depicts the shift in the positions of the ions when the material is in the ferroelectric phase and $T < T_c$. It is that shift that gives rise to the local electric dipole of the unit cell, and it is those electric dipoles that, in the aggregate, produce the spontaneous polarization of the ferroelectric material, $P_s$. FIG. 25 illustrates the magnitude of the physical displacement, in angstroms, that may occur among the ions in the unit cell in the ferroelectric phase, which displacement gives rise to the unit cell electric dipole.

Criteria that affect the usefulness of a ferroelectric material, or a polarizable amorphous polymer, include: (1) a phase transition temperature that matches the available heat source and sink; (2) the sharpness of the phase transition as a function of temperature; (3) the energy released during transition from a polarized state to a non-polarized state, as expressed by $U = P^2/2\epsilon\epsilon_0$ (with high permittivity ferroelectrics, spontaneous polarization in the ferroelectric state is preferably $\geq 2$ µC cm$^{-2}$, but amorphous polymers with much lower polarization may be used where they have low permittivity); (4) a sufficiently high resistivity to avoid the charges on adjacent electrodes from leaking through the medium before the stored electrical energy can be removed externally at high voltage; (5) the ability to pole during the transition to the ferroelectric or other polarized state with a field that is comparatively small, so that the poling voltage is substantially less than the voltage at which the charge is removed (generally, it is desirable that the poling voltage be less than about 20% of the generated voltage, and preferably less than about 5%); and (6) a relatively high transition energy, or enthalpy, in comparison to the energy required to heat the lattice during cycling (this factor will depend in part on the magnitude of the temperature difference between the high and low cycling temperatures).

Figure 12:
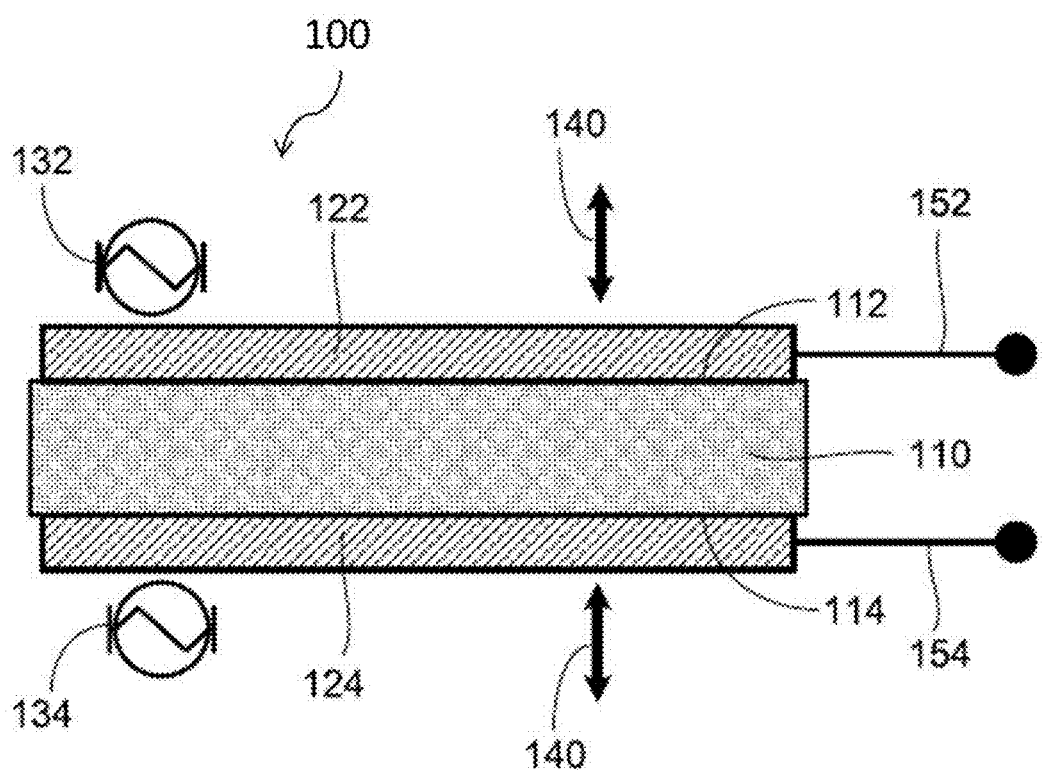
FIG. 12 is a cross-sectional schematic view of a ferroelectric device for converting heat to electric energy that utilizes changes in spontaneous polarization that occur in temperature cycling to generate electric charges that can be removed to external circuitry at high voltage, according to one embodiment of the present invention.

In one embodiment of the present invention relating to the conversion of thermal energy to electricity, FIG. 12 schematically shows a single-stage ferroelectric conversion device/apparatus 100 that utilizes the change in spontaneous polarization that occurs from temperature cycling to generate electric charges that are discharged to external circuitry at high voltage. The apparatus 100 includes a ferroelectric layer 110 having a first surface 112 and an opposite, second surface 114. The ferroelectric layer 110 consists of a solid or liquid ferroelectric material that is characterized by a phase transition temperature at which the material undergoes a phase change from the ferroelectric phase to either the paraelectric or antiferroelectric phase and back again as the temperature change is reversed. The ferroelectric layer 110 may consist of a ferroelectric material that is characterized with a Curie temperature, $T_c$, such that when the temperature of the ferroelectric material is lower than the Curie temperature $T_c$, the ferroelectric material is in a ferroelectric phase in which spontaneous polarization is established in the unit cells of the ferroelectric material, and when the temperature of the ferroelectric material is greater than the Curie temperature, $T_c$, spontaneous polarization is not established in the unit cells of the ferroelectric material or is negligible. The ferroelectric layer 110 may also consist of a ferroelectric material that undergoes phase transition from ferroelectric to paraelectric as the temperature of the ferroelectric material decreases below the transition temperature. The ferroelectric layer 110 may also consist of a ferroelectric material that undergoes phase transition from the ferroelectric phase to the antiferroelectric phase at a phase transition temperature, such material changing back to the ferroelectric phase when the temperature change is reversed. The ferroelectric layer 110 has a thickness defined between the first surface 112 and the second surface 114. The thickness required in practice depends upon several parameters including the particular application and the characteristics and amount of heat available to be converted to electricity; the particular ferroelectric material utilized; and the thermal conductivity of the ferroelectric material.

Typically, the thickness of the ferroelectric layer 110 in one stage of the apparatus 100 is between about 0.01 mm and about 1 cm. Other values of the thickness can also be utilized to practice the invention. The ferroelectric layer 110 may be planar in shape or of any other shape, its configuration being limited only by manufacturing technology and operational considerations for the device. Polarizable amorphous polymers (and copolymers) in particular can be fabricated and applied in a very wide range of shapes through techniques well know to those skilled in the art, and flexible polymers in sheets, strips or other shapes can be applied to many different surfaces in implementing the energy conversion device. In one such embodiment, the strip or sheet may be thick enough to maintain structural integrity during use, but no thicker than necessary for that purpose since additional thickness adds thermal mass and can slow cycling speed. In other embodiments, the strip or sheet may be used in combination with very thin support structures for structural integrity, particularly if the thickness is less than a few micrometers thick.

Figure 19:
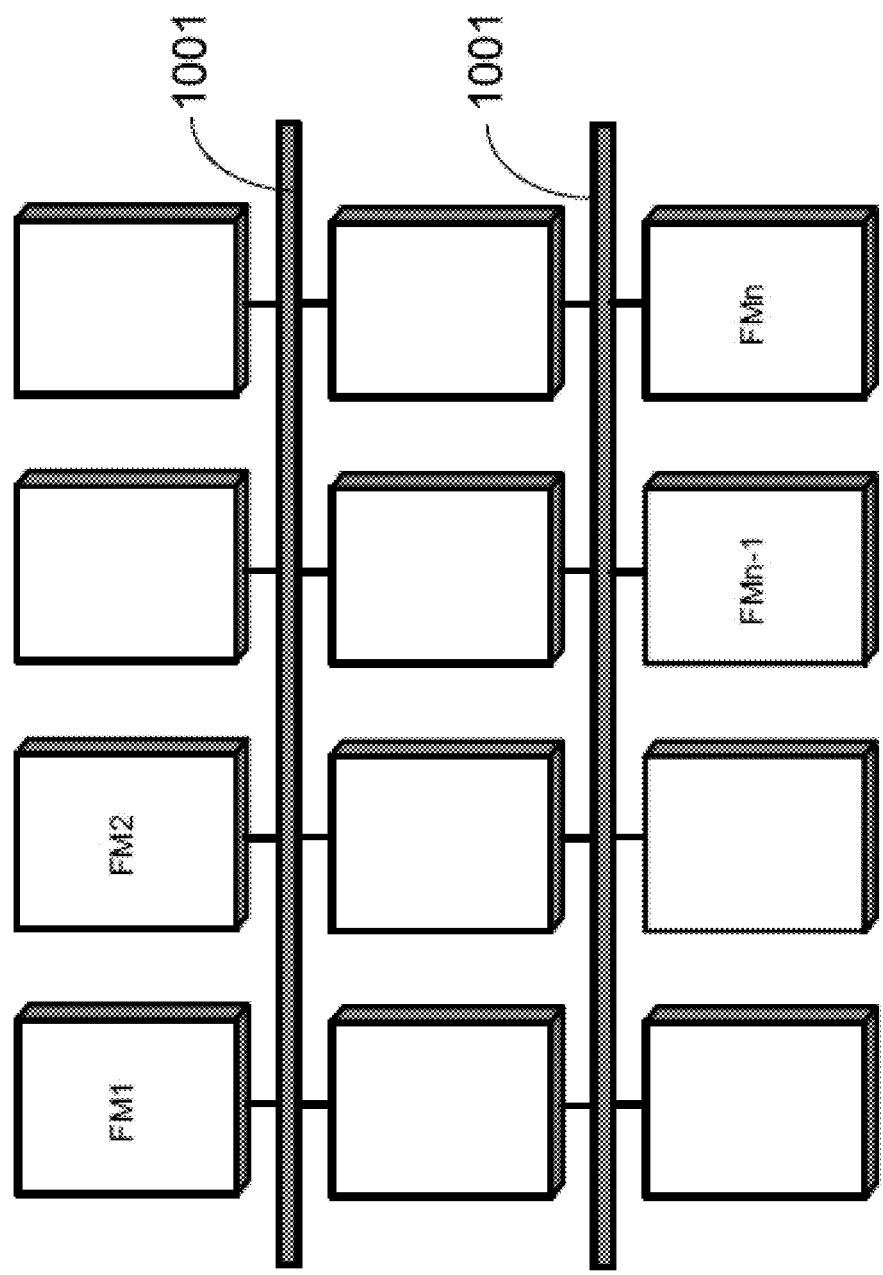
FIG. 19 shows schematically a ferroelectric device for converting heat to electric energy according to one embodiment of the present invention.

The width, length and shape of the ferroelectric layer 110 of FIG. 12 is determined by the nature of the ferroelectric material, the particular application, the characteristics and amount of heat available to be converted to electricity, the heat transfer mechanism, and other factors. There is no theoretical limit on the thickness, width and length of the ferroelectric layer 110. Limitations are practical manufacturing limitations that may exist from time to time for a particular ferroelectric material and operational factors of a particular application. Where the width and length of the ferroelectric layer 110 is limited by practical considerations, a number of similar or identical devices can be arranged in an array or in a stack to effectively expand the surface available for communication with the heat exchangers that interface the device depicted in FIG. 12 with the heat source and heat sink. In such an application, the conductive leads from the electrodes may be joined to electrical buses, and the cumulative array would then act as a larger device having a heat exchanger area approximately equal to the total area of the individual devices, thereby permitting generation of electric power limited only by the quantity and character of the available thermal energy. One example of such an array is illustrated by FIG. 19.

A pair of electrodes 122 and 124 is respectively positioned on the first surface 112 and the second surface 114 of the ferroelectric layer 110. The electrodes 122 and 124 consist of a thermally and electrically conductive material. Such electrodes 122 and 124 are substantially in contact with the first and second surfaces 112 and 114 of the ferroelectric material/layer 110 so as to provide electrical contact and maximize thermal conductivity. The pair of electrodes 122 and 124 may be comprised of, for example, a thin coating of silver of a thickness sufficient to permit the conduction of the current that is generated, but sufficiently thin to minimize interference with thermal conductivity between the heat exchangers and the ferroelectric material. The thickness of the silver electrodes can be about 1-5 microns, for example. In some embodiments, it may be desirable to have the electrode set back slightly from the edges of the ferroelectric layer 110 by, for example, 1 mm, to avoid electrical discharge around the edge of the ferroelectric layer 110. In certain embodiments, the polarizable material, and polarizable amorphous polymers in particular, may be applied or affixed to conductive sheets, strips, or objects of a desired configuration, and such sheet may then serve as one of the electrodes.

Figure 4:
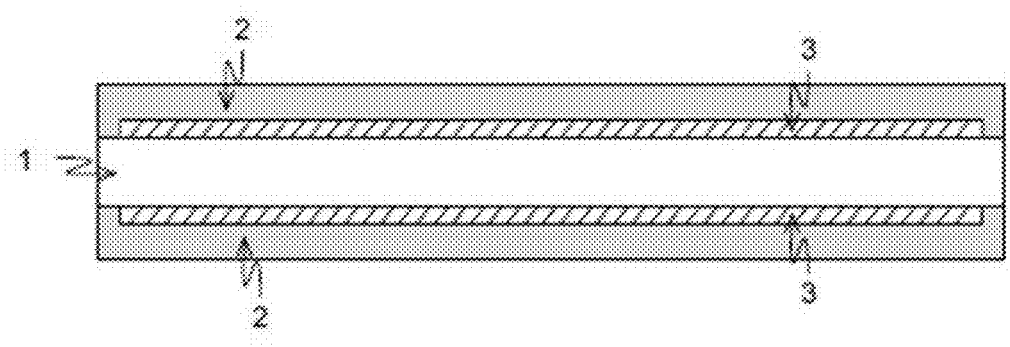
FIG. 4 is a schematic illustration of a ferroelectric device comprised of a ferroelectric layer, electrodes on each side of the ferroelectric layer, and a porous membrane on the electrodes that maintains a layer of fluid during thermal cycling.

In one embodiment, the ferroelectric layer 100 of FIG. 12 is treated, surfaced, and/or configured so as to cause a layer of the liquid working fluid to remain on the surface of the ferroelectric layer 100 during temperature cycling. In yet another embodiment, a sufficient amount of fluid layer is maintained thereon by applying a porous membrane (or any other layer with open porous structure) to the ferroelectric layers, as described elsewhere herein. The effect of such a liquid layer is to enhance the rate of two-phase heat transfer into, and out of, the ferroelectric layer 100 during cycling. Such a configuration in one embodiment is illustrated schematically by FIG. 4 where the ferroelectric layer, 1, has an electrode, 3, on each side, and an additional porous material is then applied to ensure that a sufficient amount of the fluid layer is present during thermal cycling to facilitate heat transfer as described herein. Such a surface may consist of a hydrophilic or hydrophobic surfactant, a porous membrane, or another surface configuration or material that causes an adequate fluid layer to remain during thermal cycling. The particular characteristics of such a fluid layer will depend on the specifics of the application, the nature and configuration of the ferroelectric layer 100, the specific working fluid, and other factors specific to a given application. In one embodiment, the surface treatment 2 depicted in FIG. 4, whether a porous membrane or otherwise, is applied beyond the electrode 3 to the end of the ferroelectric material 1 to minimize the possibility of electrical shorting.

In another embodiment, a polarizable material is affixed to a conductive strip; the second electrode is applied to the polarizable material; such other substances as may be desired and are applied (e.g., hydrophilic surfactants); and the strip is then shaped into a desirable geometry for thermal and electrical cycling as described herein. In one embodiment, the strip is so fabricated and then configured into, for example, a module that has the geometrical shape of a spiral. In such a shape, the separation of the adjacent coils of the spiral is sufficient to allow the working fluid to permeate the geometry so that thermal transfer occurs effectively on most or all of the available surface.

Figure 3:
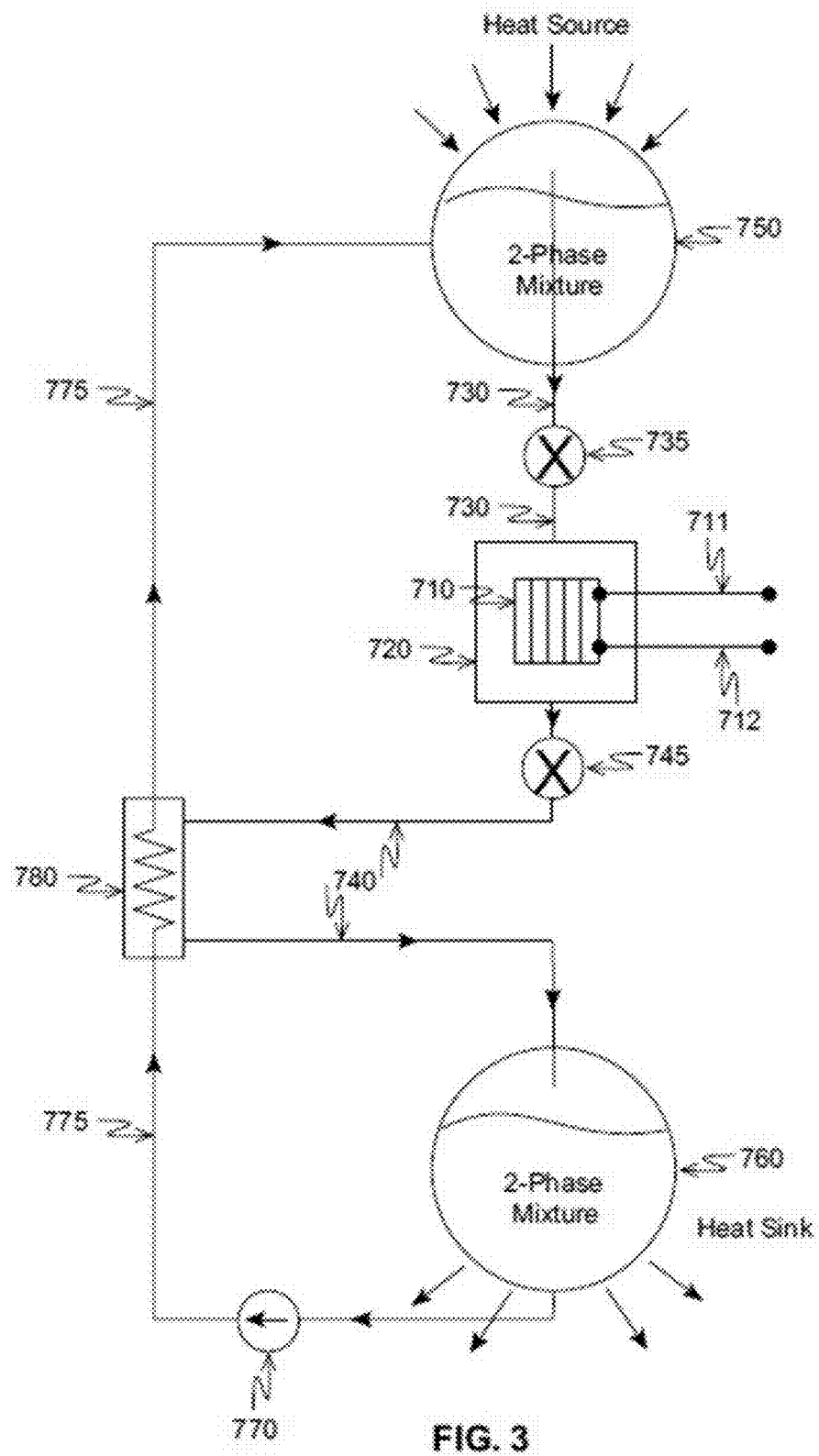
FIG. 3 is a schematic illustration of the basic components of a two-phase heat transfer and thermal cycling apparatus of the present invention similar to FIG. 2. The specific module that is the object of thermal cycling in this figure includes electrical leads that are connected to external circuitry.
Figure 8:
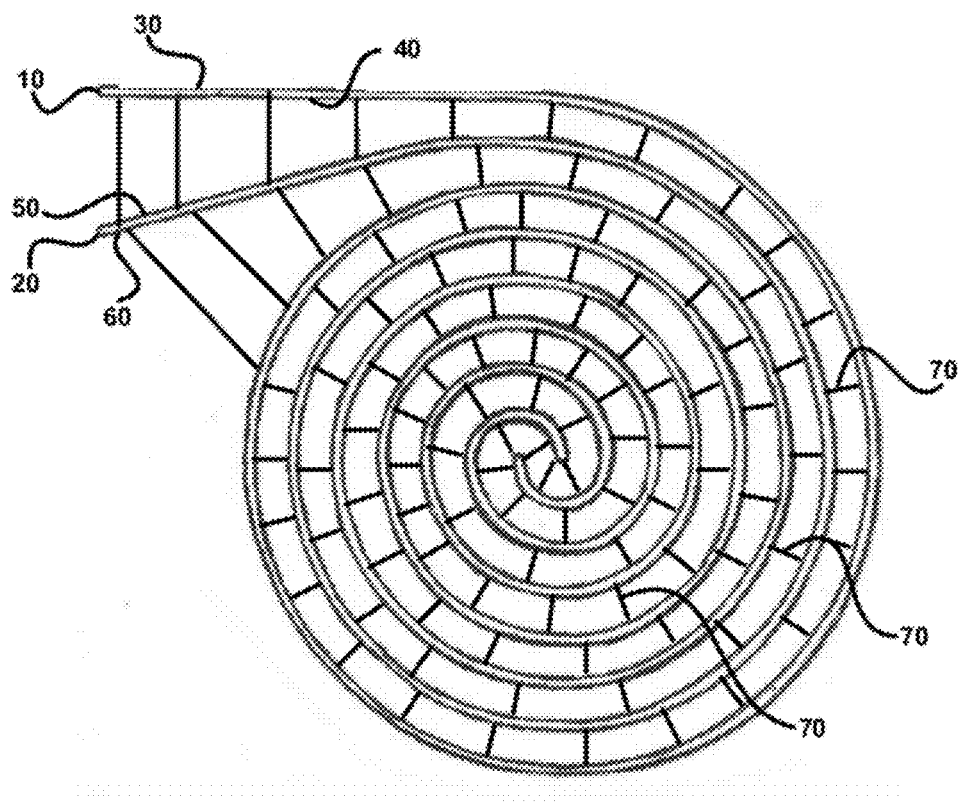
FIG. 8 illustrates one way of configuring a ferroelectric strip.

As illustrated in FIG. 8, in one embodiment two strips of polarizable material may be coiled more or less concentric to one another to configure the module 710 of FIG. 3. The polarizable material is represented by strips 10 and 20 in FIG. 8. Each layer of polarizable material 10 and 20 has an electrode on each of its surfaces as described herein, such electrodes being depicted as 30, 40, 50 and 60 in FIG. 8. Further, additional material layers (not shown) may be applied to the electrodes as described herein to maintain a liquid layer on the surfaces thereof to facilitate heat transfer to and from the module during evaporation and condensation of the working fluid in the chamber 720 of FIG. 1, 2, or 3. In one embodiment, the strips may be configured so that physically opposing electrodes, 40 and 50, for example, are at more or less the same voltage, thus minimizing the possibility of shorting between adjacent electrodes. In that embodiment, electrodes 40 and 50 of FIG. 8, for example, could either both be at low voltage or ground, and both electrodes 30 and 60 could be high voltage electrodes. In various embodiments, separators can be used to maintain a physical separation between adjacent strips. FIG. 8 includes an illustration of one kind of separator 70, but the separators may have varied geometries different than the example depicted in FIG. 8. For example, the separators can be insulating short pieces of thread or thin strips of kapton attached to the surface of the active strips, or appropriately embossed insulating thin sheets.

In one embodiment, the strip may be made, for example, of P(VDF-TrFE) copolymer with a thickness of about 100 μm. The width of the strip can vary substantially and can be as narrow as 10 μm an or as wide as 50 cm. Other dimensions can also be used with the invention. The length of the strip may also vary substantially, and can be as short as 1 cm or as long as 100 m, and other lengths can also be used with the invention. If formed into a spiral coil, the coil may consist of a few or many loops, such as 5 or more, and the diameter of the coil may be as small as less than a centimeter or as large as greater than a meter.

Additionally, the apparatus 100 in FIG. 12 includes means positioned in relation to the pair of electrodes 122 and 124 for alternately transferring heat 140 to and from the first surface 112 and the second surface 114 of the ferroelectric layer 110, so as to alternately cool the ferroelectric layer 110 at a first temperature $T_L$ that is lower than the transition temperature, and heat the ferroelectric layer 110 at a second temperature $T_H$ that is higher than the transition temperature. The ferroelectric material of the ferroelectric layer 110 thereby undergoes, with temperature cycling, alternating phase transitions between (1) the ferroelectric phase and (2) the paraelectric or antiferroelectric phase. The delivering means consists of the two-phase heat exchanger described herein. The reservoirs or heat exchangers 132 and 134 of FIG. 12 contain a two-phase working fluid mixture, the fluid in one embodiment being a dielectric, under two different respective pressures and temperatures, a higher temperature and pressure, $T_H$ and $P_H$, in reservoir 132, and a lower temperature and pressure, $T_H$ and $P_L$, in reservoir 134, such that the equilibrium vapor temperatures of the working fluid at pressures $P_H$ and $P_L$ are, respectively, $T_H$ and $T_L$. The vapor and liquid phases of the working fluid in each reservoir 132 and 134 are maintained in approximate equilibrium. As described herein, the vapor phase of the fluid in reservoirs 132 and 134 are alternately caused to be in direct communication, by operation of one or more valves, with one or both of the external surfaces of the ferroelectric layer, so that the ferroelectric material is alternately heated at $T_H$ and cooled at $T_L$ in accordance with the thermodynamic cycles described herein and in the patents and patent applications by Erbil et al. referenced hereinabove.

When the ferroelectric is in communication with the higher pressure reservoir 132, heat is rapidly transferred to the ferroelectric (and other materials that may be integral thereto, such as the electrodes) as condensing vapor delivers the latent heat of condensation. Conversely, when the ferroelectric is in communication with the lower pressure reservoir 134, heat is rapidly removed from the ferroelectric (and other materials that may be integral thereto, such as the electrodes) as liquid evaporates, thereby removing the latent heat of evaporation.

Thermal transfer into and out of the ferroelectric layer may be enhanced in one embodiment by applying a layer of hydrophilic (or hydrophobic depending on the fluid used) surfactant or a similar substance to one or both of the electrodes to facilitate condensation on the surface of the ferroelectric module during heating of the module, and to facilitate evaporation from the surface of the ferroelectric module cooling of the module. The variation of the pressure and the flow of the working fluid to achieve rapid thermal cycling of the ferroelectric module is controlled by a control circuit, as described herein, in conjunction with the electrical cycling of the ferroelectric. During cycling, working fluid in the vapor phase migrates from reservoir 132 to reservoir 134. The working fluid in its liquid phase is transferred back (not shown on FIG. 1) from reservoir 134 to reservoir 132. Further, heat is input to the reservoir/heat exchanger 132 from the heat source used with the device, and heat is withdrawn from the reservoir/heat exchanger 134 to the heat sink used with the device.

The apparatus 100 of FIG. 12 also has a pair of electric leads 152 and 154 electrically connected to the pair of electrodes 122 and 124, respectively. Poling the domains of the ferroelectric material enables a very large overall net spontaneous polarization to develop in the ferroelectric layer. That overall net spontaneous polarization in turn induces very dense electrically-opposite screening charges respectively on the pair of electrodes 122 and 124. The poling field can be established by an external DC voltage applied during each cycle, as described in U.S. Pat. Nos. 7,982,360 and 8,035,274, or by a residual charge on the electrodes that remains after the electrical discharge step of the cycle, as described in U.S. patent application Ser. No. 13/228,051. While a DC voltage thus need not normally be applied in that implementation of the invention, a DC voltage source should still be available to establish a poling field for the initial cycle and in the event the residual charge diminishes during operation below what is required to establish a poling field.

In one exemplary cycle, after the spontaneous polarization increases to a maximum value, the circuit is opened while the ferroelectric material of the ferroelectric layer 110 is heated to temperature $T_H$ through the addition of heat to the lattice, while total polarization remains constant at $P_H$ because the circuit is open to prevent discharge of the charges on the electrodes. The circuit is then closed while heat is added to the ferroelectric layer isothermally, causing the electrically-opposite screening charges to discharge to the pair of electric leads 152 and 154 at a high voltage. The pair of electric leads 152 and 154 permits the conduction of the discharge current from the electrodes to whatever external load may be used or to busses to collect and distribute the electricity generated by multiple devices.

Figure 31:
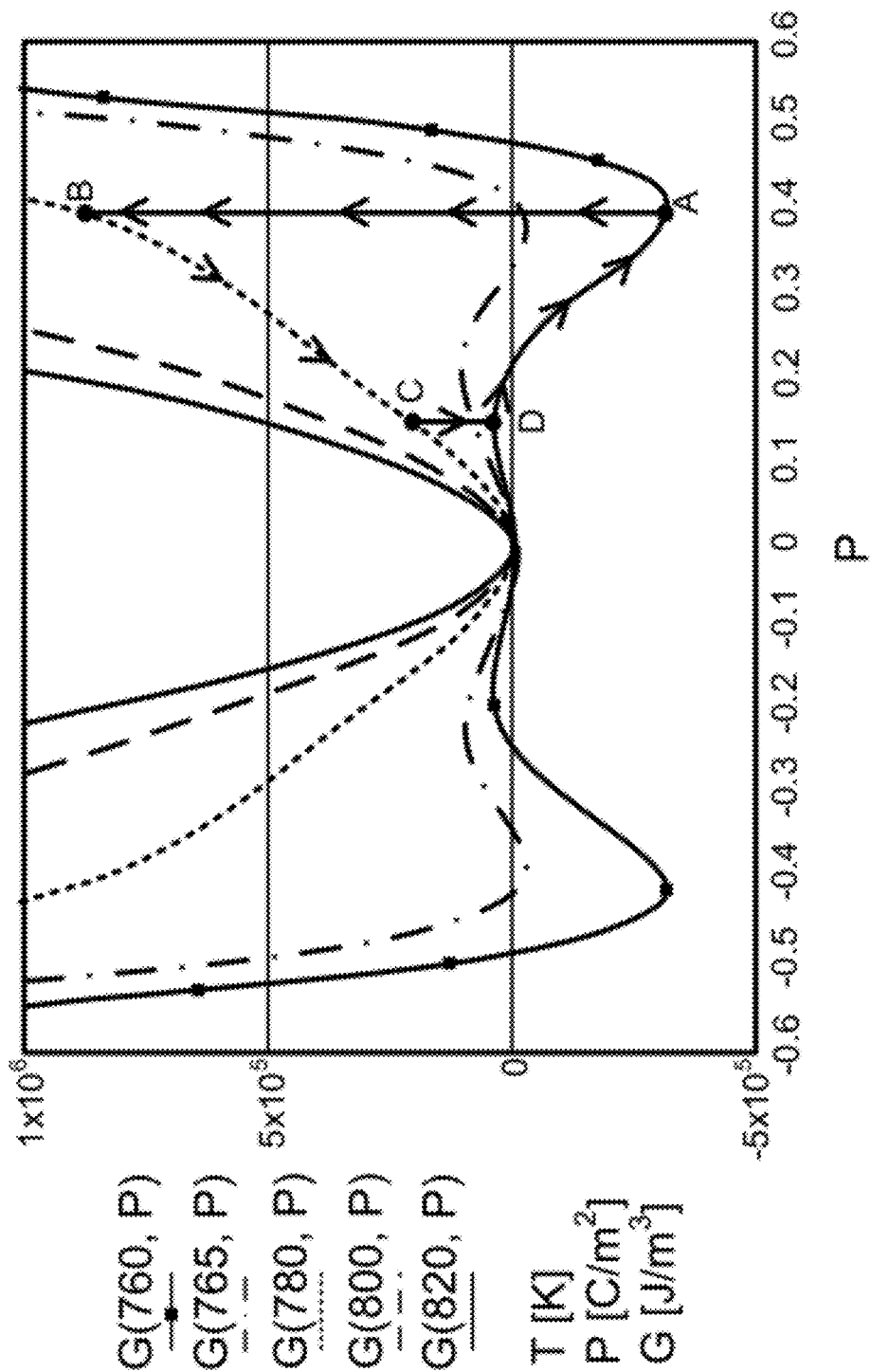
FIG. 31 is a plot of free energy for various temperature values as a function of polarization. Superimposed on the plot are the steps of a thermodynamic cycle that can be used with the invention. This cycle provides for poling by an internally generated poling field. During the electrical discharge step of the cycle, BC, sufficient charge is retained to pole during the next cycle. The value of $P_L$ is determined by the value of P that occurs at the local free energy maximum for the cycle.
Figure 32:
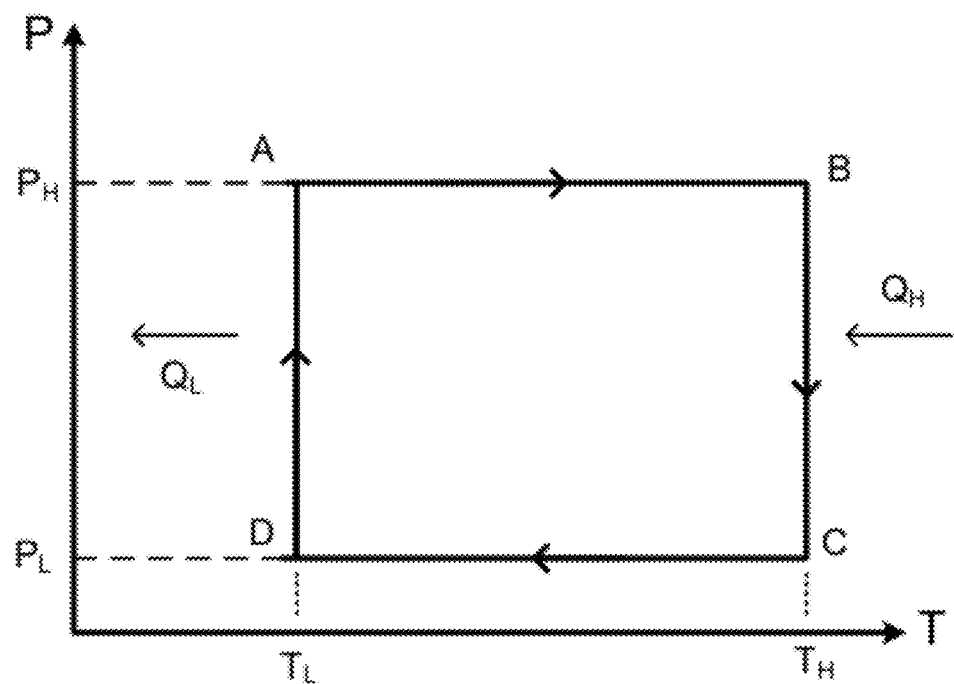
FIG. 32 is an illustration of a thermodynamic cycle of a ferroelectric wherein two steps are isothermal and two are iso-polarization. QL and QH indicate the removal and addition of heat, respectively, during the isothermal steps.

When poling is achieved by the field that results from the residual unscreened charges on the electrodes 122 and 124, a current will flow between those electrodes in response to the change in net spontaneous polarization that occurs in the ferroelectric layer. That current can be exploited as an additional source of electrical energy output to the external load. That energy output is represented by the downhill relaxation between points D and A in the free energy plot of the $T_L$ isotherm shown in FIG. 31. This occurs at $T_L$ as $Q_L$ is being removed from the ferroelectric layer. In one embodiment, the direction of the current during the DA portion of the cycle can be made to coincide with the direction of the current during the primary discharge (step BC as depicted in FIG. 32 and described elsewhere) by causing the current during the DA step to pass through a full-wave rectifier (not shown) that is also included in the circuit when the switch S1 is in position B in FIG. 17. Such a rectifier may, for example, be a bridge circuit. The rectifier causes current flows to and from the electrodes 822 and 824 to have the same direction at the load RL whether the current occurs during the BC or DA steps of the cycle.

Figure 13:
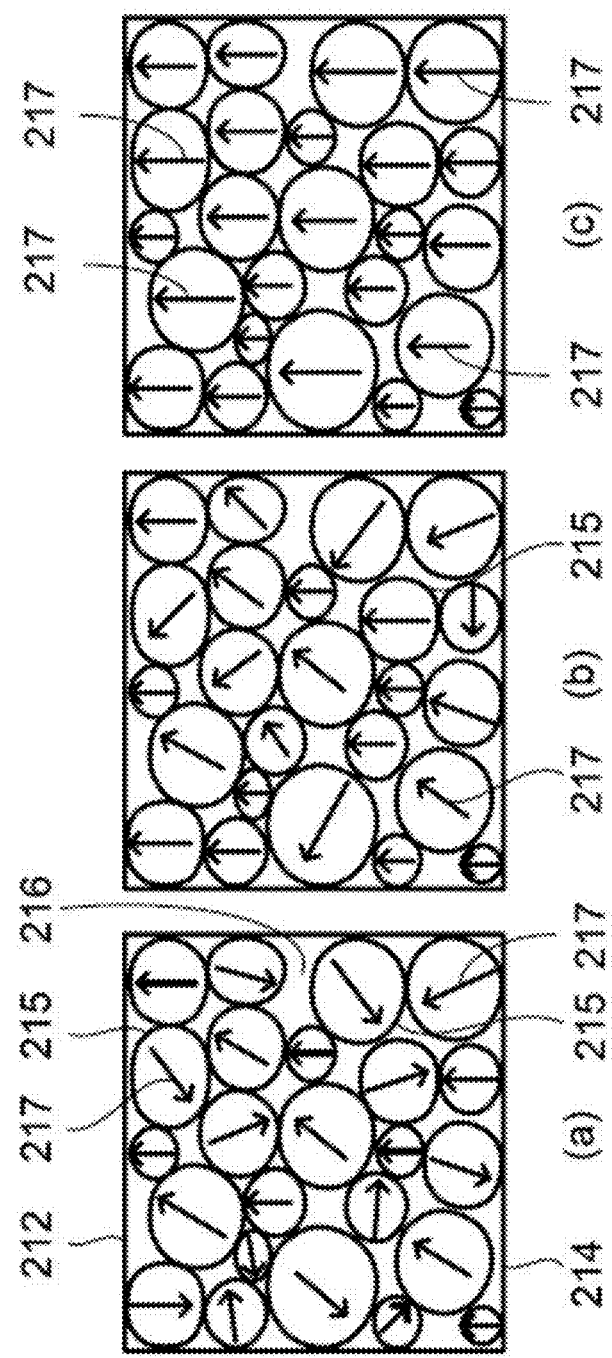
FIG. 13 illustrates schematically the alignment of the domains in a ferroelectric where (a) illustrates unpoled, random orientation, with each domain consisting of a large number of electric dipoles that would be similarly oriented within that individual domain; (b) illustrates a substantially poled material where the dipoles are oriented in the same overall direction; and (c) illustrates an ideal, completely poled ferroelectric that is generally attained only under special-conditions pertaining to the atomic and molecular structure of the material.

FIG. 13 shows schematically the alignment of the domains 215 in a ferroelectric in the ferroelectric phase, i.e., the temperature of the ferroelectric is lower than the Curie temperature $T_c$ of the ferroelectric. The ferroelectric has a first surface 212 and an opposite, second surface 214 defining a ferroelectric layer body 216 there between. The ferroelectric layer body 216 is characterized with a plurality of domains 215 having a large number of polarizable units. As shown in FIG. 13(a), each domain 215 is characterized by a spontaneous polarization indicated by a dipole arrow 217, but randomly orientated so that there is no overall net spontaneous polarization in the ferroelectric. FIG. 13(b) shows the dipoles 217 aligned towards the same overall direction, so that a very powerful net spontaneous polarization exists in the ferroelectric. Such alignment can be achieved by applying a poling field to the ferroelectric layer body 216. FIG. 13(c) illustrates an ideally aligned ferroelectric that generally is attained only under special conditions pertaining to the crystal or molecular structure of the material.

The electrical energy that can be extracted by exploiting changes in spontaneous polarization during thermal cycling of a given ferroelectric can be calculated from the Landau phenomenological model of material systems in and around phase change. Such modeling is a more comprehensive thermodynamic representation of the system than traditional quasi-static thermodynamic analysis. The latter is effectively restricted to equilibrium conditions, whereas Landau modeling is a broader dynamic representation that includes non-equilibrium conditions, such as relaxation from a metastable state towards a more stable state pursuant to the Landau-Khalatnikov equation. For ordinary ferroelectrics, the Landau-Ginzburg-Devonshire free energy functional expresses the free energy of a ferroelectric material system in terms of the independent parameters temperature, T, and the order parameter, P, which represents the total polarization produced by the dipoles in the system, both spontaneous and induced if there is an electric field. An electric field may be due to the application of an extrinsic potential across the electrodes or it may be due to the unscreened charges on the electrodes. The Landau-Ginzburg-Devonshire free energy functional is expressed as:

$$G(T, P) = \alpha_1(T) \cdot P^2 + \alpha_{11} \cdot P^4 + \alpha_{111} \cdot P^6$$

where G is the free energy functional. G is in units of J/m$^3$, and P is in units of C/m$^2$. Polarization is a full thermodynamic variable, and it represents the full polar system described by G(T, P). The α parameters are specific to a given material system, and for those given parameters, the Landau-Ginzburg-Devonshire free energy functional provides the full information for the thermal cycles of a ferroelectric material system through and around phase transition, and for polarizable polymer systems through and around their depolarization transitions.

Figure 26:
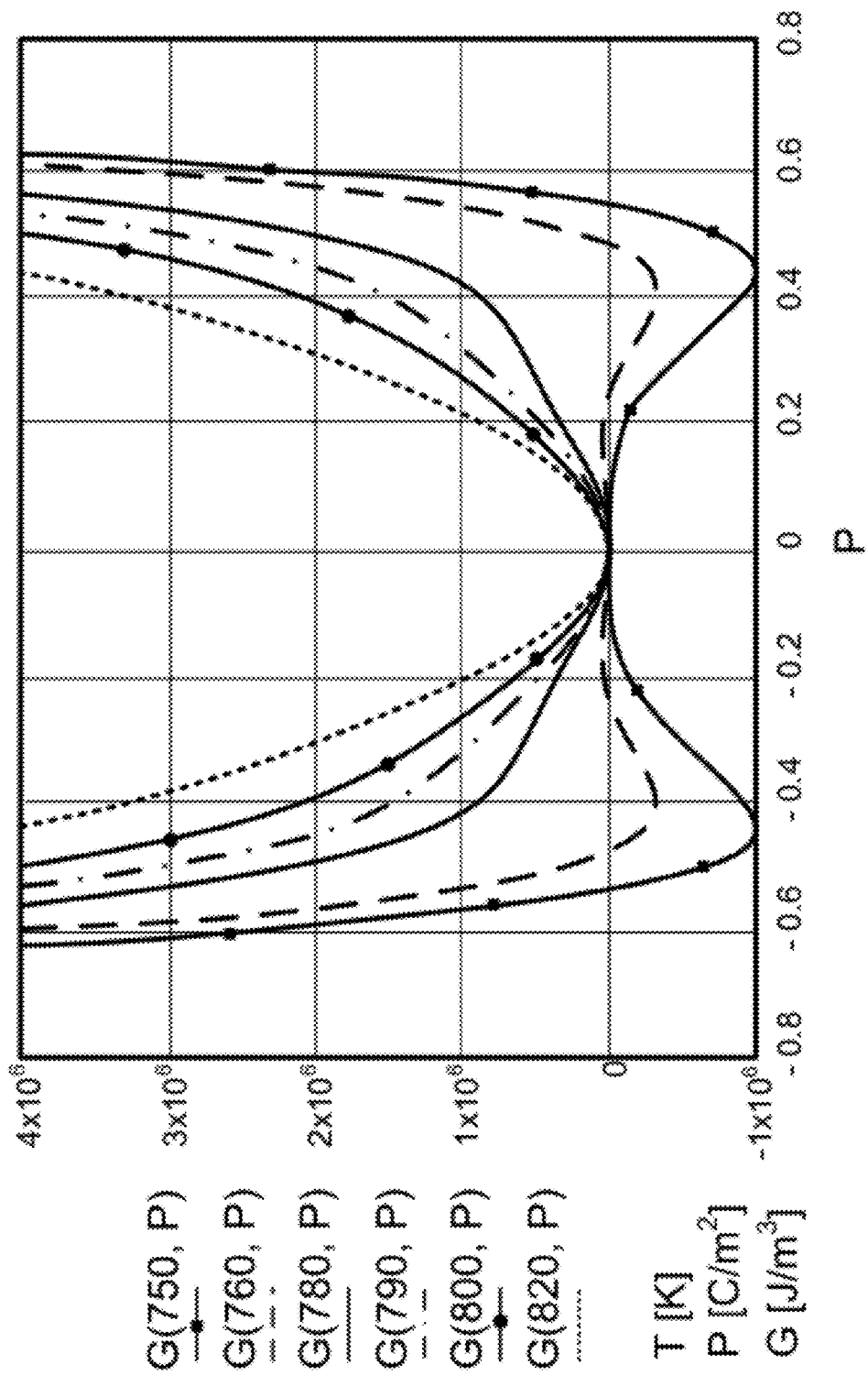
FIG. 26 is a plot of the free energy functional in terms of temperature, T, and polarization, P, using parameters for a sample of lead titanate, $PbTiO_3$. G is the Gibbs free energy. Temperature is measured in Kelvin; polarization in $C/m^2$; and the free energy, G, in $J/m^3$. Polarization is a full thermodynamic variable, and it represents the full polar system described by G(T, P).

FIG. 26 is an example of plots of the free energy functional in terms of temperature, T, and polarization, P, with the material parameters representative of a sample of lead titanate, PbTiO$_3$, with T$_c$≈766K. The individual plots are for various temperatures of the material. The free energy value, G, is measured in J/m$^3$. G is assigned the value of 0 when the material is in a nonpolar state (i.e., where P=0). The free energy, G, is then plotted as calculated from the Landau-Ginzburg-Devonshire functional for various temperature values from 750K to 820K. For temperatures above the transition temperature, the free energy is never below the reference value assigned for the material in the paraelectric state. The global minima in the various plots represent equilibrium states.

Where a material is in its ferroelectric phase, the system will have two free energy minima, one at each of the low points of the two wells. Each of those equilibrium points is equally likely in the absence of a field, and the decrease in free energy is the same in both wells because the material system is symmetrical. By poling the dipoles as the material system enters the ferroelectric phase, the system is biased so that the system will drop down into the particular well that corresponds to the poled orientation. Poling does not materially affect the free energy of the system.

Figure 27:
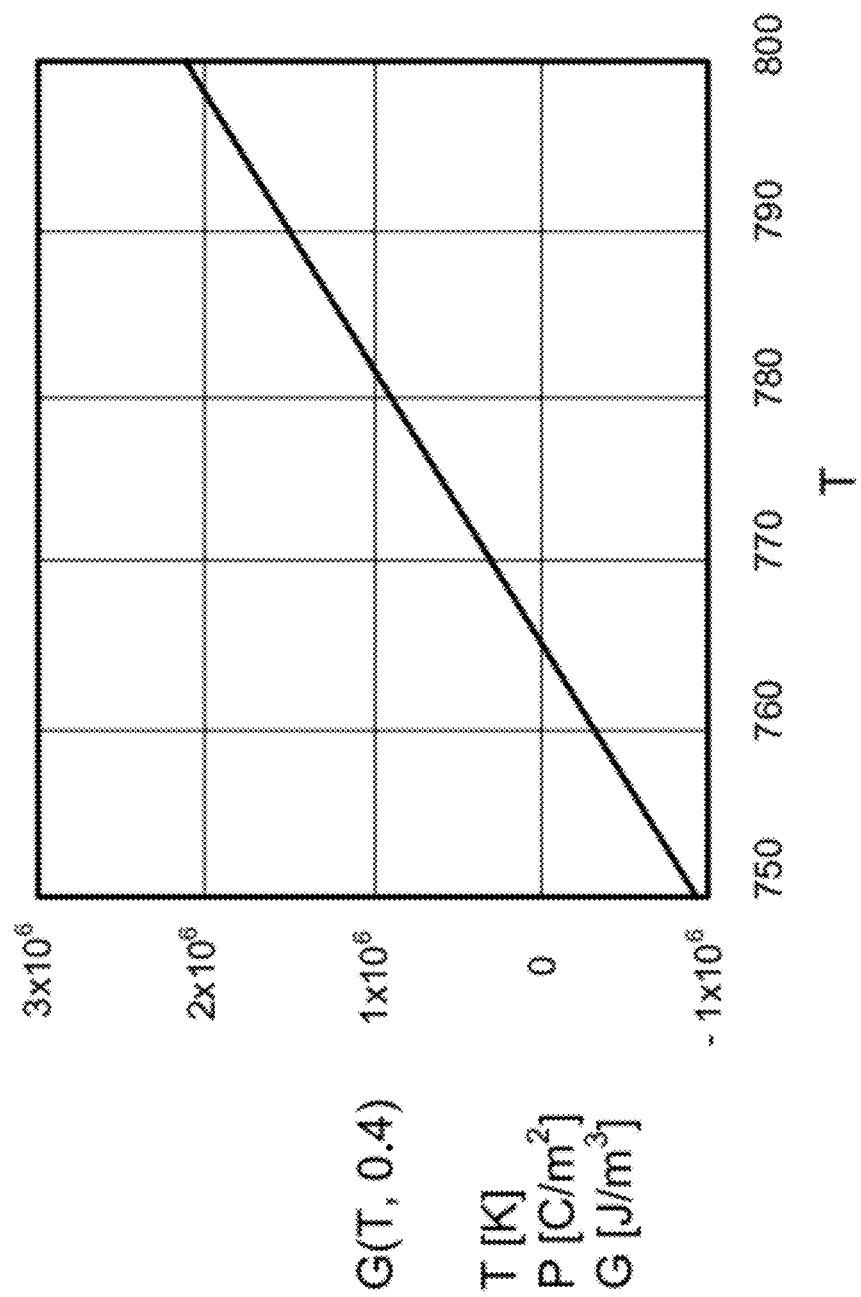
FIG. 27 is a plot of free energy as a function of temperature for a sample of lead titanate, $PbTiO_3$. Polarization is constant at $P=0.4 \ C/m^2$.

FIG. 27 is a plot of free energy as a function of temperature where polarization is held constant at 0.4 C/m$^2$. Again, the parameters used in plotting the free energy functional are those characteristic of a sample of lead titanate with T$_c$≈766K. This linear relationship between free energy and temperature can be a consideration in determining the appropriate thermodynamic cycling of the ferroelectric material used in the invention. FIG. 27 indicates that it may be desirable in some instances to cycle the ferroelectric over a wide temperature range since the change in free energy increases as the temperature range of the cycle increases. Ideally, this can be performed as a perfect Carnot engine providing the highest possible efficiency. The thermal efficiency realized by cycling over the wider temperature range may decrease, however, because of increased lattice heat contribution for the wider temperature cycling if a perfect regeneration cannot be performed. It should also be recognized that the accuracy of the Landau-Ginzburg-Devonshire model generally decreases as temperature departs farther from the phase change temperature, so the linear relationship may not be as accurate over large temperature ranges.

Figure 28:
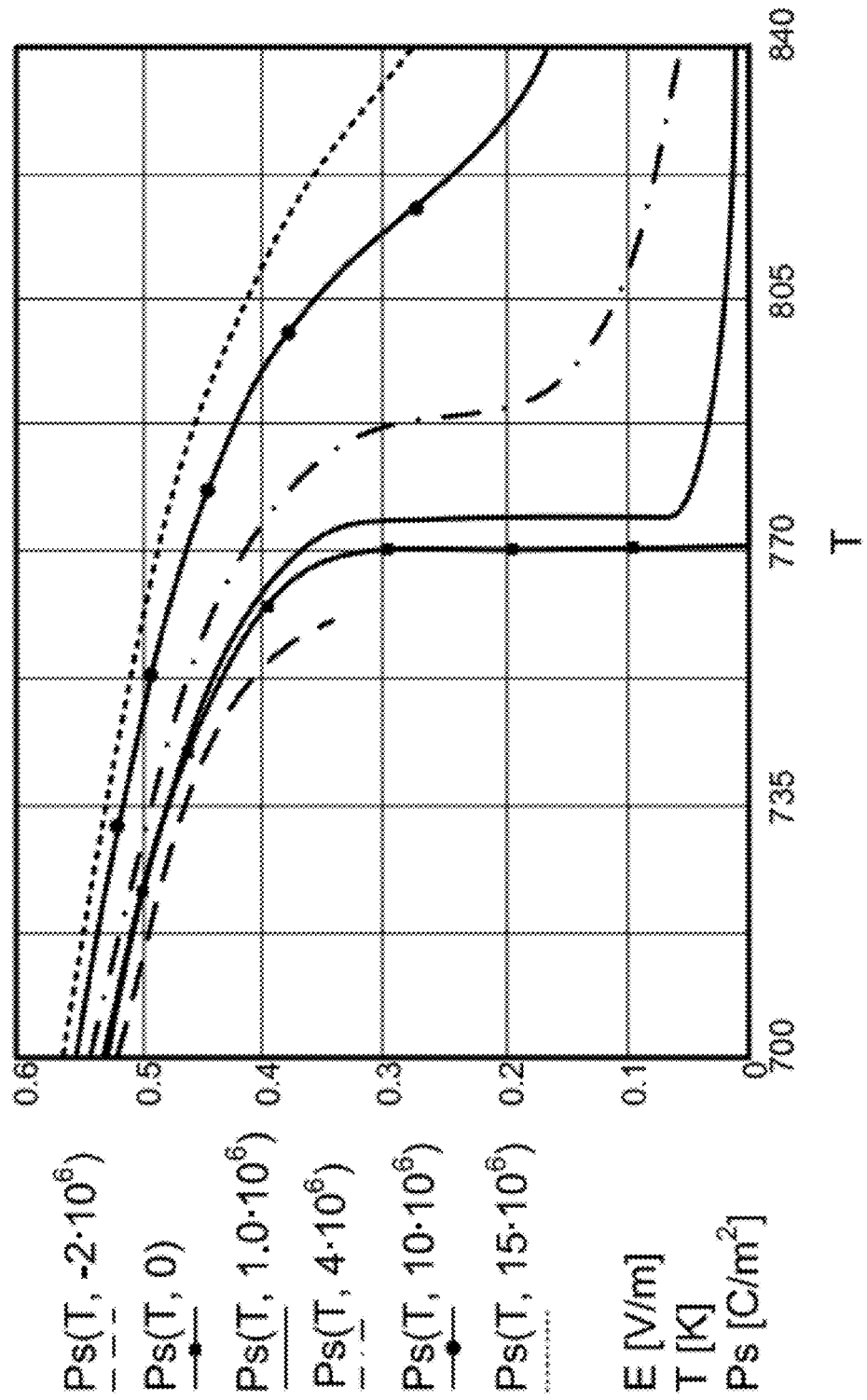
FIG. 28 is a plot of polarization at various electric field values, E. Temperature is measured in Kelvin, and the E field value is in volts per meter.

FIG. 28 presents plots of polarization versus temperature for various electric field values for the same lead titanate parameters. The relationship between E; free energy, G; P; and T, is derived from the free energy functional and can be expressed as:

$$E = \partial G / \partial P = 2\alpha_1(T)P + 4\alpha_{11}P^3 + 6\alpha_{111}P^5.$$

With the present invention, the E values represent the field generated by the unscreened charges on the electrodes. The electric field value E can also include a small poling field applied from a DC voltage source in the event an external poling field is applied.

Figure 29:
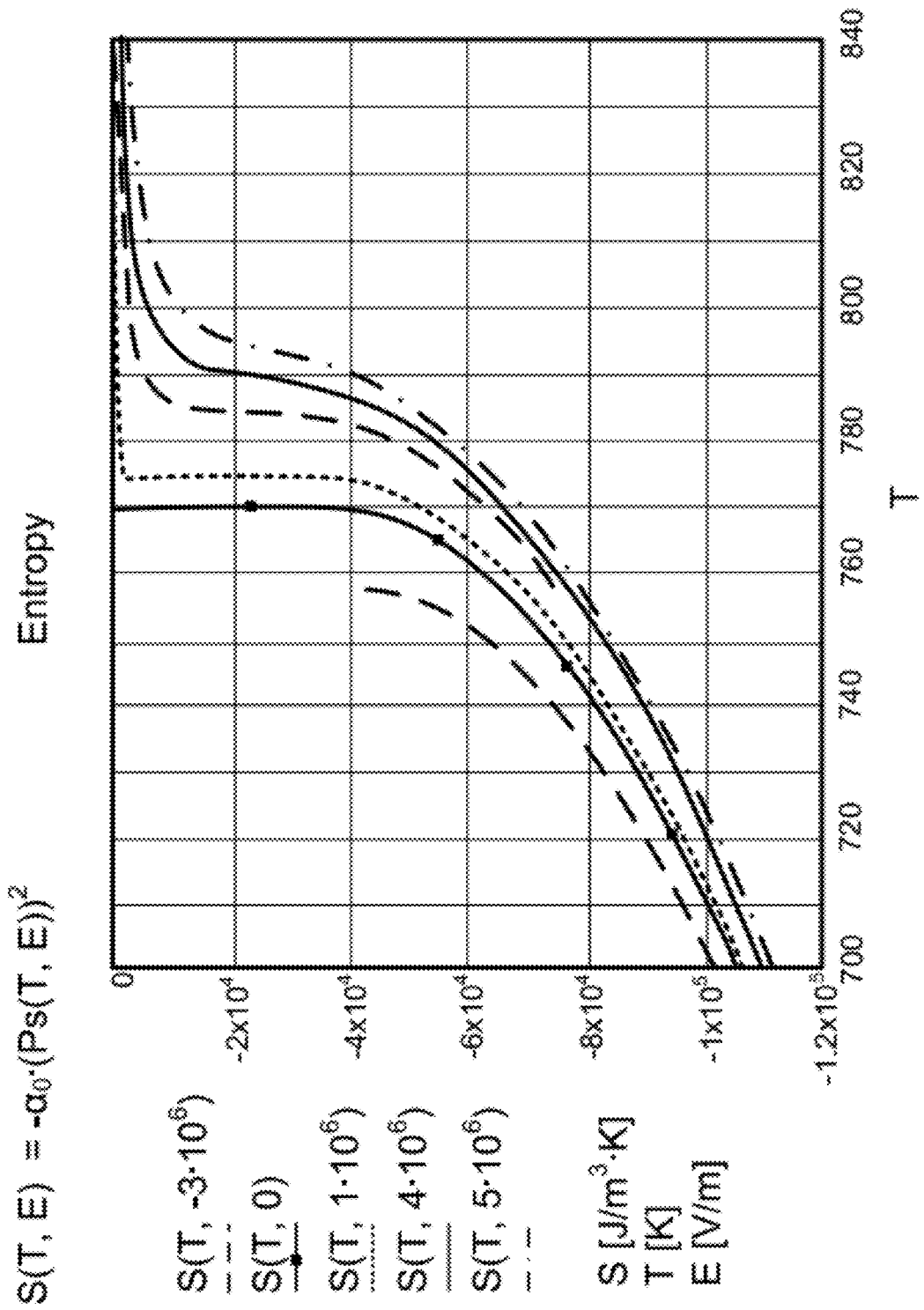
FIG. 29 is a plot of entropy for a sample of lead titanate, $PbTiO_3$, as a function of temperature for various E field values. Temperature is measured in K, and entropy is measured in units of $J/m^3 \cdot K$.

FIG. 29 is a plot of entropy, S, as a function of temperature for various E values where the parameter E is measured in volts per meter. Entropy is proportional to P$^2$, and $$S = -\alpha_0 \cdot [P_s(T, E)]^2$$

where entropy is measured in J/(m$^3$·K). The parameter α$_0$ is related to the material parameters by the expression $$\alpha_1 = \alpha_0(T - T_0),$$

where T$_0$ is the Curie-Weiss temperature, which is the phase transition temperature for materials that have second order phase transitions, but has a different value for first order transition materials.

The invention can be practiced pursuant to various thermodynamic-electrical cycles, and the examples of cycles herein is illustrative only and in no way limits the scope and meaning of the invention. An example of one such thermodynamic cycle that can be used with the present invention is depicted in FIG. 32 in an ideal form. It has two isothermal steps, BC and DA, and two steps where polarization is held constant, AB and CD. The specific operation of this cycle is described in more detail herein.

In some thermodynamic cycles, the discharge of the electrodes to an external load during the course of the cycle may be complete or nearly complete. With other cycles, the discharge of the electrodes is not complete. Instead, a small unscreened residual charge is left remaining on the electrodes before discharge is complete, and that residual charge serves to pole the material during the next cycle. Other than as necessary to provide a poling field, it is generally desirable to allow for removal of the charges from the electrodes so as to maximize the amount of electrical energy withdrawn during that step of the cycle. The amount of the residual charge left remaining, corresponding to $P_L$, that is sufficient to establish a field to pole the spontaneous electric dipoles during transition into the ferroelectric phase will depend on the material system, the configuration of the ferroelectric layer, and other factors. The impedances of the system and the load must be matched so that the depolarization field does not exceed the coercive field at any time after the external poling field is turned off. The value of $P_L$ is determined by the value of P that occurs at the local free energy maximum for the cycle. In one embodiment using an exemplary cycle described herein, that local free energy maximum is depicted as point D on the free energy isotherm in FIG. 31. By way of example, for a ferroelectric sample of $PbTiO_3$, $P_L \approx 0.15\ C/m^2$ generally creates an adequate poling field, as indicated in FIG. 31. The invention can also be practiced by letting $P_L$ go to zero, with subsequent poling performed by applying an external field during the DA step of the cycle.

Starting at an arbitrary point C of the specific cycle illustrated by FIG. 32, the material is at a relatively high temperature, $T_H$, and in a paraelectric or antiferroelectric phase. In one embodiment, the electrodes on the surfaces of the ferroelectric have discharged at point C so that only enough residual charge remains on the electrodes to provide a field sufficient to pole the ferroelectric when it is cycled back into its ferroelectric phase. Then, during the CD step of the cycle, the ferroelectric is cooled to a relatively low temperature, $T_L$, while the electrical circuit is open so that total polarization remains constant at the minimum value, $P_L$. The heat withdrawn during the CD step corresponds to the sensible lattice heat to cool the material. During step CD, the ferroelectric material goes from point C to a metastable state at point D.

Figure 30:
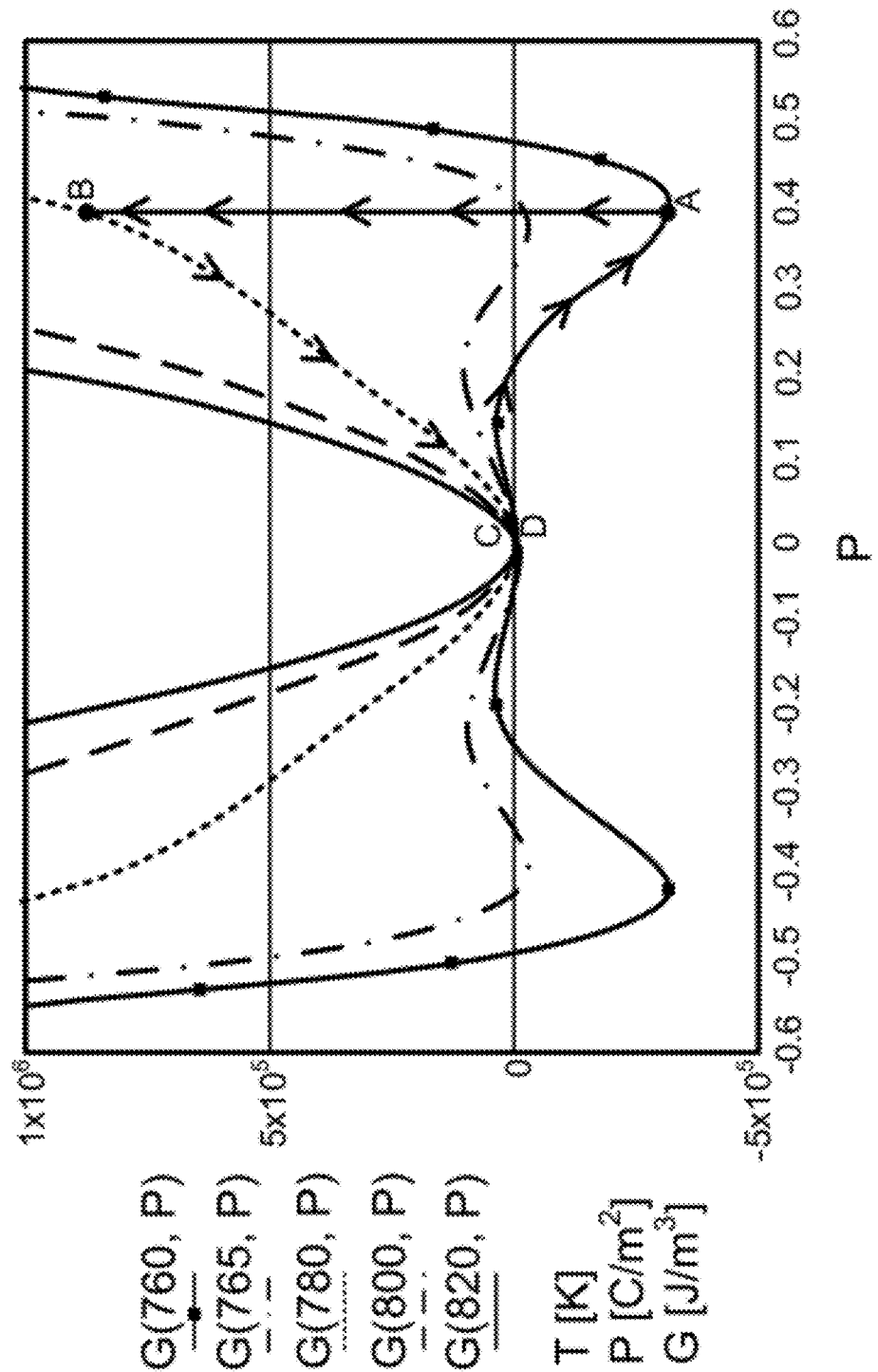
FIG. 30 is a plot of free energy for various temperature values as a function of polarization. Superimposed on the plot are the steps of one thermodynamic cycle that can be used with the present invention. Polarization is a full thermodynamic variable, and it represents the full polar system described by G(T, P).

The circuit is closed at point D of the cycle. During the DA step, heat $Q_L$ is withdrawn isothermally while the ferroelectric is at $T_L$ until the spontaneous polarization attains the maximum value, $P_H$. That value of $P_H$ may be as great as is permitted by the particular ferroelectric material system without causing electrical breakdown or significant electrical leakage through the ferroelectric layer. All other things being equal, attaining high $P_H$ values will generally correspond to larger output of electrical energy in each cycle. $P_H$ will vary depending upon the ferroelectric material system, the configuration of the ferroelectric layer and other factors. In the illustrative case of a lead titanate sample, $P_H$ may have a value of $0.4\ C/m^2$ as shown in FIGS. 30 and 31.

During the DA step, the electrical circuit is closed and a current flows from the electrode on one side of the ferroelectric to the electrode on the opposite side of the ferroelectric until screening charges develop that equal the opposing bound charges on the surfaces of the ferroelectric. Also during the DA step of the cycle, the small residual field resulting from the unscreened charges on the electrodes at point D causes the resulting dipoles to be oriented towards one direction—i.e., they are poled. In another embodiment, the poling field can be the result of an externally applied potential. The heat $Q_L$ withdrawn during the DA step corresponds to the latent heat of the phase transition. During the DA step, the material system relaxes from a metastable state at point D to a stable state at point A, as shown in FIGS. 31 and 32.

During the DA step, electric energy is generated in those embodiments where poling is done other than by an externally applied voltage. The energy so generated during step DA can be discharged into external circuitry to perform electrical work. In one embodiment, a full-wave rectifier can be utilized to rectify the current flows to and from the electrodes 822 and 824 to have the same direction at the load whether the current occurs during the BC or DA steps of the cycle. Such a full-wave rectifier may consist, for example, of a bridge circuit. As noted elsewhere, poling may also be achieved by applying an external field from a DC voltage source across the electrodes on the surfaces on the ferroelectric layer. On those occasions, electrical work is performed on the system rather than generated by the system during step DA.

In the next step of the cycle, AB, the circuit is open and the ferroelectric is heated to $T_H$ above the material transition temperature at constant polarization. At point B of the cycle, the ferroelectric is in a metastable state, and the circuit is then closed. During the BC step of the cycle, heat is input isothermally as polarization is reduced to $P_L$ and the ferroelectric relaxes from the metastable state at point B towards point C. The heat $Q_H$ added during the BC step is equal to the enthalpy change that corresponds to the change in polarization. During that step, screened charges on the electrodes become unscreened and are discharged into external circuitry to perform electrical work, total polarization at point C being reduced to $P_L$ at which point the circuit is opened to prevent further discharge.

The transitions of the material system from a stable state to a metastable state or vice versa during the several steps of the cycle are described by Landau-Khalatnikov time dependent phase transition theory, which can be used to match the response time of the load to the transition time from the metastable state.

$T_H$ and $T_L$ are above and below the transition temperature, respectively, so as to allow for phase change. Depending upon characteristics of the material, such as the homogeneity of the crystal structure, for example, $T_H$ and $T_L$ may differ from the transition temperature by a few degrees centigrade or less. $T_H$ and $T_L$ may also differ from the transition temperature by a substantial amount, for example, by 20 degrees centigrade or more. In another implementation $T_H$ and $T_L$ can both be below the transition temperature, if the material is cycled between a greater polarization value and a lesser polarization value.

It will be recognized by persons skilled in the art that the cycle illustrated in FIG. 32 depicts a cycle performing in an ideal fashion. In practice, there generally may be deviations from ideal or perfect isothermal or constant polarization steps of the cycle and deviations from perfect cycling between $P_H$ and $P_L$. It should be recognized that the invention will generally be practiced such that the actual cycling and actual poling may depart to some degree from the ideal.

In some embodiments of the invention the ferroelectric phase occurs at a temperature higher than the transition temperature, and the paraelectric phase, or antiferroelectric phase, occurs below the transition temperature. In such embodiments, the cycle depicted in FIG. 32 operates the same except in the opposite direction. The four steps are DC, CB, BA, and AD. Steps DC and BA occur at constant polarization, $P_L$ and $P_H$, respectively. Only lattice heat is input and withdrawn, respectively, during steps DC and BA. Heat QH is input isothermally during step CB, and heat $Q_L$ is withdrawn isothermally during step AD. During step CB, the electrical circuit is closed; poling with a DC voltage or an internally generated field occurs; and a current flows from the electrode on one side of the ferroelectric to the electrode on the opposite side until screening charges develop that equal the opposing bound charges on the surfaces of the ferroelectric. The electrical circuit is closed and electricity is discharged to a load during step AD.

The robustness of a particular thermodynamic cycle can be evaluated using values calculated from the free energy functional. FIGS. 30 and 31, like FIG. 26, are examples of plots of the free energy functional in terms of temperature, T, and polarization, P, with the material parameters representative of a sample of lead titanate, $PbTiO_3$, where $T_c \approx 766K$. The individual plots are for various temperatures of the material. FIG. 30 includes designations of the points of the cycle (A, B, C and D) depicted in FIG. 32 with two isothermal steps and two steps where polarization is constant. In FIG. 30, $P_L$ is reduced to a negligible level or zero during the course of the cycle. FIG. 31 is a similar plot of free energy for the cycle depicted in FIG. 32 with the points of the cycle designated thereon, but $P_L$ is not allowed to go to zero. Instead, during the electrical discharge step of the cycle, BC, sufficient charge is retained to pole during the next cycle. The value of $P_L$ is determined by the value of P that occurs at the local free energy maximum for the cycle, as shown on FIG. 31. The values for T and P in FIGS. 29, 30, and 31 are illustrative only and are not intended to suggest that they are ideal or unique.

Figure 33:
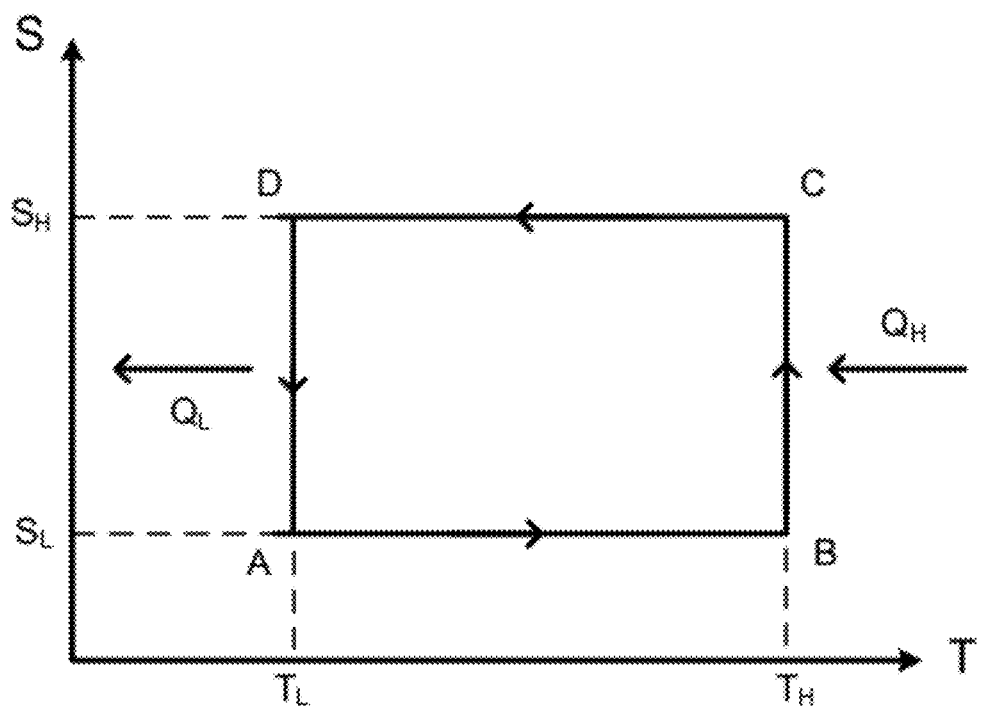
FIG. 33 illustrates entropy as a function of temperature for the cycle depicted in FIG. 32. Only the polarization contribution to free energy is considered. Other degrees of freedom, such as lattice heat and polymer backbones, are disregarded.

FIG. 33 illustrates entropy as a function of temperature for the cycle depicted in FIG. 32. Only the polarization contribution to free energy is considered. Other possible degrees of freedom that could contribute to entropy changes, such as lattice heat and polymer backbones, are disregarded in the illustration. Where those other factors are negligible, the cycle is isentropic even in the absence of regeneration during steps AB and CD.

Figure 34:
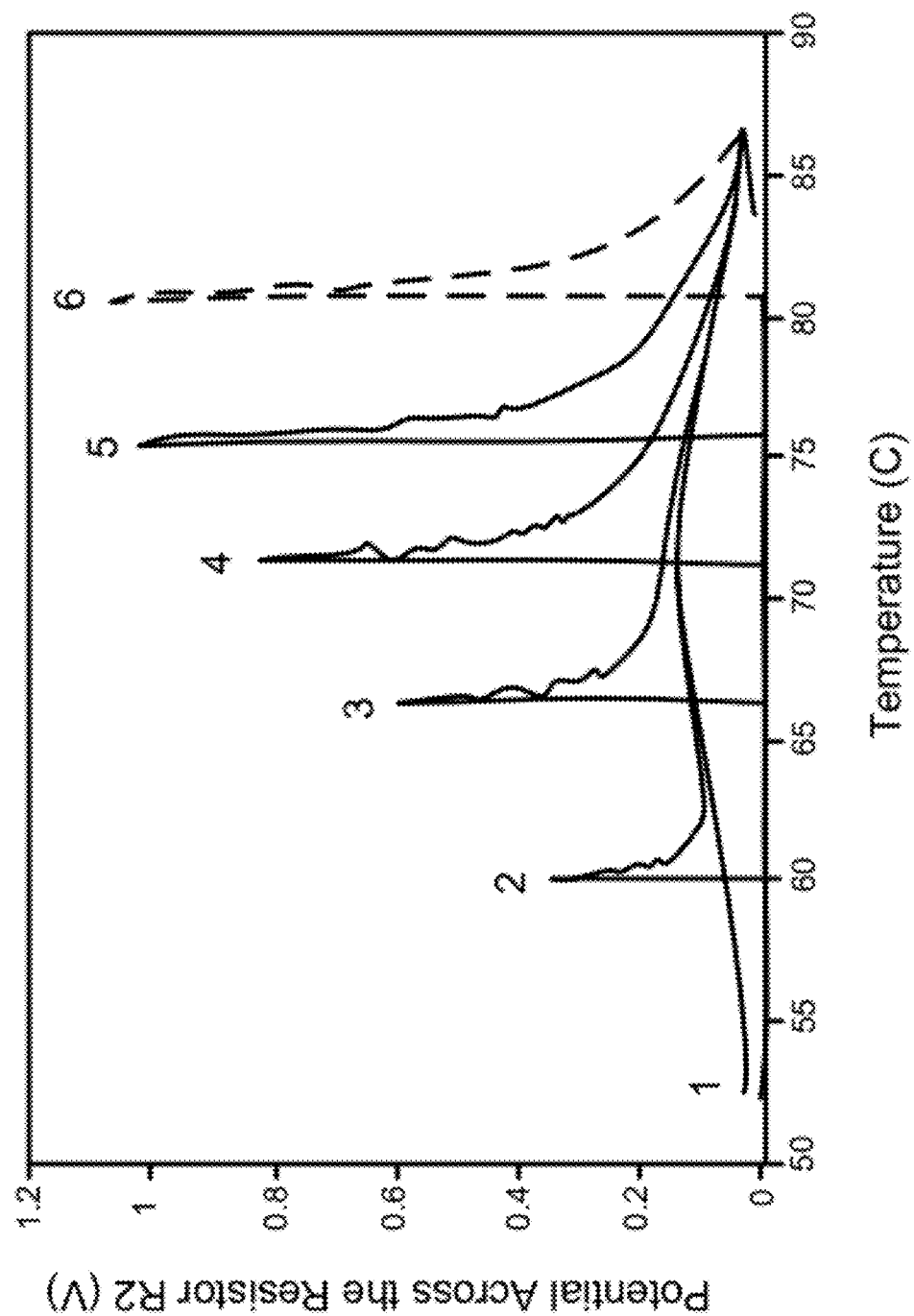
FIG. 34 shows the measured electric current generation during the heating phases, resulting from changes in the permanent polarization that correspond to different relay turn-on temperatures for a P(VDF-TrFE) copolymer film of 50 μm thickness.

FIG. 34 shows the measured electric current generated during the heating phases resulting from the change in permanent polarization that correspond to different relay turn-on temperatures for a P(VDF-TrFE) copolymer film of 50 μm thickness. The load resistor RL had a resistance of 10 MΩ, and the measure resistors R1 and R2 were chosen at 0 and 22 kΩ, respectively. The horizontal axis has been largely expanded due to the somewhat broad transition of the copolymer, which makes the original peak (line 1) look flat. Lines 2-6 in FIG. 34 show the electricity generated with increasing delay temperature (time). These lines correspond to the AB step in the thermodynamic cycle shown in FIG. 32. The electric potential (field) generated across the sample dramatically increases with larger delay temperatures, reaching about 10 times the potential attained with the original peak of line 1. The increasing potential with larger delay temperature corresponds to the enlargement of the rectangular cycle along the temperature axis at constant polarization (AB step). Thermodynamically, this leads to a larger efficiency. The integrated intensities remain largely constant, as expected.

Figure 14:
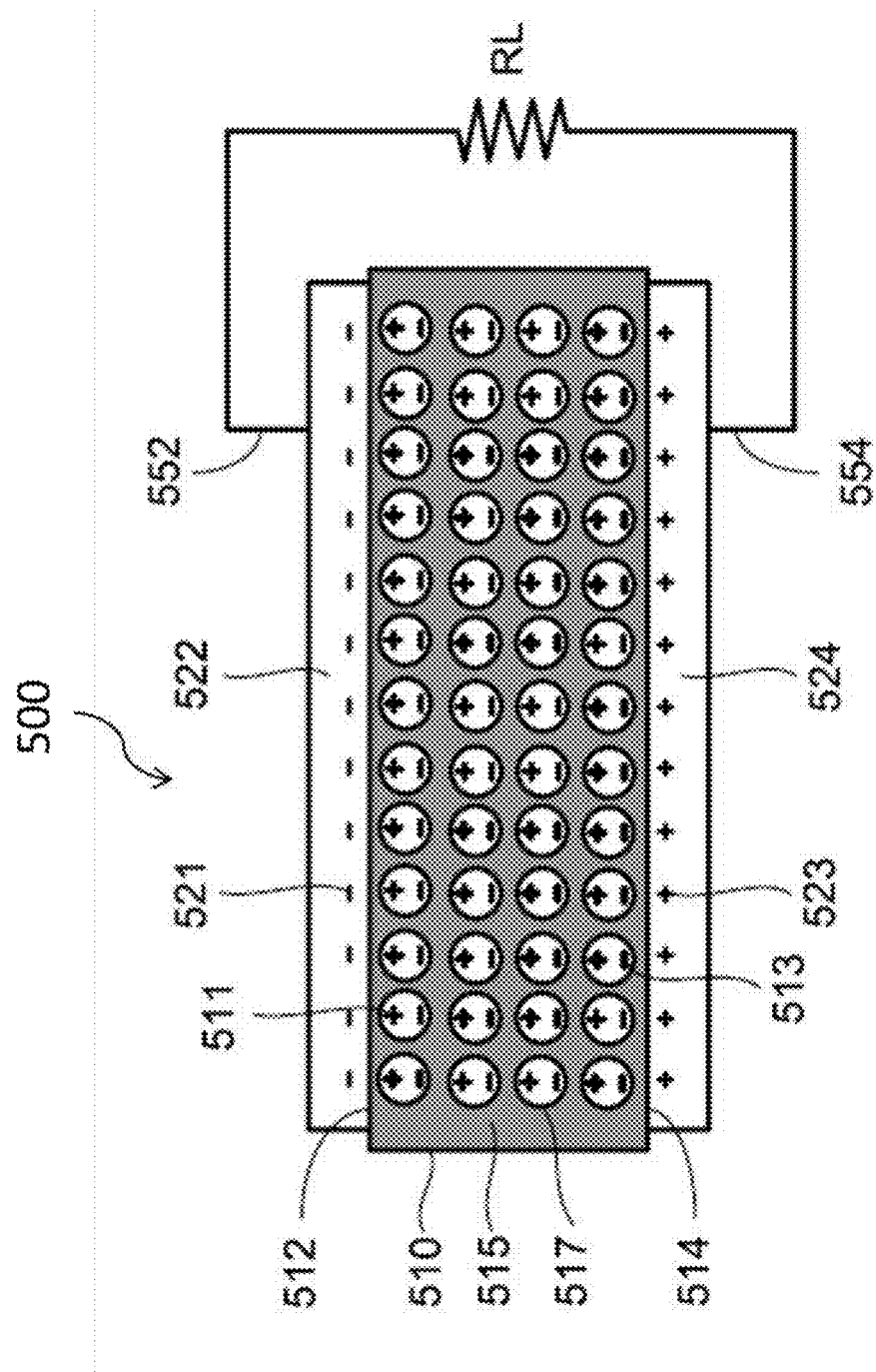
FIG. 14 illustrates schematically bound charges on the surfaces of a ferroelectric structure/layer and the opposing screening charges that are induced on the adjacent surfaces of the electrodes when there is substantial net spontaneous polarization, $P_s$, which may be denoted as $P_r$ in the absence of an external field.

FIG. 14 shows schematically a ferroelectric module 500 in the ferroelectric phase with bound surface charges generated on the surfaces of the ferroelectric layer 510 and corresponding screening charges generated on the electrodes 522 and 524. In the exemplary embodiment, the electric dipoles 517 are aligned, for example, by a small poling field, thereby enabling a large overall net spontaneous polarization to occur in the ferroelectric layer 510. The resulting large net spontaneous polarization produces very dense bound charges 511 and 513 on the surfaces 512 and 514 of the ferroelectric layer 510. As a result, a current flows to the electrodes 522 and 524. Screening charges 521 and 523 are thereby produced on the electrodes 522 and 524 that equal, but are opposite in charge to, the bound charges 511 and 513 at the surfaces 512 and 514 of the ferroelectric layer 510. At that point, the net electric field in the electrodes 522 and 524 is necessarily negligible or zero since the electrodes 522 and 524 are conductors. The bound charges 511 and 513 in the ferroelectric layer 510 result from the aligned electric dipoles 517 and $P_s$, while the screening charges 521 and 523 on the electrodes 522 and 524 result, in turn, from the bound charges 511 and 513, and are in opposition to those bound charges 511 and 513.

As the ferroelectric goes through phase transition and becomes paraelectric or antiferroelectric, the spontaneous polarization in the ferroelectric layer 510 disappears. As a result, the screening charges 521 and 523 on the electrodes 522 and 524 become unscreened at an extremely high potential difference between the electrodes 522 and 524. The exact potential difference will depend upon the particular ferroelectric and the configuration of the module, but potentials in excess of 30,000 volts may be attained with appropriate materials before dielectric breakdown.

Figure 15:
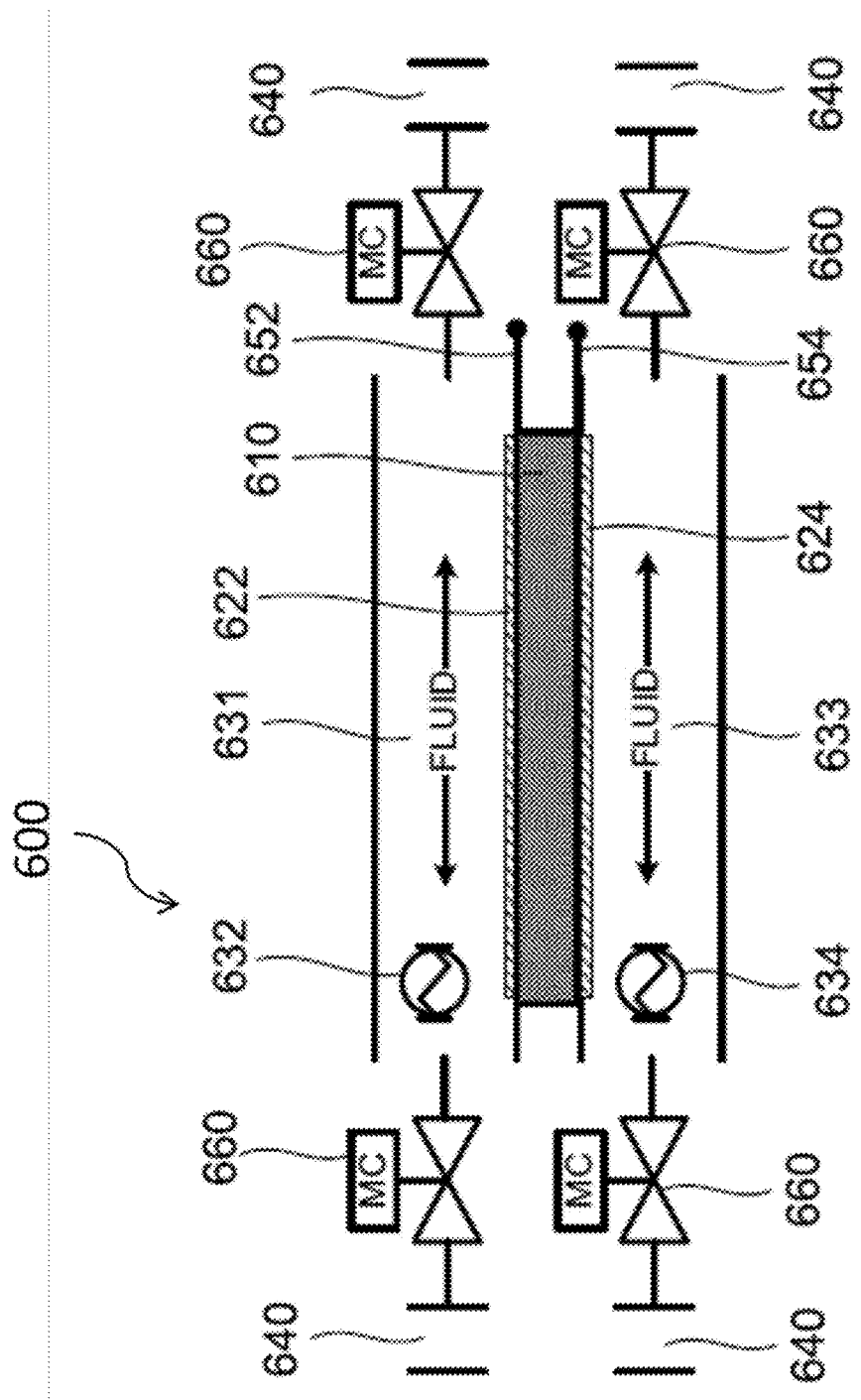
FIG. 15 shows schematically a cross-sectional view of a ferroelectric device for converting heat to electric energy according to one embodiment of the present invention.
Figure 16:
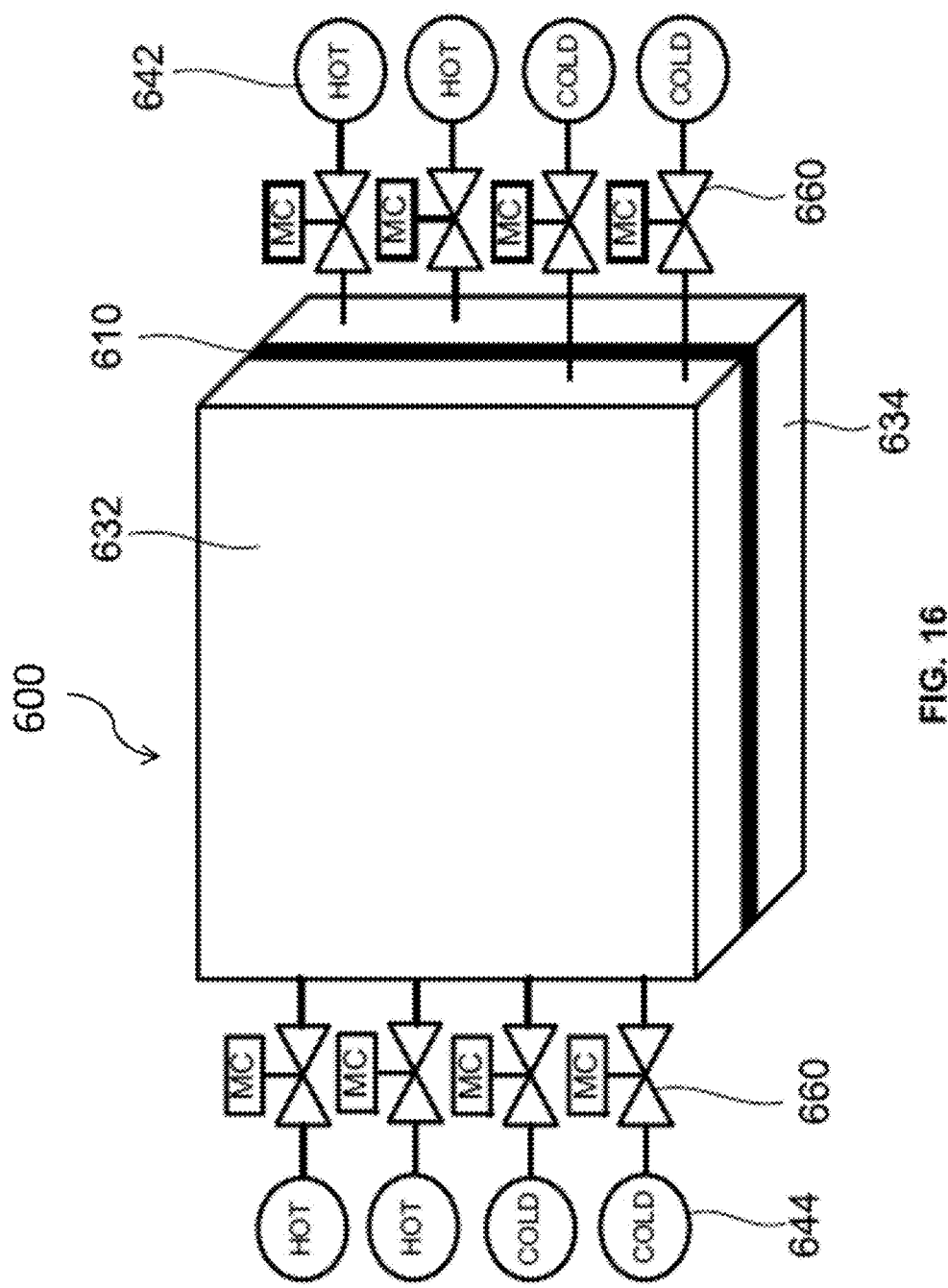
FIG. 16 shows schematically a perspective view of the ferroelectric device as shown in FIG. 15.

FIGS. 15 and 16 show another embodiment of a heat-to-electric conversion device 600 according to the present invention. In the exemplary embodiment, the device 600 has a ferroelectric layer 610, a pair of electrodes 622 and 624 respectively formed on the surfaces of the ferroelectric layer 610, and a delivering means in relation to the pair of electrodes 622 and 624 for alternately delivering a cold fluid and a hot fluid over the surface of the ferroelectric layer so as to alternately cool the ferroelectric layer 610 at a first temperature $T_L < T_c$, and heat the ferroelectric layer 610 at a second temperature $T_H > T_c$; thereby the ferroelectric material of the ferroelectric layer 610 undergoes alternating phase transitions between the ferroelectric phase and the paraelectric or antiferroelectric phase with temperature cycling.

In one embodiment as illustrated in FIG. 3, the ferroelectric generator module 710 is located inside a thermal chamber 720. The module 710 includes the ferroelectric layer 610 and the electrodes 622 and 624 thereon as depicted in FIG. 15, and also depicted as 110 (ferroelectric layer) and 122 and 124 (electrodes) in FIG. 12. The electrodes are connected to leads 711 and 712 that connect the module to external circuitry. The module 710 may also include the additional surface treatment or other features described herein to maintain a layer of liquid on the surface of the module to enhance thermal transfer with the ferroelectric module 710 as the chamber 720 is cycled. The chamber 720 in FIG. 3 is connected to conduits 730 and 740, preferably thermally insulated, which conduits are also connected to the hot and cold reservoirs 750 and 760, respectively. The hot reservoir 750 contains a two-phase mixture of a working fluid that is maintained at high pressure and high temperature, $P_H$ and $T_H$. The cold reservoir 760 contains a two-phase mixture of the same working fluid maintained at low pressure and low temperature, $P_L$ and $T_L$. The conduit 730 is attached to the hot reservoir 750 so that the conduit opens into the vapor portion of the mixture in the hot reservoir 750, and the conduit 740 is attached to the cold reservoir 760 so that conduit 740 opens into the vapor portion of the mixture in cold reservoir 760. Both conduits 730 and 740 are attached to thermal chamber 720 so as to provide a passageway through which vapor can pass from the hot reservoir 750 to the chamber 720, and a passageway through which vapor can pass from the thermal chamber 720 to the cold reservoir 760, respectively.

The dimensions of the conduits 730 and 740 are such that the vapor in the hot reservoir 750 can pass rapidly and with little resistance when valve 735 is open and valve 745 is closed, and the vapor in the thermal chamber 720 can pass rapidly and with little resistance to the low temperature reservoir 760 when valve 745 is open and valve 735 is closed. Pump 770 returns working fluid from the low temperature reservoir 760 to the high temperature reservoir 750 via a conduit 775, which in one embodiment is insulated. In the absence of leakage, the working fluid is in a self-contained circulating system and need not be replenished.

The hot reservoir 750 receives heat from a heat source (not shown) which heat source can be of any kind or character, so long as the temperature, heat flux, and other characteristics are appropriate for the particular apparatus. Heat is conveyed through one or more heat exchangers to the hot reservoir 750 so that the temperature of the mixture is maintained at $T_H$ while pressure is also maintained at $P_H$. Similarly, the two-phase mixture in the cold reservoir 760 is maintained at $T_L$ by thermal communication, through one or more heat exchangers, with a heat sink (not shown) while pressure is maintained at $P_L$. The pressure in the hot and cold reservoirs 750 and 760 is monitored and controlled, and may be augmented if necessary from an external pressure source, such as a pump or compressor. Some of the possible heat sources and heat sinks that may be used with the invention are described in U.S. patent application Ser. No. 13/247,525, which application is incorporated by reference herein in its entirety. Heat exchangers that can be used to provide heat to the hot reservoir 750 and to remove heat from the cold reservoir 760 are well known to those skilled in the art.

FIG. 3 is a schematic depiction of an embodiment of the invention which is like the apparatus illustrated in FIG. 1, but a heat regenerator 780 is included in FIG. 3. Heat generation is well known to those skilled in the art. In this embodiment, the conduit 740 from the thermal chamber 720 to the low pressure reservoir 760 is routed to and through the regenerator 780. FIG. 3 also shows leads 711 and 712 coming from the ferroelectric module, those leads being connected to electrodes on the surfaces of the ferroelectric layer(s), as described herein.

The hot reservoir 750 and cold reservoir 760 in FIG. 3 correspond to the heat exchangers, or reservoirs, 632 and 634 in FIG. 15, which is a more generalized schematic illustration of the overall device, showing the ferroelectric layer and electrode in one embodiment. In the exemplary embodiment illustrated schematically in FIG. 3, the controlled and synchronized opening and closing of the valves 735 and 745 by a control circuit causes a rapid change in the pressure and temperature of the vapor in the thermal chamber 720, cycling between $T_H$ and $P_H$, and $T_L$ and $P_L$. When valve 735 is open, valve 745 is closed, and conversely. When valve 735 is open, the thermal chamber 720 immediately receives vapor from the hot reservoir 750 at $P_H$ and $T_H$, thereby exposing the ferroelectric module 710 to vapor at $T_H$ and $P_H$, as described in detail herein, rapidly raising the temperature of the module 710 to $T_H$ as heat is input into the module 710 when vapor in chamber 720 condenses on the surface of module 710. In accordance with certain of the thermodynamic-electrical cycles referenced herein, heat is further added to the module while polarization is controlled and held constant. Valve 735 is then closed and valve 745 is opened. The pressure and temperature of the vapor in the thermal chamber 720 changes immediately to $P_L$ and $T_L$ as vapor passes from chamber 720 to the cold reservoir 760. The ferroelectric module 710 is rapidly cooled to $T_L$ as condensate on the surface of module 710 evaporates. In accordance with certain of the cycles described herein, heat is further removed from the module while polarization is controlled and held constant. In one embodiment of the invention, the foregoing sequence is repeated continuously, causing ongoing cycling of the module 710 around a desired temperature T, where $T_L < T < T_H$.

The plurality of control valves 735 and 745 are controlled by a computerized control circuit, which may receive and act on temperature and pressure data from the fluids in reservoirs 750 and 760; temperature, capacitance, and electrical polarization data from the electric generator module 710; temperature and pressure data from the thermal chamber 720; and other data.

As described elsewhere, in one embodiment of the invention the surface of module 710 is treated and/or configured so as to cause a thin layer of the liquid working fluid to remain on the surface of module 710 during temperature cycling. The liquid layer rapidly removes, and expels, large quantities of heat during evaporation and condensation, respectively, thereby facilitating a rapid transfer of heat into and out of the module 710. The particular characteristics of such a liquid layer on the ferroelectric module 710 depends on the nature and configuration of module 710, the specific working fluid, and other factors specific to a given application. In another embodiment, the rate at which the ferroelectric module 710 absorbs and rejects heat can be increased by configuring the module so that the ratio of the surface area of the module on which condensation and evaporation occur is increased relative to the overall thermal mass of the module. In certain embodiments, the area of module 710 relative to its thermal mass may be enhanced by constructing the module so that it is comprised of thin strips or sheets of material that may be configured into various geometrical shapes which permit the vapor to permeate that geometry, thereby increasing the available area at which thermal transfer occurs between the working fluid in chamber 720 and the module 710, in comparison to the thermal mass of the module.

The addition and removal of heat to and from the ferroelectric module 710 is coordinated by a control circuit with the opening and closing of the electrical circuit in conformity with a thermal and electrical cycle as described herein, including for example the cycle depicted in FIG. 32. Electrical and thermal cycling are coordinated by directly monitoring and processing the temperature of the ferroelectric with a device such as a thermocouple or thyristor; the capacitance of the ferroelectric system, as capacitance is correlated to the temperature of the ferroelectric layer as a whole; the polarization of the ferroelectric layer; and/or by monitoring and processing other data. The extent of unbound charges on the electrodes 622 and 624 in FIG. 15 may also be monitored and used in controlling the cycle and, among other things, determining when the field resulting from that charge remains sufficient to pole the dipoles during the transition of the ferroelectric layer 110 in FIG. 12 into its ferroelectric phase.

Figure 17:
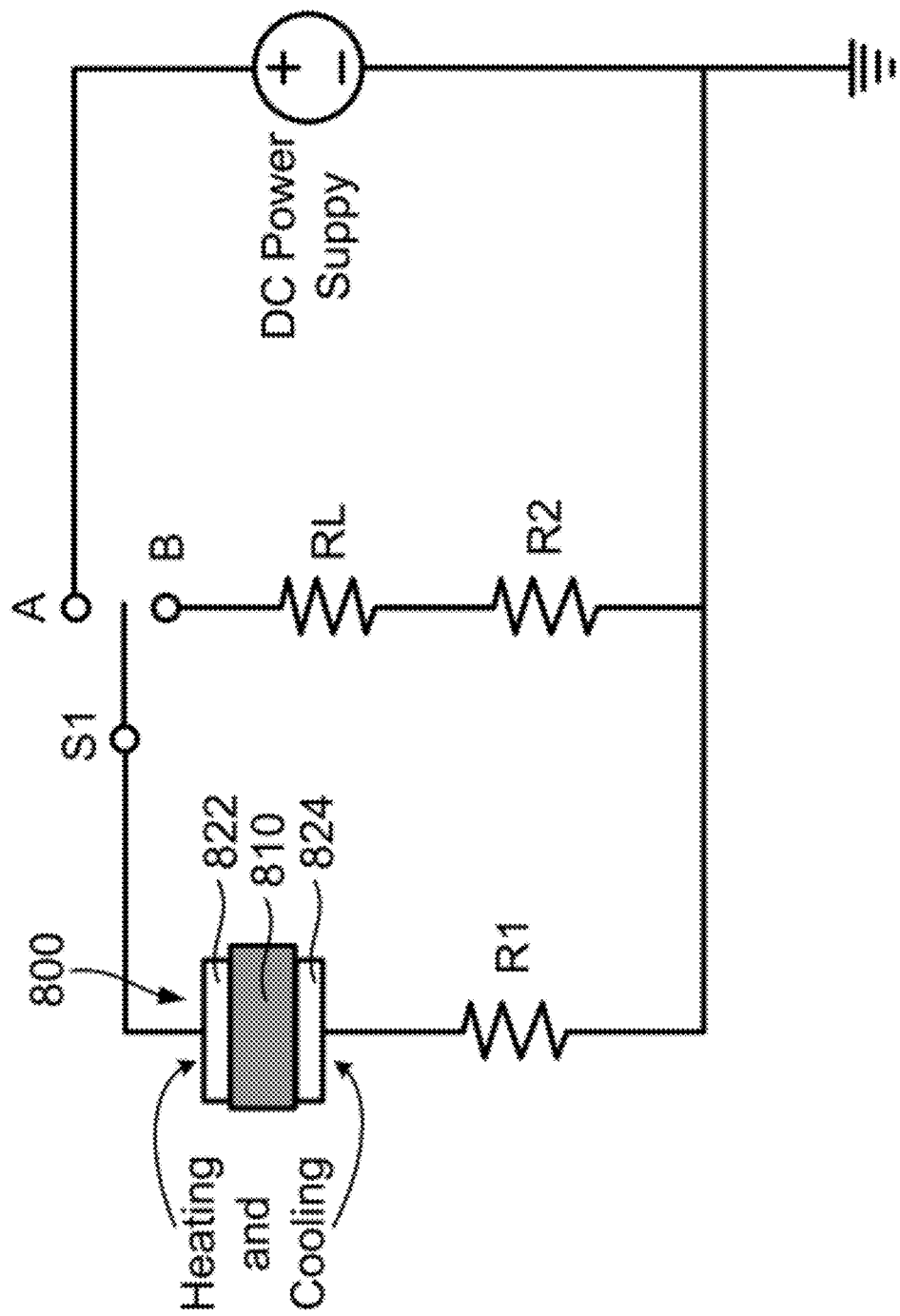
FIG. 17 shows schematically a ferroelectric power generator for operation with a resistive load according to one embodiment of the present invention.

FIG. 17 illustrates schematically a heat-to-electric energy conversion device 800 connected to a DC power supply that may be used for poling when necessary, and to an external load resistance, RL, for receiving the electrical discharge generated, according to one embodiment of the present invention. According to one embodiment, one or more monitoring devices (not shown) are attached to or imbedded in the ferroelectric device to monitor the temperature of the ferroelectric material. Such monitoring may be done, for example, by one or more thermocouples or thyristors or by monitoring the capacitance of the device. Additionally, resistors R1 and R2 which may remain in the circuit to monitor the current, as they have negligible resistance compared to the load resistance RL. Polarization may be monitored by integrating the current flow through resistors R1 and/or R2. Throughout the cycle, the ferroelectric module 800 undergoes actions controlled by one or more computers acting through a control circuit (not shown) that control heating and cooling and control the switch S1 as described herein.

In practice, the cycling of the ferroelectric modules 600 and 800 are repetitive and ongoing so long as the device is to be used to generate electricity from heat. Thus, a description of a cycle could begin at any point in the cycle. For the purpose of illustrating the operation of the device in one embodiment, the ferroelectric module 600 or 800 is initially assumed to be at point C of the cycle depicted in FIG. 32. At that point, switch S1 depicted in FIG. 17 is opened and the ferroelectric layer 810 is at $T_H$ and polarization is at $P_L$. As described elsewhere the value of $P_L$ may correspond to a residual unbound charge that creates a field sufficient for poling the electric dipoles that arise spontaneously when the ferroelectric layer 810 transitions to the ferroelectric phase. While the switch S1 remains open at the mid-position, the ferroelectric layer 810 is cooled to $T_L$ by the withdrawal of heat, bringing the cycle to point D in FIG. 32. Keeping the switch S1 open prevents the flow of charge to or from the electrodes 822 and 824, such that polarization remains at $P_L$ during the CD step of the cycle.

At point D of the cycle in the usual operation of the invention after the first cycle in those embodiments in which a residual charge is used for poling, switch S1 is switched to position B as shown on FIG. 17, which closes the circuit between the electrodes 822 and 824 and the load resistance, RL. While the switch S1 is in position B, heat is withdrawn from the ferroelectric layer 810 isothermally at $T_L$, corresponding to step DA of the cycle depicted in FIG. 32. In step DA, the polarization retains its direction but increases to the value $P_H$. The resulting overall spontaneous polarization, $P_s$, produces very large bound charges on the surfaces of the ferroelectric layer 810. Those bound charges cause screening charges to develop on electrodes 822 and 824 that are equal and opposite to the bound charges at the surfaces of the ferroelectric layer 810. Heat $Q_L$ withdrawn during the DA step of the cycle corresponds to the enthalpy of phase transition. At point A, spontaneous polarization in the ferroelectric layer 810 is at the maximum, $P_H$, and the net electric field in the electrodes is negligible since the electrodes now carry sufficient charges to balance the bound charges due to $P_H$. Large amounts of electrical energy are generated spontaneously during step DA corresponding, for example, to the free energy difference between points D and A in FIG. 31.

FIG. 14 illustrates (1) the bound charges in the ferroelectric that are the result of the aligned electric dipoles and $P_s$ and (2) the screening charges that arise on the electrodes in opposition to those bound charges, as would occur at point A of the cycle (though at point A the load resistance RL would not be in the circuit as it is depicted in FIG. 14).

In one embodiment, a DC voltage source is included in the circuit when the switch S1 is in position A, and that voltage source can be used for poling in the first cycle or for any reason if during operation the field from the residual charges on the electrodes 822 and 824 at point D of the cycle becomes insufficient to pole the ferroelectric layer 810. In that event, switch S1 is switched to position A at point D of the cycle and a DC voltage is applied across the ferroelectric layer to pole the dipoles that spontaneously arise during transition. The voltage required for poling is material dependent, but is small compared to the voltage at which the charge is discharged from the ferroelectric device 800. Other than the minimum required for poling in such instances, a voltage need not be applied across the ferroelectric layer 810 and is discontinued. When polarization reaches $P_H$, the switch S1 is opened to the mid-position illustrated in FIG. 17, and the device is at point A in the cycle of FIG. 32.

The field that is sufficient for poling depends upon the particular material, its geometry, whether the device is operated in a single- or multi-stage configuration, and other factors. The minimum poling field generally will be of comparable strength whether it is created by the residual charges on electrodes 822 and 824 at points C and D of the cycle, or whether it is imposed from an external DC voltage source. By way of an example, for some single stage, lead-based ceramic ferroelectrics of approximately 1.0 mm thickness, an adequate poling field may be achieved by a voltage of approximately 200 volts. By contrast, the generated voltage for such a material can exceed 6,000 volts during electrical discharge. Without poling, the polarizable material would spontaneously exhibit electric dipoles when the material is in the ferroelectric phase but, in the overall aggregate, the dipoles would not be aligned. Such alignment is essential to achieve the high overall $P_s$ values that are exploited by the invention.

During the AB step of the cycle depicted in FIG. 32, the switch S1 is open, and the ferroelectric layer 810 is heated to $T_H$ so that it transitions out of the ferroelectric phase. Because the switch is open, the unbound charges on the electrodes are prevented from discharging during the lattice heating that occurs during the AB step, and total polarization remains at $P_H$.

At point B of the cycle, switch S1 is switched to position B in FIG. 17, and heat is added to the ferroelectric layer 810 isothermally at $T_H$ so that large amounts of electrical energy are released to the load RL from the ferroelectric module 800. As the electrical charges are removed from the electrodes 822 and 824, the charges are received at a very high voltage by the load resistor, RL, or by any other suitable device that can be used to store, transmit, or utilize electricity for work. When the free charges remaining on the electrodes 822 and 824 have diminished to the minimum that is sufficient to establish a field to pole the spontaneous dipoles during the transition back to the ferroelectric state, in those embodiments in which poling is achieved through an internally generated field, the withdrawal of electrical energy from the electrodes is stopped by opening the switch S1, which corresponds to point C of the cycle. Total polarization at that point is $P_L$, and the ferroelectric layer 810 is at $T_H$.

In one embodiment, a full-wave rectifier (not shown) is included in the circuit when the switch S1 is in position B. The rectifier causes current flows to and from the electrodes 822 and 824 to have the same direction at the load RL whether the current occurs during the BC or DA steps of the cycle. Such a full-wave rectifier may consist, for example, of a bridge circuit. Rectifying the signal in this fashion may simplify the subsequent use or storage of the electrical energy generated during cycling.

In another embodiment, the ferroelectric material is not cycled pursuant to the thermodynamic cycle set forth in FIG. 32 and as otherwise described herein. Rather, the ferroelectric module may be cycled using any thermodynamic cycle that allows the ferroelectric material to be cycled from a ferroelectric state in which the spontaneous dipoles are poled, to a paraelectric or antiferroelectric state wherein polarization is maintained so that it does not decrease below a minimum level, $P_L$, where $P_L$ corresponds to a level of polarization that produces a field sufficient to pole during the transition to the ferroelectric phase. In yet another embodiment, $P_L$ is allowed to become negligible or zero and poling is achieved by application of an applied DC voltage with the switch S1 in FIG. 17 in position A during step DA of the cycle depicted in FIG. 32.

In yet another embodiment, instead of cycling the ferroelectric material through phase transition, it is maintained at all times in a ferroelectric phase, and is cycled from a greater degree of polarization to a lesser degree of polarization.

The thermal cycling and the electrical inputs and outputs are computer controlled with a control circuit throughout the cycle. Heating and cooling during the various steps of the cycle are accomplished by microcontrollers causing hot and cold fluids to be directed alternately to the ferroelectric module 800, those hot and cold fluids corresponding to the respective vapors at $T_H$ and $P_H$, and $T_L$ and $P_L$, pursuant to the invention. Different controls, as may be appropriate to a particular application and to a particular heating and cooling system, can be obtained by using microcontrollers in combination with computers. The computer controls (not shown) receive temperature values from thermocouples or other devices that monitor the temperature in the heating and cooling fluids and in the ferroelectric materials. Pressures in the hot and cold fluids may also be monitored. The computer controls also monitor polarization and load currents as measured, for example, by resistors R1 and R2, as shown in FIG. 17. Polarization may be monitored by integrating the current flow through resistors R1 and/or R2. Computers and a control circuit control the heat exchangers to cause appropriate thermal cycling of the ferroelectric module in accordance with the thermodynamic cycle being used. Microcontrollers that receive such monitoring data under computer control also direct the position of the switch S1. Instead of or in addition to thermocouples or thyristors, capacitance or other measurements of one or more control ferroelectrics may be used as monitors and to control the timing of the cycling and switching with the control circuit.

Figure 18:
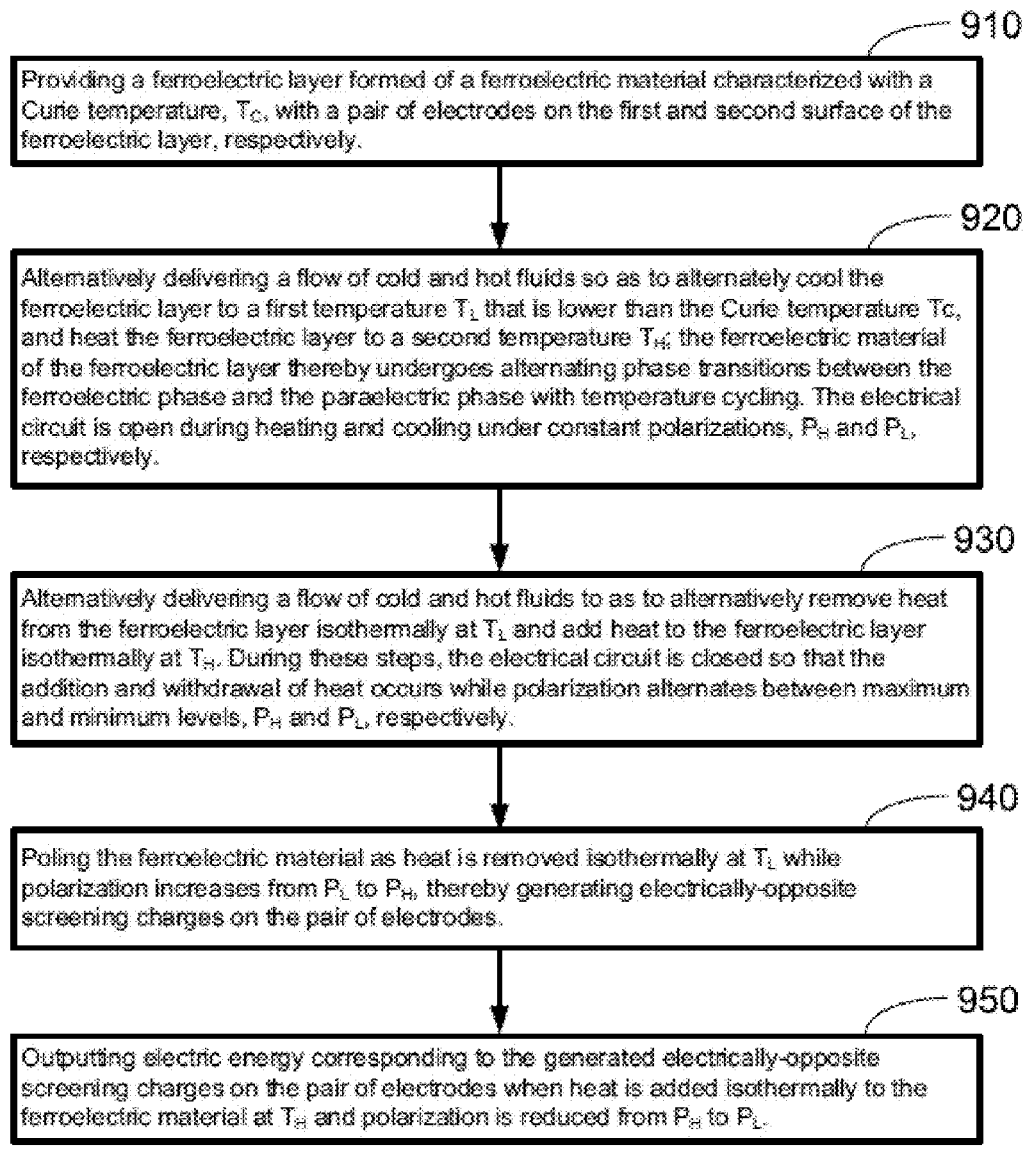
FIG. 18 is a flow chart of a process for converting heat to electric energy according to one embodiment of the present invention.

Referring to FIG. 18, a method for operating the device for converting heat to electrical energy is shown according to one embodiment of the present invention. In one embodiment, the method includes the following steps: at step 910, a ferroelectric layer is provided. The ferroelectric layer is comprised of a ferroelectric material characterized with a Curie temperature, $T_c$. A pair of electrodes is positioned respectively on the first surface and the second surface of the ferroelectric layer, with electrical leads going from the electrodes to external circuitry. The electrodes are comprised of a thermally and electrically conductive material.

At step 920, a cold fluid and a hot fluid are alternately delivered so as to alternately cool the ferroelectric layer to a first temperature $T_L$ that is lower than the Curie temperature $T_c$, and heat the ferroelectric layer to a second temperature $T_H$ that is higher than the Curie temperature $T_c$. Such heating and cooling result from condensation and evaporation of fluid on the surface of the ferroelectric layer. During step 920, the electrical circuit is opened so that cooling and heating occur under constant polarization, $P_L$ and $P_H$, respectively, while lattice cooling and heating occur. The cold fluid and the hot fluid can alternately be delivered by heat exchangers, control valves, or the likes, controlled in coordination with data monitors and under direction form a computerized control circuit.

At step 930, a cold fluid and a hot fluid are alternately delivered so as to alternately remove heat from the ferroelectric layer isothermally at a first temperature $T_L$ that is lower than the Curie temperature $T_c$, and add heat to the ferroelectric layer isothermally at a second temperature $T_H$ that is higher than the Curie temperature $T_c$. Such heating and cooling result from condensation and evaporation of fluid on the surface of the ferroelectric layer. During step 930, the electrical circuit is closed so that the removal of heat occurs as polarization changes from $P_L$ to $P_H$, and the addition of heat occurs as polarization changes from $P_H$ to $P_L$. A cold fluid and a hot fluid can alternately be delivered by heat exchangers, control valves, or the likes, controlled in coordination with data monitors and under direction form a computerized control circuit.

At step 940, with the ferroelectric material initially in a metastable state, the spontaneous polarization of the domains in the ferroelectric material is poled at temperature $T_L$ so as to generate electrically-opposite screening charges on the pair of electrodes. The poling field is provided by residual charges on the electrodes that are on the surfaces of the ferroelectric layer, which residual charges are not withdrawn during the discharge step of the cycle. The residual charges remaining are that which are sufficient to create a poling field as the ferroelectric layer transitions back into its ferroelectric phase. In another embodiment, the poling is performed when necessary by applying a small external electric field to the ferroelectric layer.

At step 950, heat is added to the ferroelectric material isothermally at $T_H$ by condensation of fluid on the surface while the circuit is closed. Electric energy corresponding to the generated electrically-opposite screening charges on the pair of electrodes is output to an external circuitry at high voltage. In one embodiment, the circuit is opened to allow a sufficient residual charge remaining on the electrodes to provide a field for poling during the next cycle.

It should be noted that, while the essential function of the device occurs in a single layer with a given ferroelectric material, the invention may be more useful in practical applications and may produce greater quantities of electrical energy from a particular heat source where a number of ferroelectric materials are combined in a series of stages. The maximum efficiency of any system that converts thermal energy to another form of energy, or to work, is the Carnot efficiency, $\eta_c = \Delta T/T_H$. In applications where $\Delta T$ is larger, it may be desirable to utilize a multistage conversion module that includes a series of ferroelectric materials with a succession of phase transition temperatures that correspond to the available temperatures between $T_H$ and $T_L$. The magnitude of $\Delta T$ that warrants multi-stage treatment varies depending upon the specific application and materials system used. There may be applications where it is appropriate to operate a single-stage device over a relatively large $\Delta T$, for example 100° C. or more, and that may be the case in particular in conjunction with heat regeneration techniques.

There are a number of configurations or embodiments whereby the basic principle of the present invention can be used in a multistage format with multiple ferroelectrics that have multiple phase transition temperatures, several of which embodiments will be described here. By providing these descriptions, it is not the intention to limit the invention to these configurations, which are merely illustrative. Also, where these descriptions and embodiments refer to Curie temperatures, $T_c$, it should be understood that the descriptions are equally applicable for ferroelectrics where the ferroelectric phase exists at temperatures above the transition temperature and the material is paraelectric below that transition temperature, for ferroelectrics where the transition is between ferroelectric and antiferroelectric phases, and for polarizable polymers.

FIG. 19 shows an apparatus having a plurality of ferroelectric modules, FM1, FM2, . . . FMn-1 and FMn, arranged in an array to expand the working surface that interfaces with the heat exchangers so as to increase the amount of thermal energy that can be received from the heat source and be converted to electrical energy. The electrical output is removed by buses 1001 connected to the electrodes of each module. The individual modules and the thermal chambers (720 in FIG. 3, for example) can be thermally cycled in such an array using individual hot and cold reservoirs, or a number of modules and thermal chambers can be connected to one or a plurality of hot and cold reservoirs where the number of hot and cold reservoirs is each less than the number of modules in the array.

Figure 20:
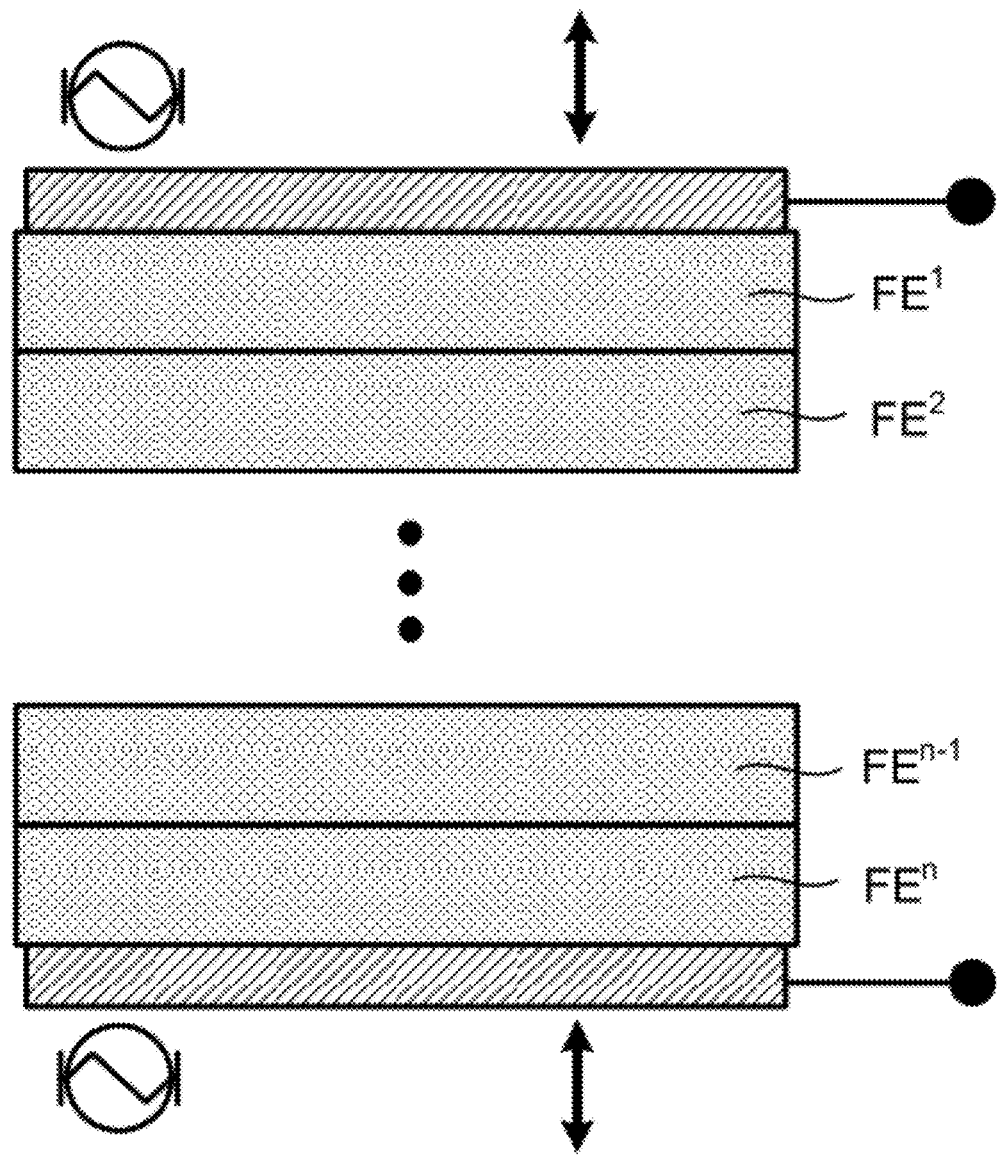
FIG. 20 shows schematically a ferroelectric device for converting heat to electric energy according to another embodiment of the present invention.
Figure 21:
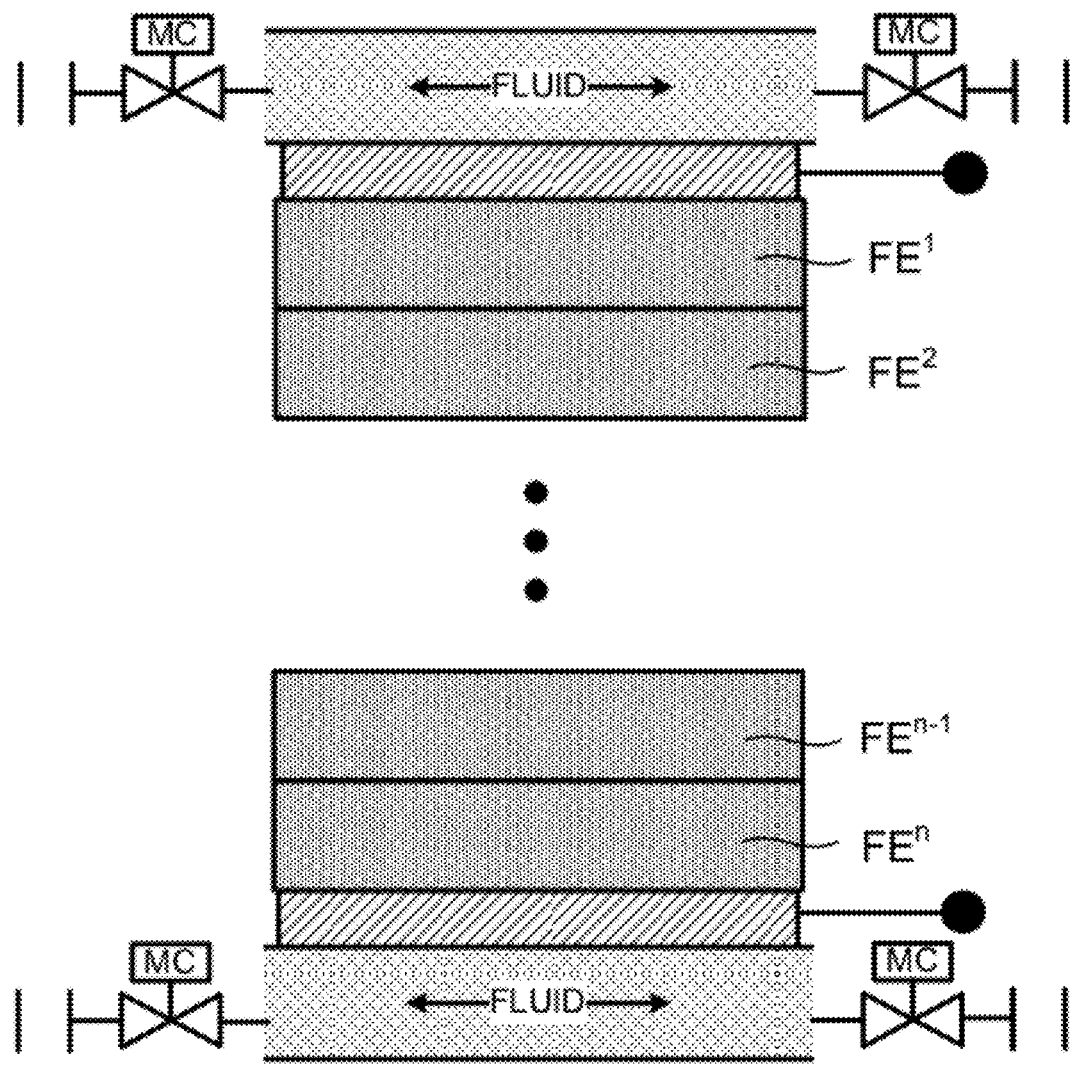
FIG. 21 shows schematically a ferroelectric device for converting heat to electric energy according to yet another embodiment of the present invention.

In a multilayer configuration, a series of ferroelectric layers may be arranged in a stack formed in order to maximize thermal conductivity. The resulting multilayered ferroelectric structure is placed between a pair of electrodes, which is similar to the single layer device as disclosed above. Such a configuration is illustrated diagrammatically by FIGS. 20 and 21. The sequential layers, $FE^1$, $FE^2$ ... $FE^{n-1}$ and $FE^n$, are formed of an identical ferroelectric material or substantially different ferroelectric materials. The Curie temperatures, $T_c^1$, $T_c^2$ ... $T_c^{n-1}$ and $T_c^n$, correspond to the ferroelectric materials in the sequential layers $FE^1$, $FE^2$ ... $FE^{n-1}$ and $FE^n$. In one embodiment, the multilayered ferroelectric materials are arrayed so that $T_c^{i+1} > T_c^i$. In one embodiment, the combined multilayer module is cycled using two-phase heat transfer in accordance with the principles of the invention, so that each individual layer cycles around its phase transition temperature, and the combined multilayer module is cycled in accordance with the various thermodynamic-electrical cycles described herein. Each layer, during the course of a cycle, undergoes ferroelectric-paraelectric or ferroelectric-antiferroelectric cycling with poling and discharge as described herein for a single layer device. With this multilayer configuration, as shown in FIGS. 20 and 21, the electrical energy removed at high voltage during the discharge step of the cycle is related to the total spontaneous polarization, $P_s$, at the junctures of the electrodes and the ferroelectric materials designated as $FE^1$ and $FE^n$, which polarization results from the cumulative spontaneous polarization of each FE layer acting together.

Figure 22:
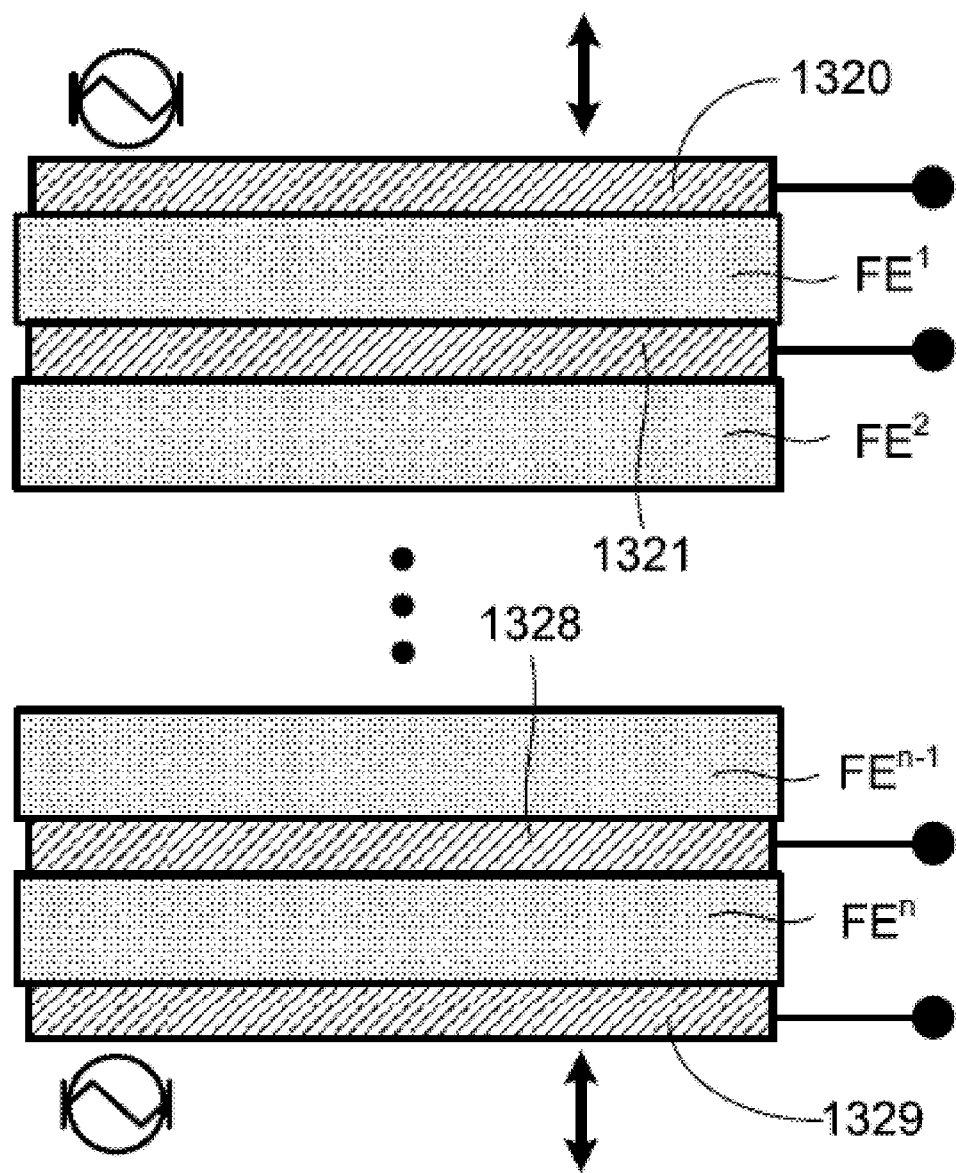
FIG. 22 shows schematically a ferroelectric device for converting heat to electric energy according to an alternative embodiment of the present invention.

Referring to FIG. 22, another embodiment of a multilayered ferroelectric device is shown according to the present invention. This configuration of the multilayered ferroelectric device is similar to the device as disclosed in FIG. 22, but separate electrodes are placed between each ferroelectric layer. For example, the ferroelectric layers $FE^1$ and $FE^2$ are separated by the electrode 1321, while the ferroelectric layers $FE^{n-1}$ and $FE^n$ are separated by the electrode 1328. These electrodes 1320, 1321 ... 1328 and 1329 are formed of a thermally and electrically conductive material. The thermal and electrical cycling and operation of the device are similar to the device as disclosed in FIGS. 20 and 21. However, the extraction of the electrical energy from the device is different. In this configuration, the electrical energy is withdrawn during the discharge step of the cycle from all of the electrodes 1320, 1321 ... 1328 and 1329, as shown in FIG. 22. The electrical energy withdrawn from the electrodes 1320, 1321 ... 1328 and 1329 can then either be transported via the connective leads to a load resistance or to a bus for exportation to such external circuitry and use as may be desired.

Figure 23:
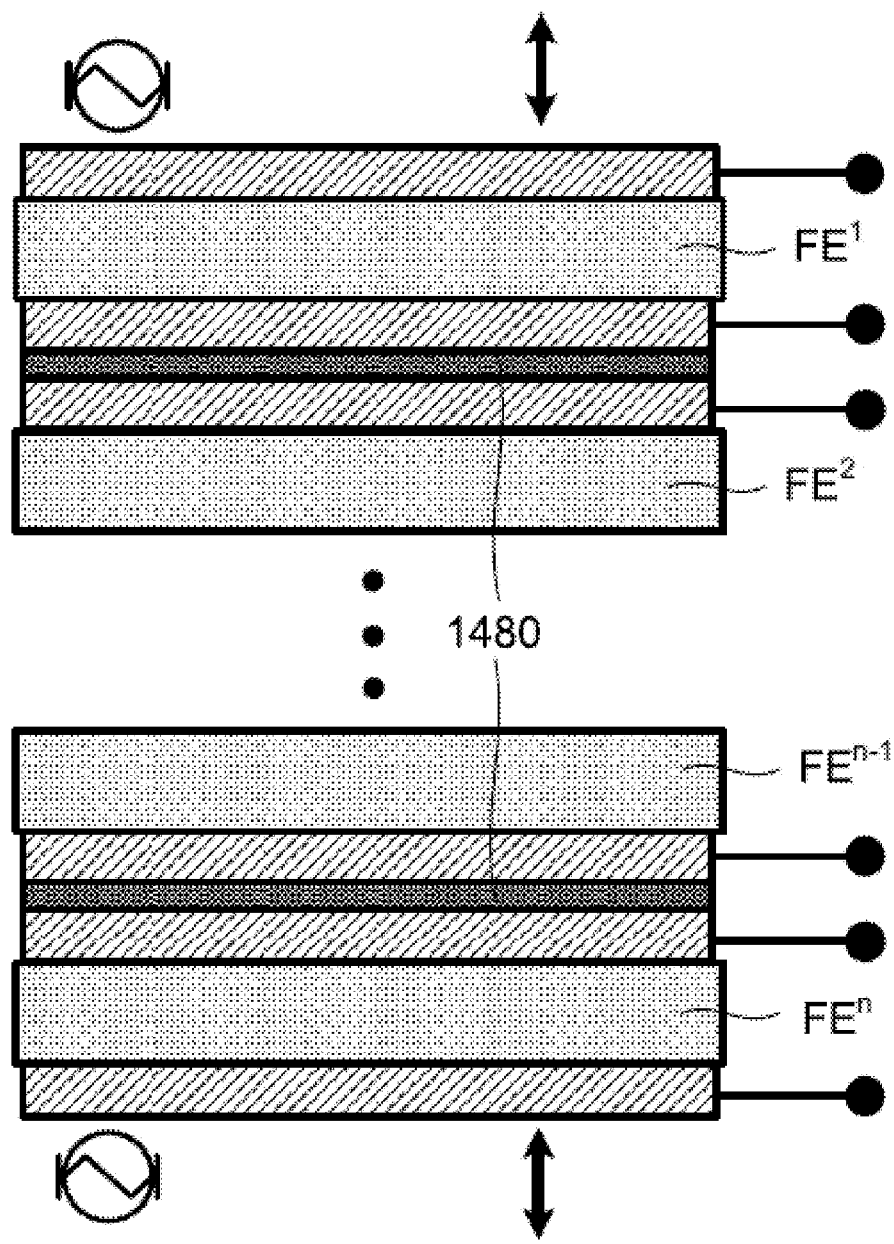
FIG. 23 shows schematically a ferroelectric device for converting heat to electric energy according to a further embodiment of the present invention.

FIG. 23 shows schematically an alternative embodiment of a multilayered ferroelectric device. This configuration of the multilayered ferroelectric device is similar to the device as disclosed in FIG. 22, but each ferroelectric layer is separated from the adjacent layer of ferroelectric material by two electrodes which, in turn, are separated by an electrical insulator 1480, which is selected to minimally impede thermal transfer.

In yet another embodiment of the invention in a multi-stage implementation, N individual modules $\{FM^n\}$, where n is an integer from 1 to N, are arrayed such that each module $FM^n$ includes a ferroelectric module 710 characterized by a transition temperature $T_c^n$, which module 710 is contained within a thermal chamber 720, as described herein in connection, for example, with FIG. 3. Each thermal chamber 720 has conduits leading to hot and cold reservoirs, which conduits contain valves as described above so that the vapor in the thermal chamber 720 is cycled between a higher temperature and pressure, and a lower temperature and pressure, whereby the module 710 is thermally cycled around its respective transition temperature $T_c^n$. The modules $\{FM^n\}$ are characterized by a series of different phase transition temperatures, $T_c^1$ to $T_c^N$ where $T_c^{n+1} > T_c^n$, and the modules are arrayed such that their phase transition temperatures $T_c^n$ are in an increasing sequence from the lowest, $T_c^1$ (where $T_c^1$ is greater than the temperature of the heat sink), to the highest, $T_c^N$ (where $T_c^N$ is less than the temperature of the heat source). Each ferroelectric stage, or module $FM^n$, is thermally cycled around its respective phase transition temperature, $T_c^n$, using the two-phase apparatus and method of the invention. In one embodiment, this is accomplished by using the cold reservoir 760 of the $n^{th}$ stage as the hot reservoir 750 for the $(n-1)^{th}$ stage, which has the next lower transition temperature, $T_c^{n-1}$. Each module $FM^n$ is further cycled so that such two-phase thermal cycling is performed in conjunction with electrical cycling as described herein. Regenerative heating may also be used in the various stages, as illustrated in FIG. 3, as well as in other configurations and methods, which techniques will be apparent to those skilled in the art. The electrical energy withdrawn from the electrodes can be transported via the connective leads either to a load resistance or to a bus for exportation to such external circuitry and use as may be desired.

Figure 9:
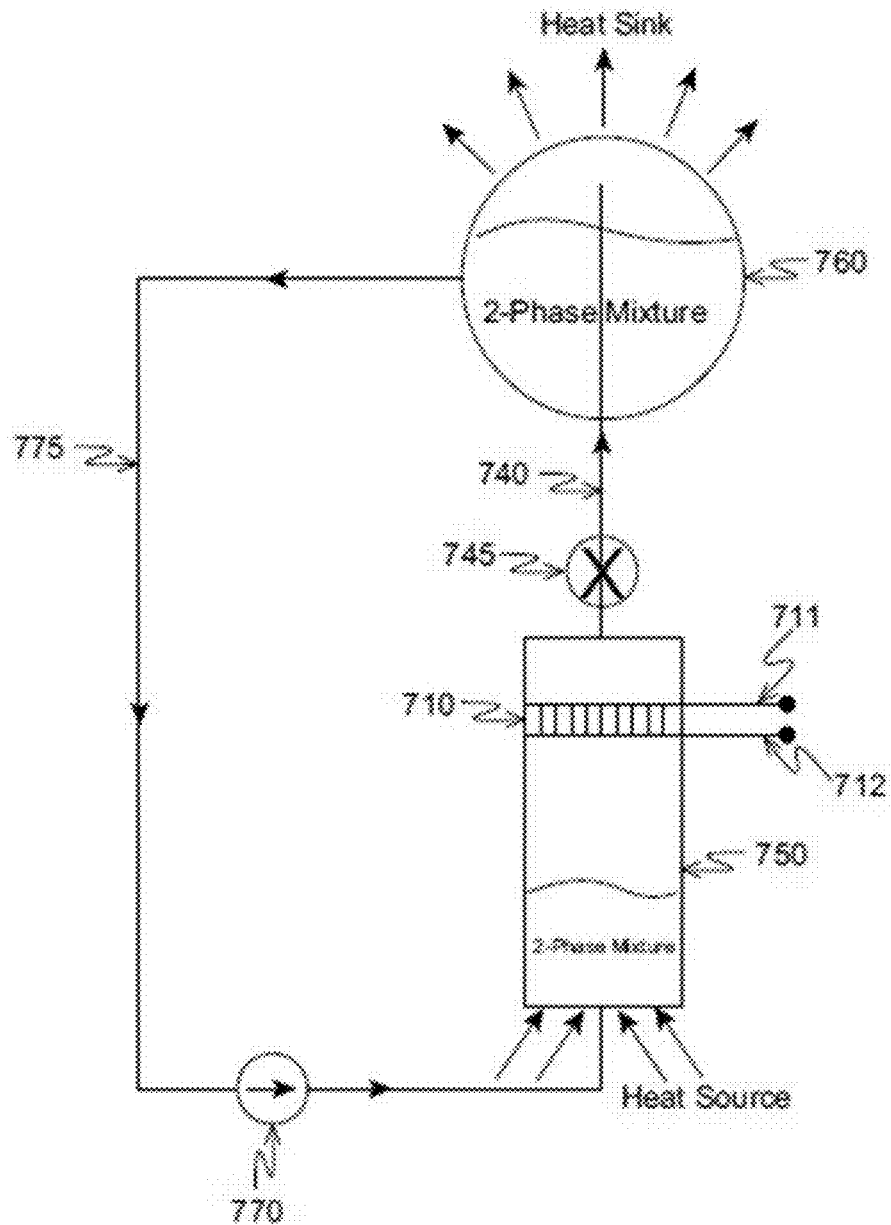
FIG. 9 illustrates schematically a ferroelectric device for converting heat to electric energy according to another embodiment of the present invention.

In yet another embodiment of the invention whereby heat is converted to electricity, the ferroelectric module 710 is located in the vapor region of a hot reservoir 750, as illustrated schematically in FIG. 9, rather than in a thermal chamber that is separated from hot and cold reservoirs, as in FIG. 3. The hot reservoir is at high temperature and pressure, $T_H$ and $P_H$, as a result of heat input from a heat source in the manner and method described for hot reservoirs generally. As illustrated in FIG. 9, a conduit 740 is connected to the top of the hot reservoir 750, and a valve 745 is in that conduit. When valve 745 is open, the vapor region of the hot reservoir, which contains the module 710, is in communication with the vapor region of the cold reservoir 760. The cold reservoir 760 is at a low temperature and pressure, $T_L$ and $P_L$. Heat is withdrawn from the cold reservoir to a heat sink as described herein. In one embodiment, thermal cycling of the module 710 occurs in conjunction with the opening and closing of the valve 745, pursuant to a computerized control circuit, which causes two-phase heat transfer on the surface of the module 710 through cyclical evaporation and condensation, respectively, as described herein. The flow conductance of the module 710 is such that it undergoes full thermal cycling without substantially changing the temperature of the hot reservoir. Electrical energy is generated from heat as the ferroelectric module 710 is thermally and electrically cycled as described elsewhere herein. Electricity generated is removed by leads 711 and 712. Heat regeneration may also be used with this configuration by, for example, routing conduit 740 to a regenerator (not shown) before it returns fluid to the cold reservoir 760, so as to transfer heat to the working fluid before that fluid is recycled into the hot reservoir.

Figure 10:
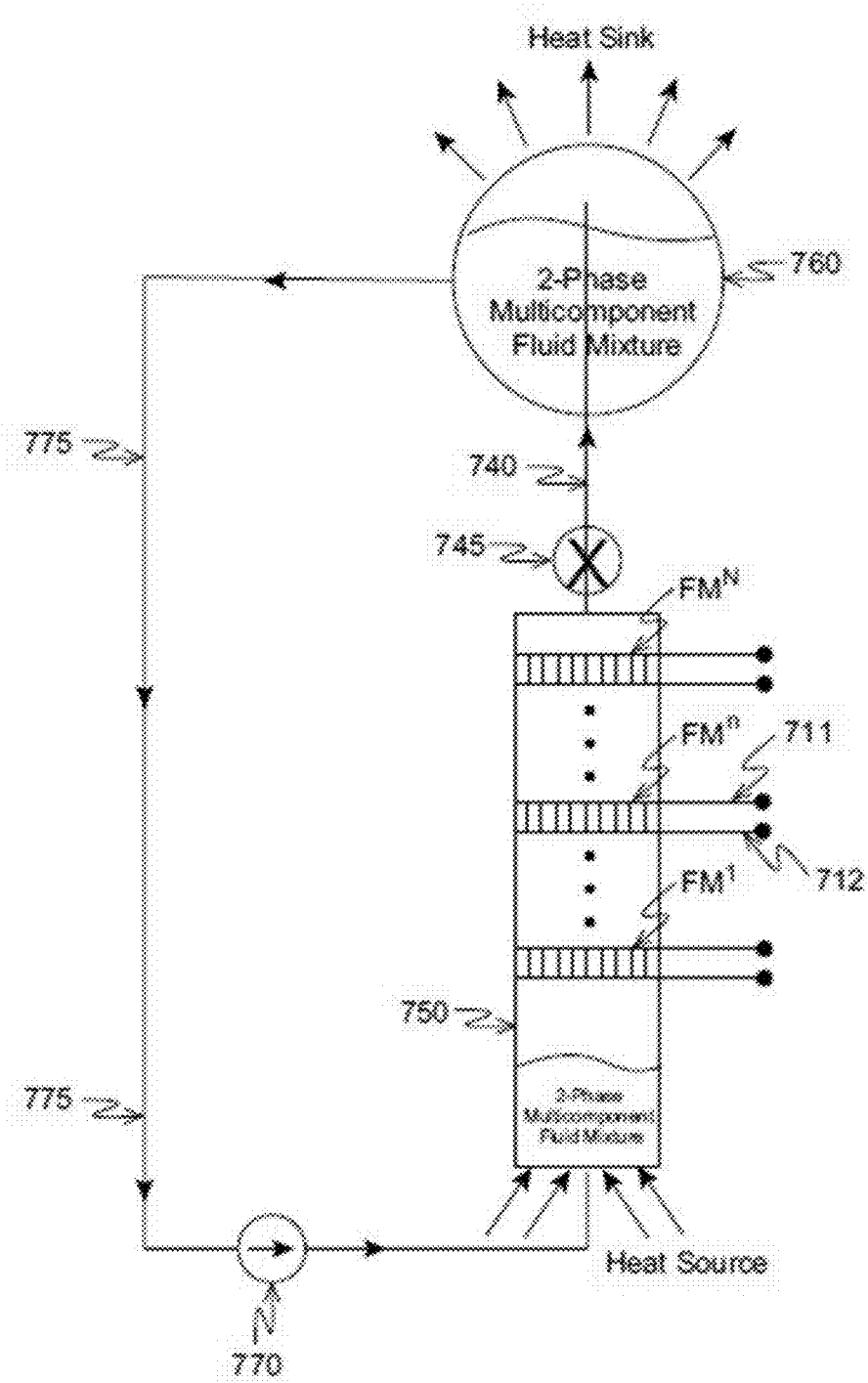
FIG. 10 illustrates schematically a multi-stage ferroelectric device for converting heat to electric energy according to another embodiment of the present invention, using a working fluid that includes multiple constituents.

In yet another embodiment of the invention depicted schematically in FIG. 10, the apparatus depicted in FIG. 9 is modified to include a series of N modules $\{FM^n\}$, where n is an integer ranging from 1 to N, and the modules are situated in a series in the vapor section of the hot reservoir 750. Each module $FM^n$ contains a ferroelectric with a transition temperature of $T_c^n$. The hot reservoir 750 is at high temperature and pressure, $T_H$ and $P_H$, as a result of heat input from a heat source in the manner and method described for hot reservoirs generally. As with the embodiment illustrated in FIG. 9, valve 745 in conduit 740 of this embodiment, when opened, connects the vapor region of the hot reservoir 750 to the vapor region of the cold reservoir 760 via conduit 730. When valve 745 is closed, the vapor in chamber 750 is isolated from the cold reservoir 760. The cold reservoir 760 is at a low temperature and pressure, $T_L$ and $P_L$. Heat is withdrawn from the cold reservoir to a heat sink as described herein.

The stack of modules in the hot reservoir 750 have progressively decreasing transition temperatures, $T_c^n$, as one proceeds from $FM^1$, the module farthest from the cold reservoir 760, to $FM^N$, the module closest to the valve 745 and the cold reservoir 760. The working fluid in this embodiment is a mixture of fluids with different boiling points. Using well-known principles and methods of fractional distillation, the constituents of the working fluid are determined, both in kind and relative quantity, so that, as valve 745 is opened and closed and the pressure at the top of the chamber 750 is thereby changed, the working fluid mixture alternately evaporates and condenses around the sequence of temperatures $T_c''$. The alternating condensation and evaporation around $T_c''$ occurs at the location of the specific module $FM''$ in the series that has transition temperature $T_c''$. Heat is alternately removed from and input into each module $FM''$ as fluid on the surfaces thereof evaporates and condenses, respectively. The sequence of modules $FM''$ are thereby thermally cycled around their respective transition temperatures as the fluid mixture at the corresponding level of the apparatus cyclically undergoes condensation and evaporation as a result of the opening and closing of valve 745. To achieve ferroelectric power generation, electrical cycling as described herein is performed for each module $FM''$ in conjunction with thermal cycling. As with the other embodiments, thermal and electrical cycling are controlled by a control circuit utilizing one or more computers that receive data which may include, among other things, the temperature, capacitance, and polarization of the various modules $FM^1$ to $FM^N$, and the temperature and pressure of the working fluid at various locations, for example, in the chamber 750, the conduit 740, the cold reservoir 760, and the regenerator. Where feasible, a gravity aided liquid flow may be used instead of a pump to return liquid from the cold reservoir to the hot reservoir. Electrical leads 711 and 712 (shown, but numbered only in part) are attached to the electrodes of each module $FM''$ and serve the functions described elsewhere. Heat regeneration may also be used with this implementation of the invention.

Figure 11:
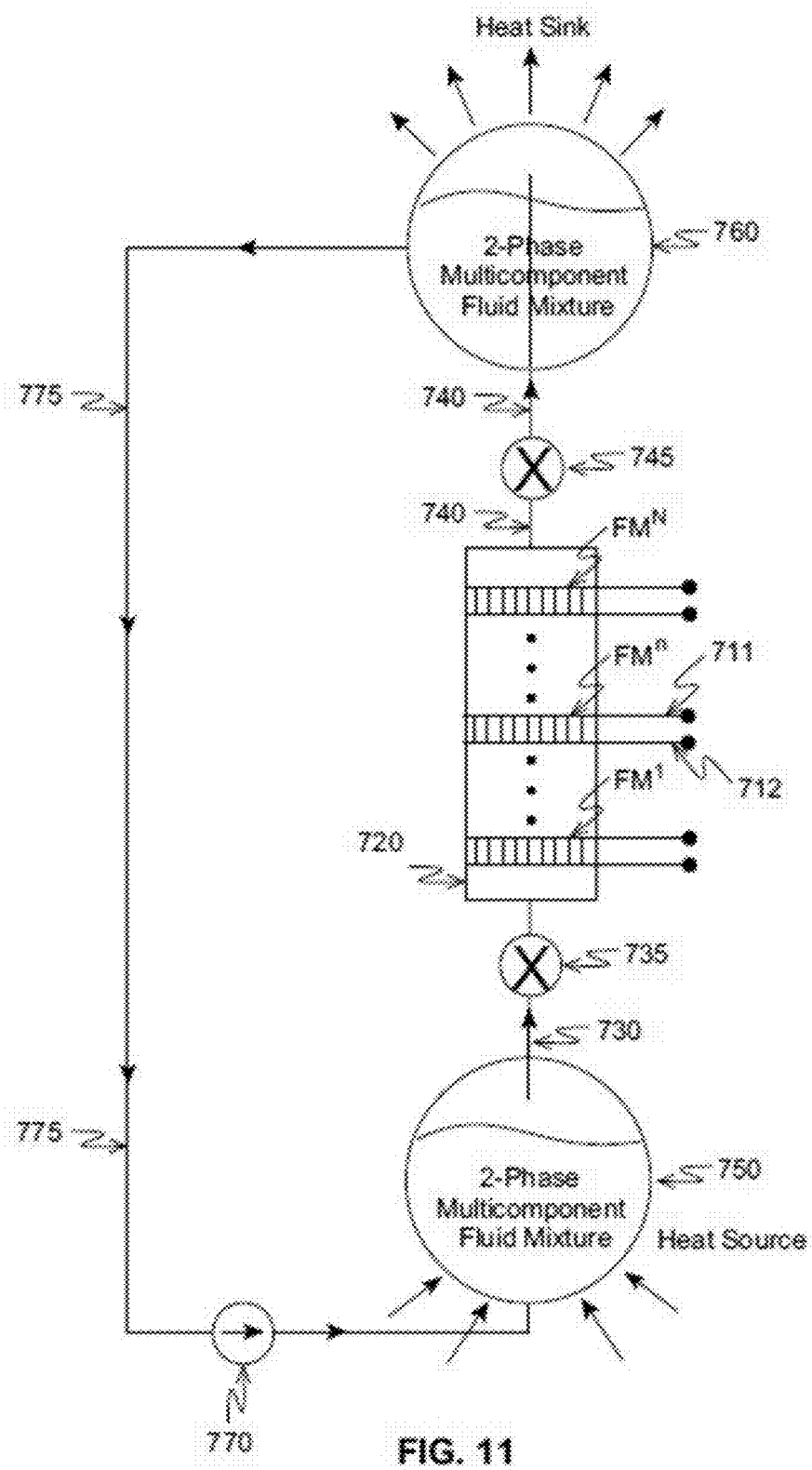
FIG. 11 illustrates schematically another multi-stage ferroelectric device for converting heat to electric energy according to another embodiment of the present invention, using a working fluid that includes multiple constituents.

In yet another embodiment, as illustrated schematically in FIG. 11, a multistage series of ferroelectric modules $\{FM''\}$ is contained in a thermal chamber 720 that is separate from the hot reservoir 750 and the cold reservoir 760. The ferroelectric modules are arrayed in this embodiment in an order whereby they have progressively decreasing transition temperatures, $T_c''$, as one proceeds from $FM^1$ to $FM^N$, where $FM^1$ is the module closest to the hot reservoir 750, and $FM^N$, is the module closest to the cold reservoir 760. The hot reservoir 750 contains a two-phase vapor-liquid mixture at high temperature and pressure, $T_H$ and $P_H$, and the low temperature reservoir 760 contains a two-phase vapor-liquid mixture at low temperature and pressure, $T_L$ and $P_L$. The working fluid in this embodiment is a mixture of fluids with different boiling points. Using well-known principles and methods of fractional distillation, the constituents of the working fluid are determined, both in kind and relative quantity, so that, as valve 735 is opened and valve 745 is closed and vice versa, the working fluid mixture alternately evaporates and condenses in chamber 720 around the sequence of temperatures $T_c''$. Such cyclical condensation and evaporation occur around temperatures $T_c''$ at the level in the chamber 720 where the module $FM''$ is situated such that each module $FM''$ undergoes thermal cycling. By cycling the opening and closing of valves 735 and 745 in conjunction with the electrical and thermal cycling methods described herein under a control circuit utilizing one or more computers and system data as described herein, including such data at each module site, electricity is thereby generated from heat with each module $FM''$ across the range of $T_c''$ represented by the modules in the series. Regeneration can also be achieved with this implementation of the invention by, for example, routing the conduit 740 to a regenerator (not shown) before fluid is returned to the cold reservoir 760. Electrical leads 711 and 712 (shown, but numbered only in part) are attached to the electrodes of each module $FM''$ and serve the functions described elsewhere.

In yet another embodiment, a multistage series of ferroelectric modules $\{FM''\}$ is contained in a thermal chamber that is separate from hot and cold reservoirs. The ferroelectric modules are arrayed with progressively decreasing transition temperatures, $T_c''$. The working fluid in this embodiment is a mixture of fluids with different boiling points such that it alternately evaporates and condenses around the sequence of temperatures $T_c''$ as the fluid is cycled between $T_H$ and $P_H$ and $T_L$ and $P_L$ by connecting the thermal chamber and modules $\{FM''\}$ alternately to the hot and cold reservoirs through valves. Cyclical condensation and evaporation occur around temperature $T_c''$ at the level in the thermal chamber where the module $FM''$ is situated, such that each module $FM''$ undergoes cycling as described herein. By cycling the valves in conjunction with the electrical and thermal cycling methods described, electricity is thereby generated by each module $FM''$ across the range of $T_c''$ represented by the modules $\{FM''\}$ in the series.

In sum, the present invention, among other things, discloses apparatuses and methods for rapid two-phase thermal cycling of materials, devices and other systems, and for using the apparatus and methods in particular to convert heat to electricity by cycling one or more ferroelectric or polarizable amorphous polymers that exhibit changes in electrical polarization with temperature change. The present invention can also be used in any device involving rapid thermal cycling of electric polarization and magnetization, such as, for example, electric and magnetic heat engines for electric generation, refrigeration, and heat pumping. The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:
1. A method of thermally cycling an object comprising:
providing a first liquid/vapor two phase system comprising a liquid phase and a separate vapor phase of a working fluid at a first pressure and a first temperature;
providing a second liquid/vapor two phase system comprising a liquid phase and a separate vapor phase of the working fluid at a second pressure and a second temperature, wherein the first temperature is higher than the second temperature and wherein the first pressure is higher than the second pressure;
contacting the object with vapor from the vapor phase of the first liquid/vapor two-phase system such that the temperature of the object increases;

subsequently contacting the object with vapor from the vapor phase of the second liquid/vapor two-phase system such that the temperature and of the object decreases; and optionally alternately contacting the object with vapor from the vapor phase of the first liquid/vapor two-phase system and subsequently contacting the object with vapor from the vapor phase of the second liquid/vapor two-phase one or more additional times.

2. The method of claim 1, wherein the object comprises one or more layers of electrically polarizable material.

3. The method of claim 2, wherein each of the one or more layers of electrically polarizable material has a phase transition temperature at which the material transitions between a phase in which the material exhibits spontaneous polarization and a phase in which the material does not exhibit spontaneous polarization.

4. The method of claim 1, wherein the object comprises one or more layers of magnetically polarizable material.

5. The method of claim 3, wherein the working fluid comprises a mixture of fluids with different boiling points.

6. The method of claim 4, wherein each of the one or more layers of magnetically polarizable material has a phase transition temperature at which the material transitions between a phase in which the material exhibits spontaneous polarization and a phase in which the material does not exhibit spontaneous polarization.

7. The method of claim 1, wherein the object comprises:
a first electrode formed of a thermally and electrically conductive material;
a second electrode formed of a thermally and electrically conductive material, wherein the second electrode is spaced from the first electrode;
one or more layers of electrically polarizable material between the first and second electrodes.

8. The method of claim 7, wherein the object comprises a plurality of layers of electrically polarizable material arranged in a stack between the first an second electrodes.

9. The method of claim 8, wherein each of the layers of electrically polarizable material has a phase transition temperature at which the material transitions between a phase in which the material exhibits spontaneous polarization and a phase in which the material does not exhibit spontaneous polarization.

10. The method of claim 1, wherein the object is housed in a chamber thermal, wherein the first liquid/vapor two-phase mixture is contained in a first reservoir, wherein the second liquid/vapor two-phase mixture is contained in a second reservoir and wherein;
contacting the object with vapor from the first liquid/vapor two phase mixture comprises allowing vapor from the first liquid/vapor two-phase mixture to flow into the chamber thermal; and
contacting the object with vapor from the second liquid/vapor two phase mixture comprises allowing vapor from the chamber to flow into the second reservoir.

11. The method of claim 10, further comprising transferring working fluid from the second reservoir to the first reservoir.

12. The method of claim 11, further comprising pumping the working fluid from the second reservoir to the first reservoir.

13. The method of claim 11, further comprising transferring thermal energy from the vapor flowing from the chamber into the second reservoir to the working fluid being transferred from the second reservoir to the first reservoir.

14. The method of claim 1, wherein the first liquid/vapor two-phase mixture is contained in a first reservoir having an interior volume comprising a liquid region and a vapor region, wherein the second liquid/vapor two-phase mixture is contained in a second reservoir, and wherein the object is housed in the vapor region of the first reservoir and wherein:
contacting the object with vapor from the first liquid/vapor two phase mixture comprises preventing vapor from the first liquid/vapor two-phase mixture in the first reservoir from flowing into the second reservoir; and
contacting the object with vapor from the second liquid/vapor two phase mixture comprises allowing vapor from the first liquid/vapor two-phase mixture in the first reservoir to flow into the second reservoir.

15. The method of claim 14, further comprising transferring the working fluid from the second reservoir to the first reservoir.

16. The method of claim 15, further comprising transferring thermal energy from the vapor flowing from the first reservoir into the second reservoir to the working fluid being transferred from the second reservoir to the first reservoir.

17. The method of claim 14, further comprising pumping the working fluid from the second reservoir to the first reservoir.

18. The method of claim 1, wherein the working fluid condenses on a surface of the object while contacting the object with vapor from the first liquid/vapor two phase mixture thereby heating the object and wherein the working fluid condensate on the surface of the object evaporates while contacting the object with vapor from the second liquid/vapor two phase mixture thereby cooling the object.

19. The method of claim 18, wherein a layer of working fluid in liquid form remains on the surface of the object while contacting the object with vapor from the first liquid/vapor two phase mixture and while contacting the object with vapor from the second liquid/vapor two phase mixture.

* * * * *